(12) United States Patent
Lee et al.

(10) Patent No.: US 12,507,599 B2
(45) Date of Patent: Dec. 23, 2025

(54) SEMICONDUCTOR DEVICE AND METHOD OF MANUFACTURING THE SAME

(71) Applicant: SK hynix Inc., Icheon (KR)

(72) Inventors: Woo Tae Lee, Icheon (KR); Su Jee Kim, Icheon (KR)

(73) Assignee: SK hynix Inc., Icheon (KR)

(*) Notice: Subject to any disclaimer, the term of this patent is extended or adjusted under 35 U.S.C. 154(b) by 342 days.

(21) Appl. No.: 18/343,443

(22) Filed: Jun. 28, 2023

(65) Prior Publication Data

US 2024/0276891 A1 Aug. 15, 2024

(30) Foreign Application Priority Data

Feb. 13, 2023 (KR) .................. 10-2023-0018952
Mar. 31, 2023 (KR) .................. 10-2023-0042519

(51) Int. Cl.
*H10N 70/00* (2023.01)
*H10B 63/00* (2023.01)

(52) U.S. Cl.
CPC .......... *H10N 70/066* (2023.02); *H10B 63/84* (2023.02); *H10N 70/063* (2023.02); *H10N 70/8613* (2023.02); *H10N 70/883* (2023.02)

(58) Field of Classification Search
CPC .............. H10N 70/066; H10N 70/063; H10N 70/8613; H10N 70/883; H10N 70/231; H10N 70/826; H10N 70/8616; H10N 70/8828; H10B 63/84; H10B 63/20; H10B 63/24; H10B 63/80
See application file for complete search history.

(56) References Cited

U.S. PATENT DOCUMENTS

| | | | |
|---|---|---|---|
| 10,062,840 B2 * | 8/2018 | Sim | H10N 70/021 |
| 10,892,412 B2 * | 1/2021 | Kim | H10N 70/826 |
| 2012/0132879 A1 | 5/2012 | Kinoshita et al. | |

FOREIGN PATENT DOCUMENTS

KR 1020220025325 A 3/2022

* cited by examiner

*Primary Examiner* — David Vu

(57) ABSTRACT

A semiconductor device may include first conductive lines extending in a first direction; second conductive lines extending in a second direction that intersects the first direction; memory cells disposed between the first conductive lines and the second conductive lines in a third direction perpendicular to each of the first and the second directions, each of the memory cells comprising a variable resistance pattern; first gap-fill patterns disposed between the memory cells and having first thermal conductivity; and second gap-fill patterns disposed on the first gap-fill patterns in the third direction and having second thermal conductivity lower than the first thermal conductivity, wherein an interface between each of the second gap-fill patterns and a corresponding one of the first gap-fill patterns is disposed between an upper surface and a lower surface of the variable resistance pattern.

20 Claims, 55 Drawing Sheets

SEMICONDUCTOR DEVICE AND METHOD OF MANUFACTURING THE SAME

CROSS-REFERENCE TO RELATED APPLICATION

This application claims priority under 35 U.S.C. § 119 to Korean Patent Application No. 10-2023-0018952 filed on Feb. 13, 2023, and Korean Patent Application No. 10-2023-0042519 filed on Mar. 31, 2023, which are incorporated herein by reference in its entirety.

BACKGROUND

1. Technical Field

Embodiments of the present disclosure relate to an electronic device and a method of manufacturing the electronic device and, more particularly, to a semiconductor device and a method of manufacturing the semiconductor device.

2. Related Art

The degree of integration of semiconductor devices is basically determined by an area that is occupied by a unit memory cell. As the improvements of the degree of integration of semiconductor devices in which memory cells are formed on a substrate as a single layer recently reaches its limit, there is proposed a three-dimensional (3-D) semiconductor device in which memory cells are stacked on a substrate. Furthermore, in order to improve operational reliability of such a semiconductor device, various structures and manufacturing methods are under development.

SUMMARY

In an embodiment, a semiconductor device may include first conductive lines extending in a first direction; second conductive lines extending in a second direction that intersects the first direction; memory cells disposed between the first conductive lines and the second conductive lines in a third direction perpendicular to each of the first and the second directions, each of the memory cells comprising a variable resistance pattern; first gap-fill patterns disposed between the memory cells and having first thermal conductivity; and second gap-fill patterns disposed on the first gap-fill patterns in the third direction and having second thermal conductivity lower than the first thermal conductivity, wherein an interface between each of the second gap-fill patterns and each a corresponding one of the first gap-fill patterns is disposed between an upper surface and a lower surface of the variable resistance pattern.

In an embodiment, a semiconductor device may include first conductive lines extending in a first direction; second conductive lines extending in a second direction that intersects the first direction; third conductive lines extending in the first direction; first memory cells disposed between the first conductive lines and the second conductive lines in a third direction perpendicular to each of the first and the second directions, each of the first memory cells comprising a first variable resistance pattern; second memory cells disposed between the second conductive lines and the third conductive lines in the third direction, each of the second memory cells comprising a second variable resistance pattern; first gap-fill patterns disposed between the first memory cells and having first thermal conductivity; second gap-fill patterns disposed on the first gap-fill patterns in the third direction between the first memory cells and having second thermal conductivity lower than the first thermal conductivity; third gap-fill patterns disposed between the second memory cells and having third thermal conductivity; and fourth gap-fill patterns disposed on the third gap-fill patterns in the third direction between the second memory cells and having fourth thermal conductivity higher than the third thermal conductivity.

In an embodiment, a method of manufacturing a semiconductor device may include forming first conductive lines that extend in a first direction; forming memory lines each comprising a variable resistance line, the memory lines disposed on the first conductive lines in a third direction and arranged in a second direction intersecting the first direction, the third direction perpendicular to each of the first and the second directions; forming first gap-fill layers having first thermal conductivity between the memory lines; and forming second gap-fill layers having second thermal conductivity different from the first thermal conductivity on the first gap-fill layers in the third direction between the memory lines.

DETAILED DESCRIPTION

Hereinafter, embodiments according to the technical spirit of the present disclosure are described with reference to the accompanying drawings.

An embodiment of the present disclosure may provide a semiconductor device having a stable structure and improved characteristics and a method of manufacturing the semiconductor device.

According to the present technology, a semiconductor device having a stable structure and improved operational reliability can be provided.

Figure 1A:
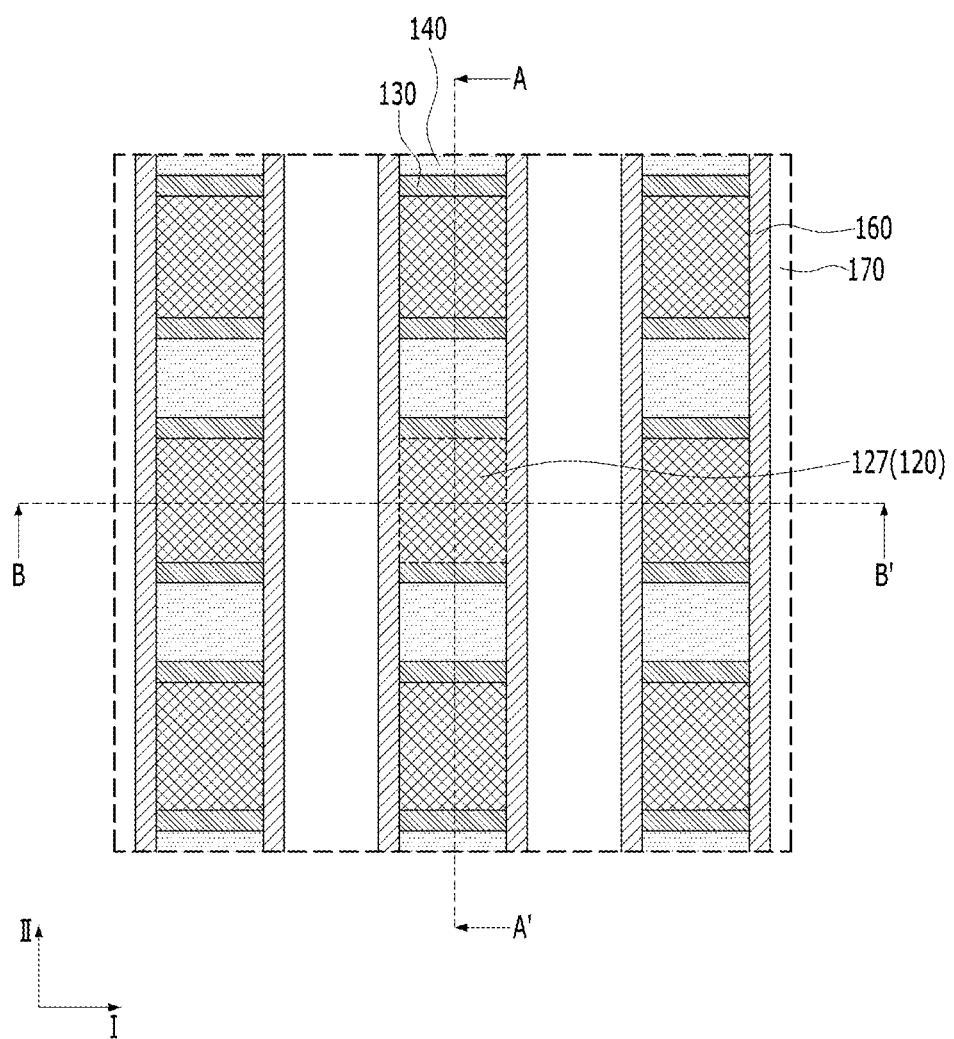
FIGS. 1A to 1D are diagrams for describing a semiconductor device according to an embodiment of the present disclosure.
Figure 1B:
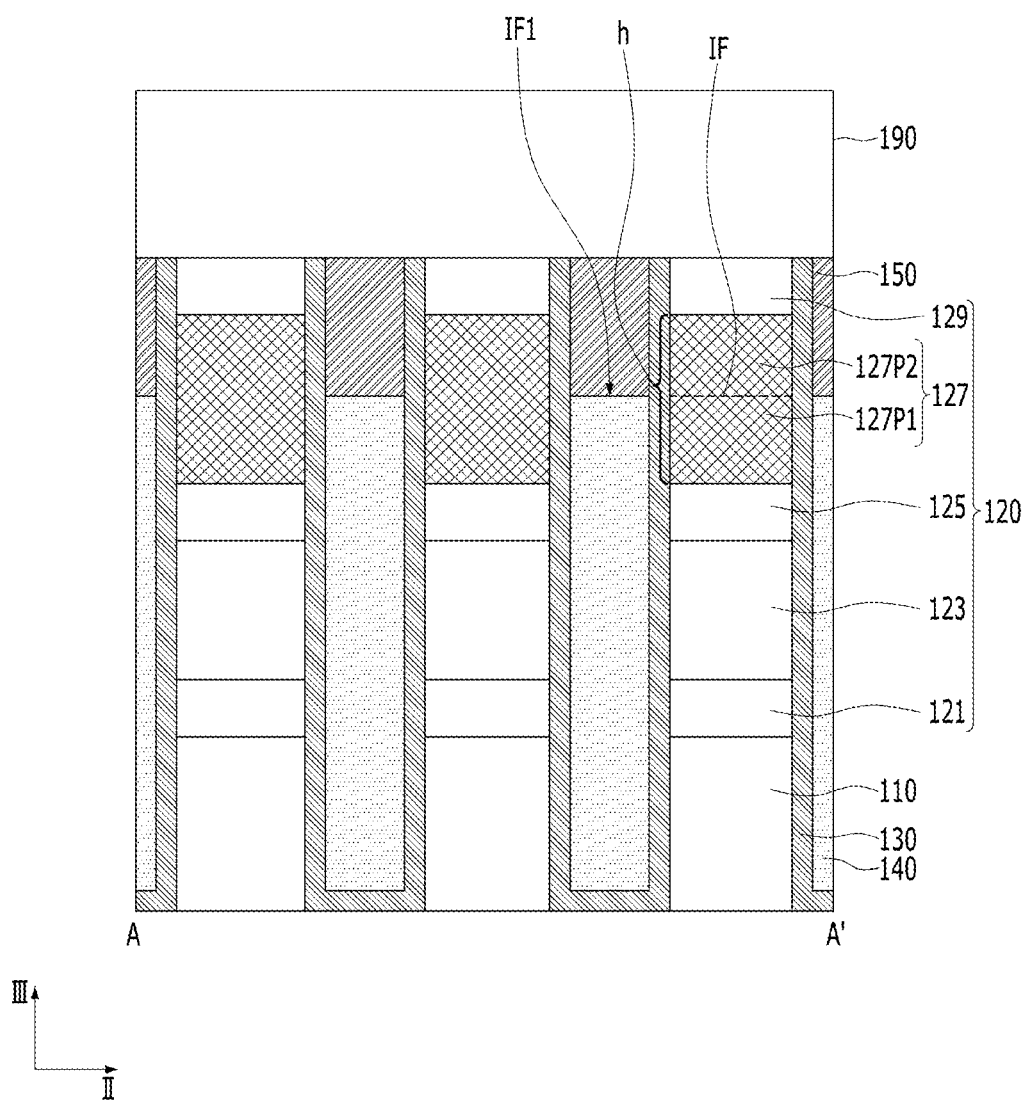
Figure 1C:
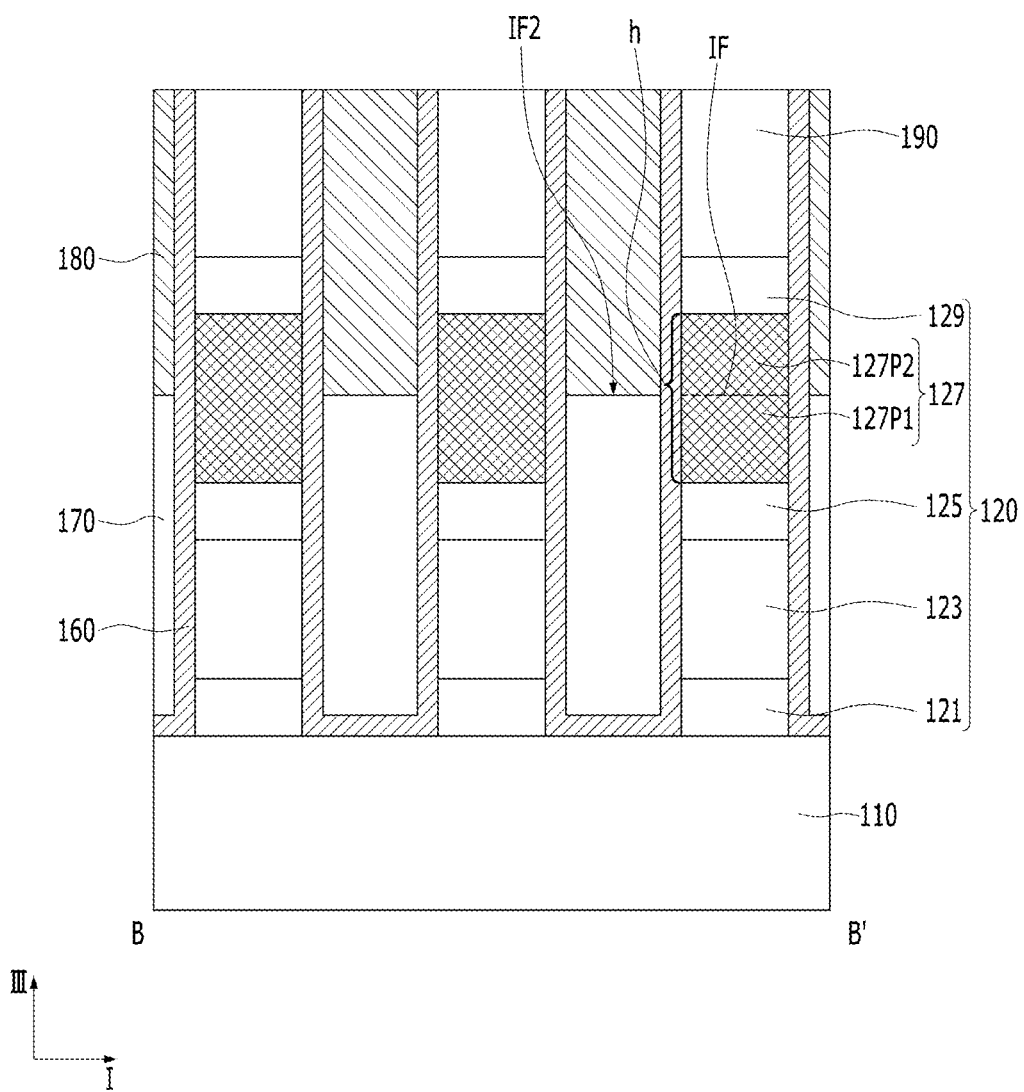
Figure 1D:
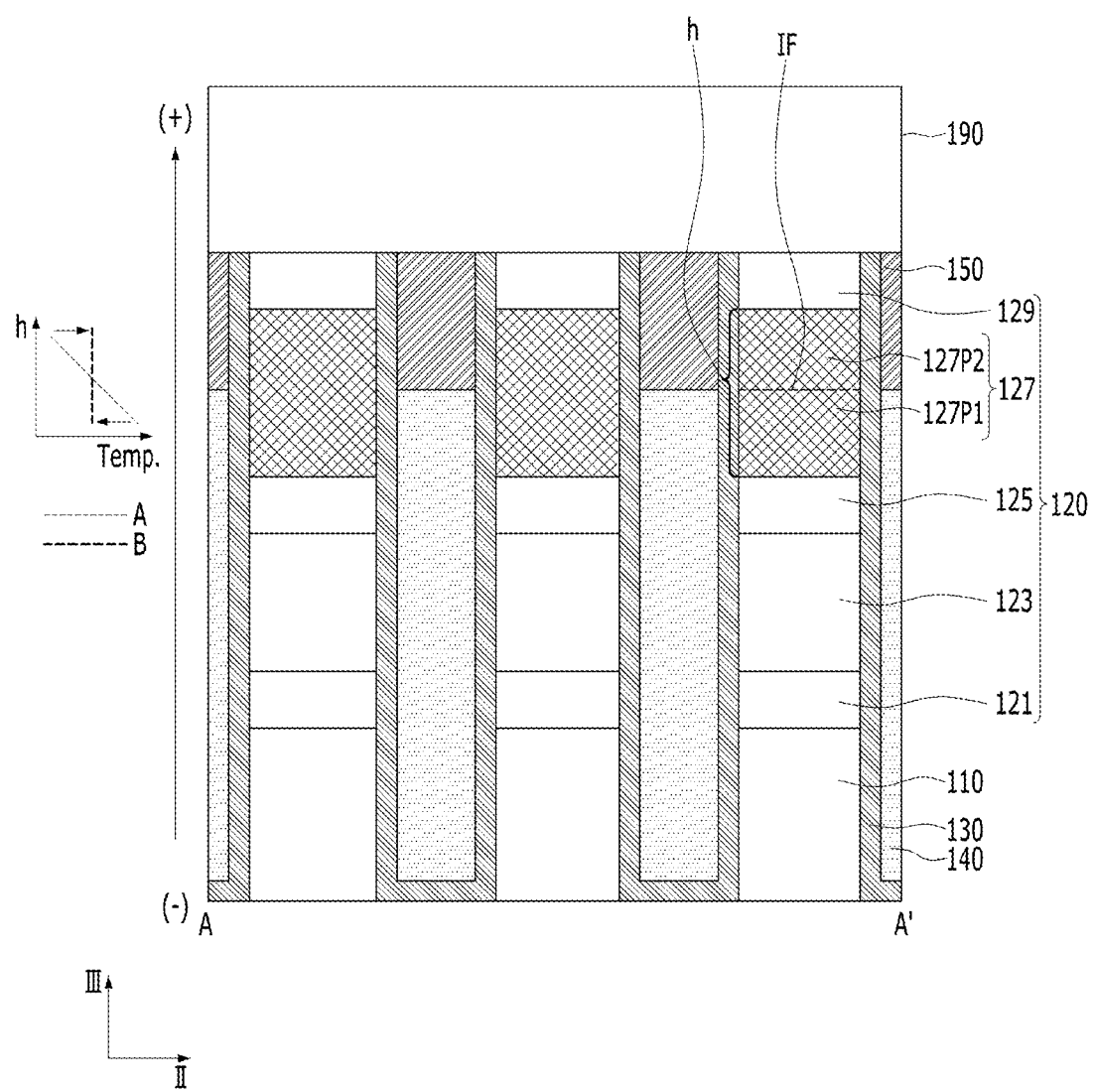

FIGS. 1A to 1D are diagrams for describing a semiconductor device according to an embodiment of the present disclosure. FIG. 1A may be a plan view of the semiconductor device. FIGS. 1B and 1D may be cross-sectional views taken along line A-A' in FIG. 1A. FIG. 1C may be a cross-sectional view taken along line B-B' in FIG. 1A.

Referring to FIGS. 1A to 1C, the semiconductor device may include first conductive lines 110, memory cells 120, and second conductive lines 190. The semiconductor device may further include one or more of first liner patterns 130, first gap-fill patterns 140, second gap-fill patterns 150, second liner patterns 160, third gap-fill patterns 170, and fourth gap-fill patterns 180.

The memory cells 120 may be arranged in a first direction I and a second direction II intersecting the first direction I. Each of the memory cells 120 may be disposed between a corresponding one of the first conductive lines 110 and a corresponding one of the second conductive lines 190 in a third direction III perpendicular to each of the first direction I and the second direction II. The memory cell 120 may include a variable resistance pattern 127. The memory cell 120 may further include one or more of a first electrode pattern 121, a switching pattern 123, a second electrode pattern 125, and a third electrode pattern 129, which are sequentially stacked in the third direction III.

The switching pattern 123 may be disposed on the first electrode pattern 121. The second electrode pattern 125 may be disposed on the switching pattern 123. The first electrode pattern 121, the switching pattern 123, and the second electrode pattern 125 may constitute a selection element. The selection element may be a diode, a PNP diode, a transistor, a vertical transistor, a bipolar junction transistor (BJT), a metal insulator transition (MIT) element, a mixed ionic-electronic conduction (MIEC) element, an ovonic threshold switching (OTS) element, or the like.

For example, the switching pattern 123 may include a chalcogenide material. The first electrode pattern 121 may be a lower electrode. The second electrode pattern 125 may be an intermediate electrode. The third electrode pattern 129 may be disposed between the variable resistance pattern 127 and the second conductive line 190. The third electrode pattern 129 may be an upper electrode. The first electrode pattern 121, the second electrode pattern 125, and the third electrode pattern 129 each may include a metal, a metal nitride, carbon, or a carbon nitride.

The variable resistance pattern 127 may be disposed between the first conductive line 110 and the second conductive line 190 in the third direction III. The variable resistance pattern 127 may be disposed on the second electrode pattern 125. The third electrode pattern 129 may be disposed on the variable resistance pattern 127. The second electrode pattern 125, the variable resistance pattern 127, and the third electrode pattern 129 may constitute a memory element. The memory element and the selection element may share the second electrode pattern 125. The variable resistance pattern 127 may include a chalcogenide material.

The variable resistance pattern 127 may include a first part 127P1 that is adjacent to the first conductive line 110 and a second part 127P2 that is adjacent to the second conductive line 190. An interface IF between the first part 127P1 and the second part 127P2 may be disposed between an upper surface and a lower surface of the variable resistance pattern 127. The interface IF may be disposed at a 40 to 60% level of a height "h" of the variable resistance pattern 127. For example, the interface IF may be disposed at an intermediate level of the height "h." In this case, the intermediate level may be about 50% level of the height "h."

When a set operation or reset operation is performed on the memory cell 120, heat may be generated from the variable resistance pattern 127. As a phase of the variable resistance pattern 127 is changed, heat may be generated from the variable resistance pattern 127. The generated heat may be delivered to surrounding memory cells 120 around the memory cell 120, so that data that has been stored in the surrounding memory cells 120 may be lost because of the heat.

Furthermore, when the set operation or reset operation is performed on the memory cell 120, temperatures of the first part 127P1 and the second part 127P2 may be different from each other depending on the polarity of a voltage that is applied to the first conductive line 110 and the second conductive line 190. For example, when the set operation or reset operation is performed on the memory cell 120, the temperature of the first part 127P1 may be higher than that of the second part 127P2. When the temperatures of the first part 127P1 and the second part 127P2 are different from each other, the first part 127P1 having a higher temperature may lose more heat. Such a heat loss may cause an increase in an operating current, for example, a reset current.

Accordingly, the heat loss in the variable resistance pattern 127 can be reduced by disposing gap-fill patterns having low thermal conductivity on sidewalls of the variable resistance pattern 127. Furthermore, a temperature deviation within the variable resistance pattern 127 can be reduced and the reset current can be reduced by forming the gap-fill patterns in the form of a multi-layer based on a thermal profile of the variable resistance pattern 127. As a result, a data retention characteristic of the semiconductor device can be improved, and thus the semiconductor device can be driven with low power.

The first conductive lines 110 may extend in the first direction I. The first conductive lines 110 may be spaced apart from each other in the second direction II. The first conductive line 110 may be disposed below the memory cell 120, and may be electrically connected to the first electrode pattern 121. The first conductive line 110 may be a word line or a bit line. The first conductive line 110 may include a conductive material, such as tungsten.

The second conductive lines 190 may extend in the second direction II. The second conductive lines 190 may be spaced apart from each other in the first direction I. The second conductive line 190 may be disposed on the memory cell 120, and may be electrically connected to the third electrode pattern 129. The second conductive line 190 may be a bit line or a word line. For example, when the first conductive line 110 is a word line, and the second conductive line 190 is a bit line. As another example, when the first conductive line 110 is a bit line, and the second conductive line 190 is a word line. The second conductive line 190 may include a conductive material, such as tungsten.

The first liner patterns 130 may extend in the first direction I when viewed in a plan view, and may cover sidewalls of memory cells 120. For example, the first liner patterns 130 may be disposed on sidewalls of the memory cells 120 that face the first liner patterns 130 in the second direction II. The first liner patterns 130 may remain on the sidewalls of the memory cells 120 without being removed in subsequent manufacturing processes, and can protect the memory cells 120 during the subsequent manufacturing processes. The first liner pattern 130 may include an insulating material, such as a nitride or an oxide. For example, the first liner pattern 130 may include a silicon nitride.

The first gap-fill patterns 140 may be disposed between the memory cells 120. For example, the first gap-fill patterns 140 may be disposed between the memory cells 120 that are adjacent to each other in the second direction II. An upper surface of each of the first gap-fill patterns 140 may be disposed between an upper surface and a lower surface of the variable resistance pattern 127. For example, the upper surface of each of the first gap-fill patterns 140 may be disposed substantially at the same level as the interface IF between the first part 127P1 and second part 127P2 of the variable resistance pattern 127. Accordingly, the first gap-fill pattern 140 may cover the sidewall of the first part 127P1. The first liner patterns 130 may be disposed between the first gap-fill patterns 140 and the memory cells 120, respectively. The first gap-fill patterns 140 may include an insulating material, such as an oxide. For example, the first gap-fill pattern 140 may include $SiO_2$ or SiOC, or may include $SiO_2$ and SiOC.

The first gap-fill patterns 140 may have first thermal conductivity that is relatively high. The first gap-fill patterns 140 may be disposed on the sidewalls of the variable resistance pattern 127, and can reduce a temperature deviation within the variable resistance pattern 127. For example, the first gap-fill patterns 140 may be disposed to cover the sidewalls of the first part 127P1 having a relatively high temperature, and can lower the temperature of the first part 127P1 by dispersing heat generated in the first part 127P1 when the set operation or reset operation is performed on the memory cell 120. Accordingly, the temperature deviation within the variable resistance pattern 127 can be reduced.

The first gap-fill patterns 140 and the second gap-fill patterns 150 may be disposed between the memory cells 120 that are adjacent to each other in the second direction II. The second gap-fill patterns 150 may be disposed on the first gap-fill patterns 140, respectively, in the third direction III. A lower surface of each of the second gap-fill patterns 150 may be disposed between the upper surface and the lower surface of the variable resistance pattern 127. For example, the lower surface of each of the second gap-fill patterns 150 may be disposed substantially at the same level as the interface IF between the first part 127P1 and second part 127P2 of the variable resistance pattern 127. Accordingly, the second gap-fill patterns 150 may cover the sidewalls of the second part 127P2. The second gap-fill patterns 150 may include an insulating material, such as an oxide. For example, the second gap-fill patterns 150 may include $SiO_2$, SiOC, or a combination thereof.

An interface IF1 between the first gap-fill pattern 140 and the second gap-fill pattern 150 may be disposed between the upper surface and the lower surface of the variable resistance pattern 127. For example, the interface IF1 between the first gap-fill pattern 140 and the second gap-fill pattern 150 may be disposed substantially at the same level as the interface IF between the first part 127P1 and the second part 127P2 of the variable resistance pattern 127. Upper portions of the first liner patterns 130 may be disposed between the second gap-fill patterns 150 and the memory cells 120, respectively, in the second direction II.

The second gap-fill patterns 150 may have second thermal conductivity that is different from the first thermal conductivity. For example, the second thermal conductivity may be lower than the first thermal conductivity. As an embodiment, the second gap-fill patterns 150 may include carbon. For example, when the first gap-fill patterns 140 include $SiO_2$, the second gap-fill patterns 150 may include SiOC.

The second gap-fill patterns 150 may be disposed on the sidewalls of the variable resistance pattern 127, and can lower a temperature deviation within the variable resistance pattern 127. For example, the second gap-fill patterns 150 may be disposed to cover the sidewalls of the second part 127P2 having a lower temperature than the first part 127P1, and can prevent heat of the second part 127P2 from being delivered to the outside or reduce the delivery of the heat to the outside when the set operation or the reset operation of the memory cell 120 is performed.

As described above, since the first gap-fill pattern 140 having the first thermal conductivity covers the first part 127P1 and the second gap-fill pattern 150 having the second thermal conductivity lower than the first thermal conductivity covers the second part 127P2 having a lower temperature than the first part 127P1, the temperature deviation within the variable resistance pattern 127 can be effectively reduced.

The second liner patterns 160 may extend in the second direction II when viewed in a plan view, and may cover sidewalls of the memory cells 120. For example, the second liner patterns 160 may be disposed on the sidewalls of the memory cells 120 that face the second liner patterns 160 in the first direction I. The second liner patterns 160 may remain on the sidewalls of the memory cells 120 without being removed in subsequent manufacturing processes, and thus can protect the memory cells 120 in the subsequent manufacturing processes. The second liner patterns 160 may include an insulating material, such as a nitride or an oxide. For example, the second liner patterns 160 may include a silicon nitride.

The third gap-fill patterns 170 may be disposed between the memory cells 120. For example, the third gap-fill patterns 170 may be disposed between the memory cells 120 that are adjacent to each other in the first direction I. An upper surface of each of the third gap-fill patterns 170 may be disposed between the upper surface and the lower surface of the variable resistance pattern 127. For example, the upper surface of each of the third gap-fill patterns 170 may be disposed substantially at the same level as the interface IF between the first part 127P1 and the second part 127P2 of the variable resistance pattern 127. Accordingly, the third gap-fill patterns 170 may cover the sidewalls of the first part 127P1. The second liner patterns 160 may be disposed between the third gap-fill patterns 170 and the memory cells 120, respectively, in the first direction I. The third gap-fill patterns 170 may include an insulating material, such as an oxide. For example, the third gap-fill patterns 170 may include $SiO_2$ or SiOC, or may include $SiO_2$ and SiOC in combination.

The third gap-fill patterns 170 may have third thermal conductivity. The third gap-fill patterns 170 may have the third thermal conductivity that is relatively high. The third gap-fill patterns 170 may be disposed on the sidewalls of the variable resistance pattern 127, and can reduce the temperature deviation within the variable resistance pattern 127. For example, the third gap-fill patterns 170 may be disposed to cover the sidewalls of the first part 127P1 having a relatively high temperature, and can lower the temperature of the first part 127P1 by dispersing heat of the first part 127P1 when the set operation or the reset operation of the memory cell 120 is performed. Accordingly, the temperature deviation within the variable resistance pattern 127 can be reduced.

The fourth gap-fill patterns 180 may be disposed between the memory cells 120. The third gap-fill patterns 170 and the fourth gap-fill patterns 180 may be disposed between the memory cells 120 that are adjacent to each other in the first direction I. The fourth gap-fill patterns 180 may be disposed on the third gap-fill patterns 170, respectively, in the third direction III. A lower surface of each of the fourth gap-fill patterns 180 may be disposed between the upper surface and the lower surface of the variable resistance pattern 127. For example, the lower surface of each of the fourth gap-fill patterns 180 may be disposed substantially at the same level as the interface IF between the first part 127P1 and the second part 127P2 of the variable resistance pattern 127. Accordingly, the fourth gap-fill patterns 180 may cover the sidewalls of the second part 127P2 that face each other in the first direction I. The fourth gap-fill patterns 180 may include an insulating material, such as an oxide. For example, the fourth gap-fill patterns 180 may include $SiO_2$ or SiOC, or may include $SiO_2$ and SiOC.

An interface IF2 between the third gap-fill pattern 170 and the fourth gap-fill pattern 180 may be disposed between the upper surface and the lower surface of the variable resistance pattern 127. For example, the interface IF2 between the third gap-fill pattern 170 and the fourth gap-fill pattern 180 may be disposed substantially at the same level as the interface IF between the first part 127P1 and the second part 127P2 of the variable resistance pattern 127. The second liner patterns 160 may be disposed between the fourth gap-fill patterns 180 and the memory cells 120, respectively, in the first direction I.

The fourth gap-fill patterns 180 may have fourth thermal conductivity different from the third thermal conductivity. For example, the fourth thermal conductivity may be lower than the third thermal conductivity. As an embodiment, the fourth gap-fill patterns 180 may include carbon. When the third gap-fill patterns 170 include $SiO_2$, the fourth gap-fill patterns 180 may include SiOC.

The fourth gap-fill patterns 180 may be disposed on the sidewalls of the variable resistance pattern 127, and can reduce the temperature deviation within the variable resistance pattern 127. For example, the fourth gap-fill patterns 180 may be disposed to cover the sidewalls of the second part 127P2 having a relatively low temperature, and can prevent heat of the second part 127P2 from being dispersed or reduce the dispersion of the heat when the set operation or the reset operation of the memory cell 120 is performed.

As described above, since the third gap-fill pattern 170 having the third thermal conductivity covers the first part 127P1 and the fourth gap-fill pattern 180 having the fourth thermal conductivity lower than the third thermal conductivity covers the second part 127P2 having a lower temperature than the first part 127P1, the temperature deviation within the variable resistance pattern 127 can be effectively reduced.

Referring to FIG. 1D, the first part 127P1 of the variable resistance pattern 127 may be adjacent to the first conductive line 110 to which a negative (−) voltage is applied. The second part 127P2 of the variable resistance pattern 127 may be adjacent to the second conductive line 190 to which a positive (+) voltage is applied. Accordingly, the first gap-fill patterns 140 and the second gap-fill patterns 150 having different thermal conductivities may be disposed by considering a temperature difference between the first part 127P1 and the second part 127P2 that is caused by bias polarities.

When the set operation or the reset operation of the memory cell 120 is performed, the temperature of the first part 127P1 may be higher than the temperature of the second part 127P2. The temperature of the first part 127P1 can be lowered by disposing the first gap-fill patterns 140, which have the first thermal conductivity, to cover the sidewalls of the first part 127P1, so that heat generated from the first part 127P1 is dispersed.

The dispersion of heat that is generated from the second part 127P2 can be prevented or reduced by disposing the second gap-fill patterns 150, which have the second thermal conductivity that is relatively low, to cover the sidewalls of the second part 127P2 having a relatively low temperature. Furthermore, the temperature of the second part 127P2 can be raised by heat from the first part 127P1. Accordingly, the temperature deviation between the first part 127P1 and the second part 127P2 within the variable resistance pattern 127 can be reduced.

The heat dispersion can be adjusted by disposing the gap-fill patterns 140 and 150 having different thermal conductivities on the sidewalls of the first part 127P1 and the second part 127P2 of the variable resistance pattern 127, respectively. Accordingly, an amount of current that is used for the set operation or the reset operation of the memory cell 120 can be reduced. For example, the amount of current that is used for the set operation or the reset operation of the memory cell 120 can be reduced compared to a case in which a single gap-fill pattern is disposed on the sidewalls of the variable resistance pattern 127.

In a graph of FIG. 1D showing a relationship between the temperature of the variable resistance pattern 127 and the height "h" of the variable resistance pattern 127, "A" illustrates a thermal profile of the variable resistance pattern 127 in a structure in which a single gap-fill pattern is disposed on the sidewalls of the variable resistance pattern 127. In such a case, the temperature within the variable resistance pattern 127 may be different for each level on the basis of the height "h". For example, when a negative (−) voltage is applied to the first conductive line 110 and a positive (+) voltage is applied to the second conductive line 190, a temperature of a lower level of the variable resistance pattern 127 may be higher than a temperature of an upper level of the variable resistance pattern 127.

On the other hand, "B" in the graph illustrates a thermal profile of the variable resistance pattern 127 in the structure in which the gap-fill patterns 140 and 150 having different thermal conductivities are disposed on the sidewalls of the upper and the lower parts 127P2 and 127P1 of the variable resistance pattern 127, respectively. In such a case, the temperature within the variable resistance pattern 127 may be uniform. When the negative (−) voltage is applied to the first conductive line 110 and the positive (+) voltage is applied to the second conductive line 190, although a temperature of the first part 127P1 becomes higher than a temperature of the second part 127P2, a temperature difference between the first part 127P1 and the second part 127P2 can be reduced by the gap-fill patterns 140 and 150. Accordingly, the temperature within the variable resistance pattern 127 can become uniform, and a loss of heat can be reduced. In other words, by adjusting the thermal conductivities of the gap-fill patterns 140 and 150 depending on the temperature difference between the first part 127P1 and the second part 127P2 of the variable resistance pattern 127, the temperature deviation within the variable resistance pattern 127 can be reduced, and the amount of current that is used for the set operation or the reset operation of the memory cell 120 can be reduced.

According to the aforementioned structure, the first gap-fill patterns 140 having the first thermal conductivity and the second gap-fill patterns 150 having the second thermal conductivity lower than the first thermal conductivity may be disposed on the sidewalls of the variable resistance pattern 127 that face the first gap-fill patterns 140 and the second gap-fill patterns 150 in the second direction II. The third gap-fill patterns 170 having the third thermal conductivity and the fourth gap-fill patterns 180 having the fourth thermal conductivity lower than the third thermal conductivity may be disposed on the sidewalls of the variable resistance pattern 127 that face the third gap-fill patterns 170 and the fourth gap-fill patterns 180 in the first direction I. The current that is used to perform the set operation or the reset operation of the memory cell 120 can be reduced by disposing the gap-fill patterns having different thermal conductivities on the sidewalls of the upper part and the lower part of the variable resistance pattern, respectively.

Figure 2A:
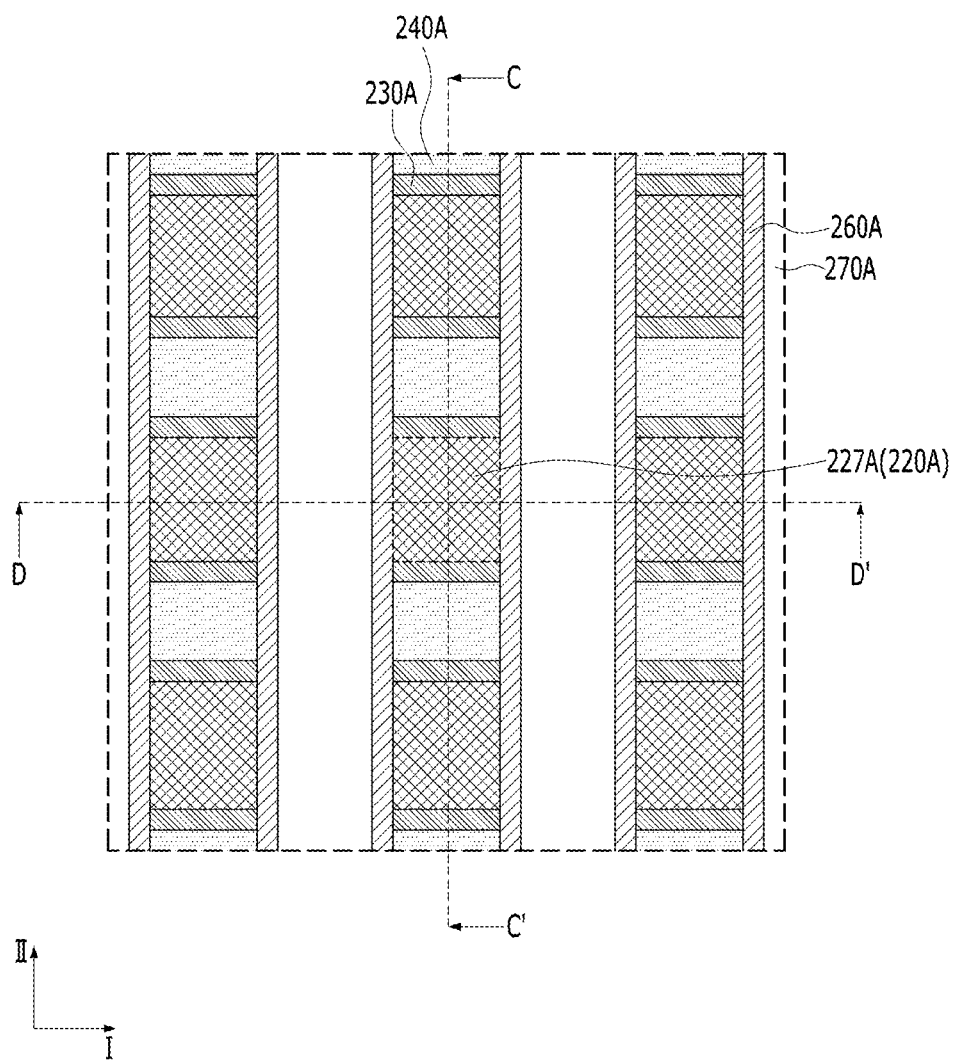
FIGS. 2A to 2D are diagrams for describing a semiconductor device according to an embodiment of the present disclosure.
Figure 2B:
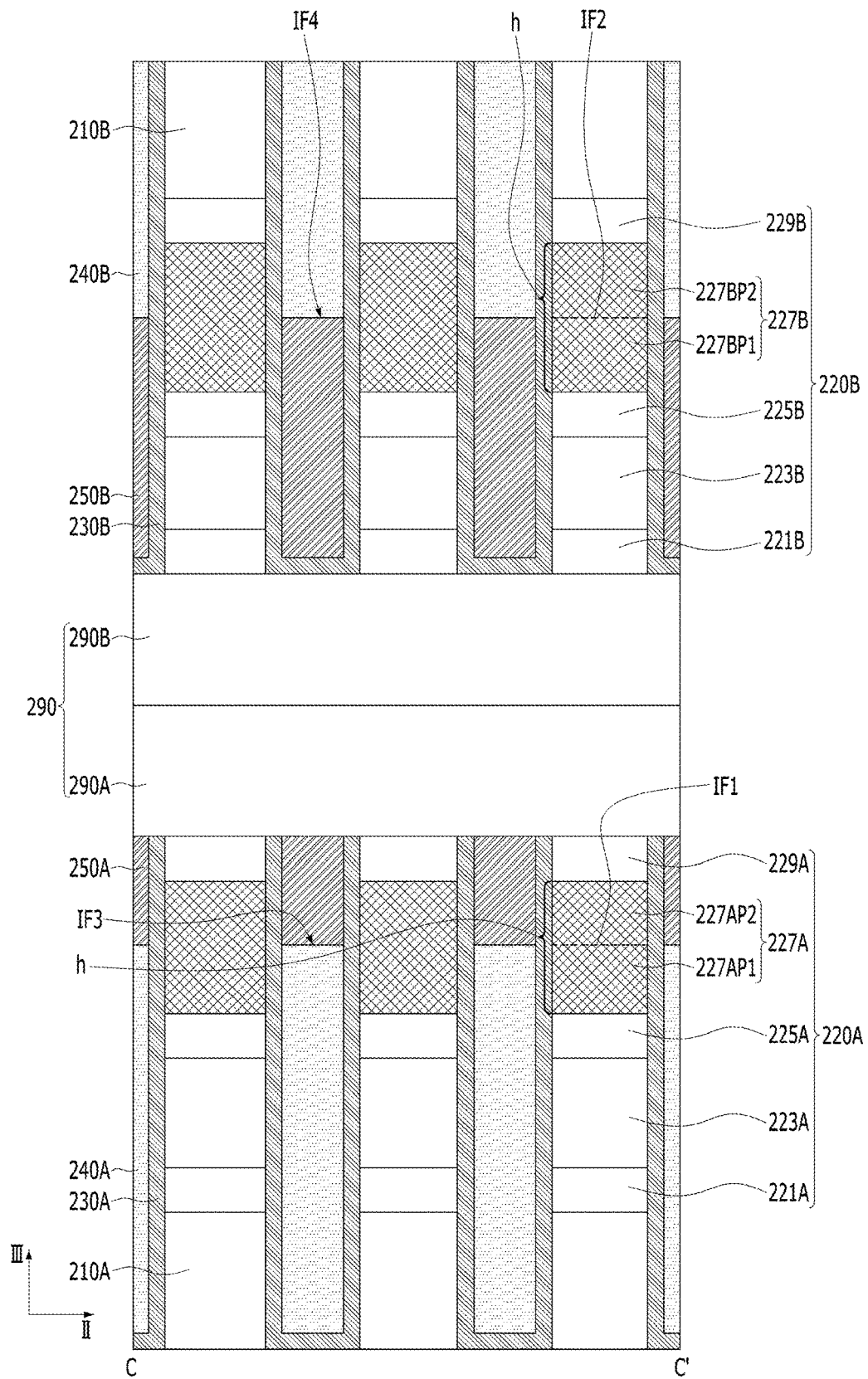
Figure 2C:
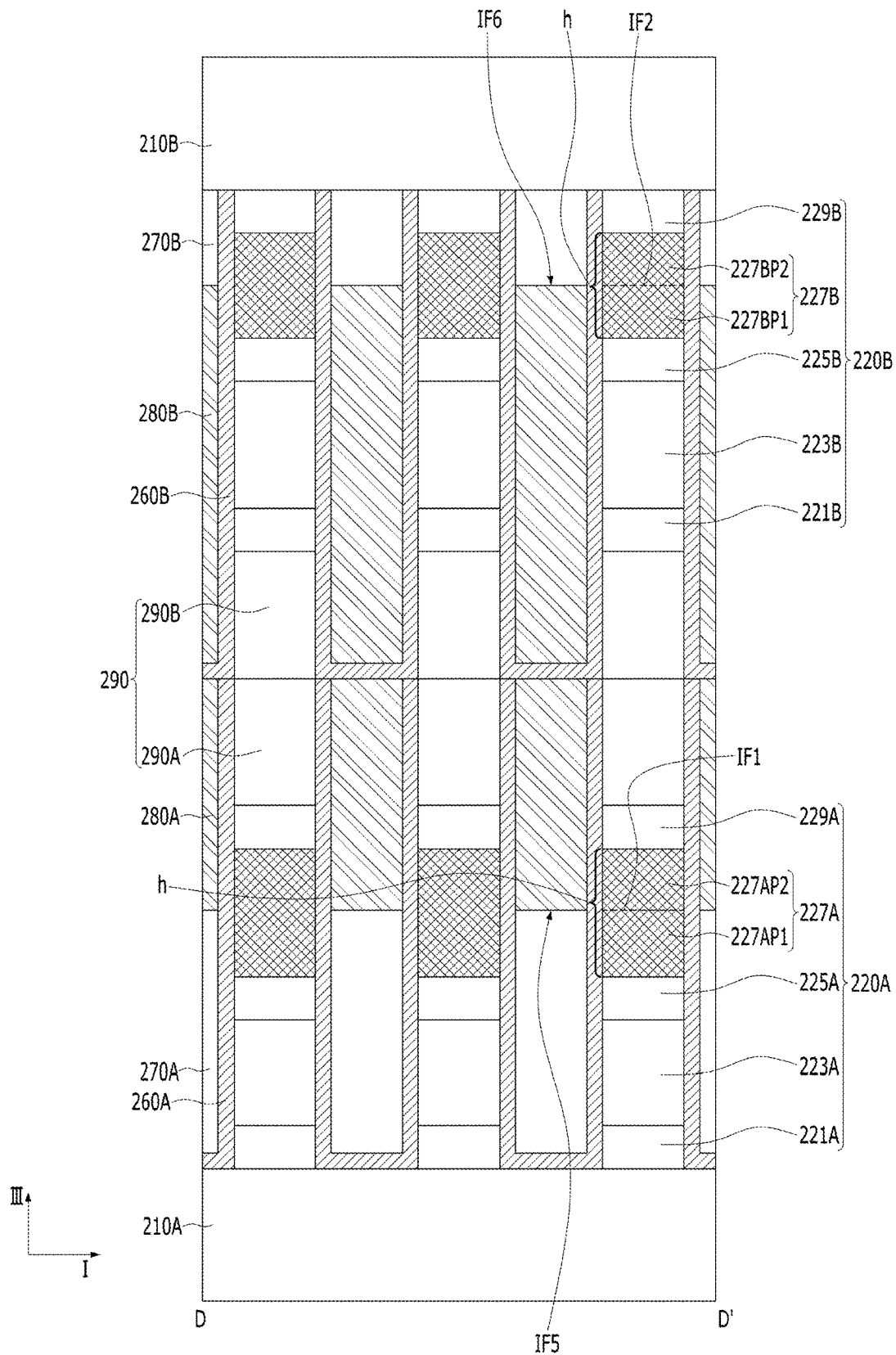
Figure 2D:
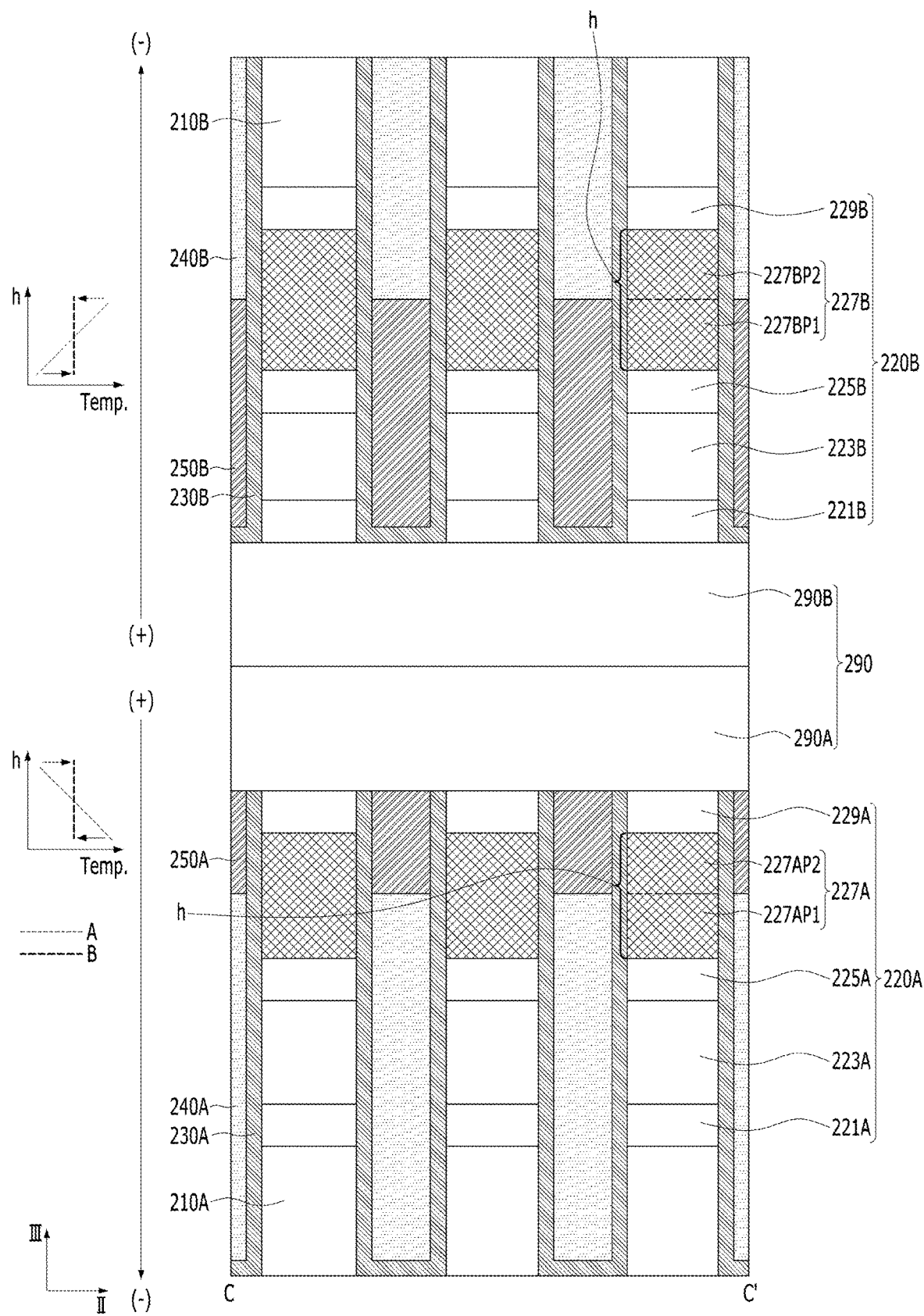

FIGS. 2A to 2D are diagrams for describing a semiconductor device according to another embodiment of the present disclosure. FIG. 2A may be a plan view of the semiconductor device. FIGS. 2B and 2D may be cross-sectional views taken along line C-C' in FIG. 2A. FIG. 2C may be a cross-sectional view taken along line D-D' in FIG. 2A. Hereinafter, contents that are redundant with the aforementioned contents are omitted and not described.

Referring to FIGS. 2A to 2D, the semiconductor device may include first conductive lines 210A, first memory cells 220A, second conductive lines 290, first liner patterns 230A, first gap-fill patterns 240A, second gap-fill patterns 250A, second liner patterns 260A, third gap-fill patterns 270A, and fourth gap-fill patterns 280A. The semiconductor device may further include third conductive lines 210B, second memory cells 220B, third liner patterns 230B, fifth gap-fill patterns 250B, sixth gap-fill patterns 240B, fourth liner patterns 260B, seventh gap-fill patterns 280B, and eighth gap-fill patterns 270B.

The second conductive lines 290 may extend in a second direction II. The second conductive line 290 may include at least one of a second-first conductive line 290A and a second-second conductive line 290B. The second conductive line 290 may be a single layer or a multi-layer. For example, the second conductive line 290 may be a single layer in which the second-first conductive line 290A and the second-second conductive line 290B are constructed as one layer, or may be a multi-layer in which the second-first conductive line 290A and the second-second conductive line 290B are constructed as separate layers.

The second conductive line 290 may be disposed on the first memory cell 220A and disposed below the second memory cell 220B, in the third direction III. The second conductive line 290 may be electrically connected to a third electrode pattern 229A of the first memory cell 220A or a first electrode pattern 221B of the second memory cell 220B. The second conductive line 290 may be a word line or a bit line. For example, when the first conductive line 210A and the third conductive line 210B are word lines, the second conductive line 290 is a bit line. As another example, when the first conductive line 210A and the third conductive line 210B are bit lines, the second conductive line 290 is a word line.

When viewed in a plan view, the first memory cells 220A and the second memory cells 220B each may be arranged in a matrix form in the first direction I and the second direction II, as shown in FIG. 2A. The first memory cells 220A may be disposed between the first conductive lines 210A and the second conductive lines 290. For example, the first memory cells 220A may be disposed between the first conductive lines 210A and the second-first conductive lines 290A. The second memory cells 220B may be disposed between the second conductive lines 290 and the third conductive lines 210B. For example, the second memory cells 220B may be disposed between the second-second conductive lines 290B and the third conductive lines 210B.

The first memory cell 220A may include a first-first electrode pattern 221A, a first switching pattern 223A, a first-second electrode pattern 225A, a first variable resistance pattern 227A, and the first-third electrode pattern 229A that are stacked in the third direction III. The second memory cell 220B may include a second-first electrode pattern 221B, a second switching pattern 223B, a second-second electrode pattern 225B, a second variable resistance pattern 227B, and a second-third electrode pattern 229B that are stacked in the third direction III.

The first switching pattern 223A may be disposed on the first-first electrode pattern 221A. The first-second electrode pattern 225A may be disposed on the first switching pattern 223A. The first-first electrode pattern 221A, the first switching pattern 223A, and the first-second electrode pattern 225A may constitute a first selection element. The second switching pattern 223B may be disposed on the second-first electrode pattern 221B. The second-second electrode pattern 225B may be disposed on the second switching pattern 223B. The second-first electrode pattern 221B, the second switching pattern 223B, and the second-second electrode pattern 225B may constitute a second selection element. The first switching pattern 223A and the second switching pattern 223B may include a chalcogenide material.

The first variable resistance pattern 227A may be disposed between the first conductive line 210A and the second conductive line 290. The first variable resistance pattern 227A may be disposed on the first-second electrode pattern 225A. The first-third electrode pattern 229A may be disposed on the first variable resistance pattern 227A. The first-second electrode pattern 225A, the first variable resistance pattern 227A, and the first-third electrode pattern 229A may constitute a first memory element. The first memory element and the first selection element may share the first-second electrode pattern 225A.

The first variable resistance pattern 227A may include a first part 227AP1 that is adjacent to the first conductive line 210A and a second part 227AP2 that is adjacent to the second conductive line 290. An interface IF1 between the first part 227AP1 and the second part 227AP2 may be disposed between an upper surface and a lower surface of the first variable resistance pattern 227A. The interface IF1 may be disposed at a 40 to 60% level of a height "h" of the first variable resistance pattern 227A. For example, the interface IF1 may be disposed at an intermediate level of the height "h." In this case, the intermediate level may be about 50% level of the height "h."

The second variable resistance pattern 227B may be disposed between the second conductive line 290 and the third conductive line 210B. The second variable resistance pattern 227B may be disposed on the second-second electrode pattern 225B. The second-third electrode pattern 229B may be disposed on the second variable resistance pattern 227B. The second-second electrode pattern 225B, the second variable resistance pattern 227B, and the second-third electrode pattern 229B may constitute a second memory element. The second memory element and the second selection element may share the second-second electrode pattern 225B. The first variable resistance pattern 227A and the second variable resistance pattern 227B may include a chalcogenide material.

The second variable resistance pattern 227B may include a first part 227BP1 that is adjacent to the second conductive line 290 and a second part 227BP2 that is adjacent to the third conductive line 210B. An interface IF2 between the first part 227BP1 and the second part 227BP2 may be disposed between an upper surface and a lower surface of the second variable resistance pattern 227B. The interface IF2 may be disposed at a 40 to 60% level of a height "h" of the second variable resistance pattern 227B. For example, the interface IF2 may be disposed at an intermediate level of the height "h." In this case, the intermediate level may be about 50% level of the height "h."

When a set operation or a reset operation of the memory cells 220A and 220B is performed, heat may be generated from the variable resistance patterns 227A and 227B. For example, as phases of the variable resistance patterns 227A and 227B are changed, heat may be generated from the variable resistance patterns 227A and 227B.

When the set operation or the reset operation is performed, amounts of heat generated from the first part 227AP1 and the second part 227AP2 may be different from each other. Accordingly, temperatures of the first part 227AP1 and the second part 227AP2 may be different from each other. For example, the temperature of the first part 227AP1 may be higher than that of the second part 227AP2. As another example, when the set operation or the reset operation is performed, the temperature of the second part 227BP2 may be higher than that of the first part 227BP1. Furthermore, the generated heat may be delivered to surrounding memory cells 220A and 220B adjacent to selected memory cells 220A and 220B. Accordingly, data that has been stored in the surrounding memory cells 220A and 220B may be lost.

The first conductive lines 210A and the third conductive lines 210B may extend in the first direction I. The first conductive line 210A may be disposed below the first memory cell 220A, and may be electrically connected to the first-first electrode pattern 221A. The third conductive line 210B may be disposed on the second memory cell 220B, and may be electrically connected to the second-third electrode pattern 229B. The first conductive line 210A and the third conductive line 210B each may be a word line or a bit line.

The first liner patterns 230A may extend in the first direction I when viewed in a plan view, and may cover sidewalls of the first memory cells 220A that face each other in the second direction II. The third liner patterns 230B may extend in the first direction I when viewed in a plan view, and may cover sidewalls of the second memory cells 220B that face each other in the second direction II. The first liner patterns 230A and the third liner patterns 230B may remain on the sidewalls of the memory cells 220A and 220B without being removed in subsequent manufacturing processes, and thus can protect the memory cells 220A and 220B in the subsequent manufacturing processes.

The first gap-fill patterns 240A may have first thermal conductivity. The first gap-fill patterns 240A may have the first thermal conductivity that is relatively high, may be disposed on the sidewalls of the first variable resistance pattern 227A that face each other in the second direction II, and can reduce a temperature deviation within the first variable resistance pattern 227A. For example, the first gap-fill patterns 240A may be disposed to cover sidewalls of the first part 227AP1 having a relatively high temperature, and can lower the temperature of the first part 227AP1 by dispersing heat generated from the first part 227AP1 when the set operation or the reset operation is performed on the memory cells 220A and 220B. Accordingly, the temperature deviation within the first variable resistance pattern 227A can be reduced.

The second gap-fill patterns 250A may be disposed between the first memory cells 220A arranged in the second direction II. The first gap-fill patterns 240A and the second gap-fill patterns 250A may be disposed between the first memory cells 220A that are adjacent to each other in the second direction II. The second gap-fill patterns 250A may be disposed on the first gap-fill patterns 240A in the third direction III.

An interface IF3 between the first gap-fill pattern 240A and the second gap-fill pattern 250A may be disposed between the upper surface and the lower surface of the first variable resistance pattern 227A. For example, the interface IF3 between the first gap-fill pattern 240A and the second gap-fill pattern 250A may be disposed substantially at the same level as the interface IF1 between the first part 227AP1 and the second part 227AP2 of the first variable resistance pattern 227A.

The second gap-fill patterns 250A may have second thermal conductivity different from the first thermal conductivity of the first gap-fill patterns 240A. For example, the second thermal conductivity may be lower than the first thermal conductivity. The second gap-fill patterns 250A may have the second thermal conductivity that is relatively low, may be disposed on the sidewalls of the first variable resistance pattern 227A, and can reduce the temperature deviation within the first variable resistance pattern 227A. For example, the second gap-fill patterns 250A may be disposed to cover the sidewalls of the second part 227AP2 having a relatively low temperature, and can prevent heat of the second part 227AP2 from being dispersed or reduce the dispersion of the heat when the set operation or the reset operation of the memory cells 220A and 220B is performed. Accordingly, the temperature deviation within the first variable resistance pattern 227A can be reduced.

The fifth gap-fill patterns 250B may be disposed between the second memory cells 220B arranged in the second direction II. An upper surface of each of the fifth gap-fill patterns 250B may be disposed between the upper surface and the lower surface of the second variable resistance pattern 227B. For example, the upper surface of each of the fifth gap-fill patterns 250B may be disposed substantially at the same level as the interface IF2 between the first part 227BP1 and the second part 227BP2 of the second variable resistance pattern 227B. The fifth gap-fill patterns 250B may include an insulating material, such as an oxide. For example, the fifth gap-fill patterns 250B may include $SiO_2$, SiOC, or a combination thereof.

The fifth gap-fill patterns 250B may have fifth thermal conductivity. The fifth thermal conductivity may be substantially the same as the second thermal conductivity of the second gap-fill patterns 250A. The fifth gap-fill patterns 250B may have the fifth thermal conductivity that is relatively low, may be disposed on the sidewalls of the second variable resistance pattern 227B, and can reduce a temperature deviation within the second variable resistance pattern 227B. For example, the fifth gap-fill patterns 250B may be disposed to cover sidewalls of the first part 227BP1 having a relatively low temperature, and can prevent heat of the first part 227BP1 from being dispersed or reduce the dispersion of the heat when the set operation or the reset operation of the memory cells 220A and 220B is performed. Accordingly, the temperature deviation within the second variable resistance pattern 227B can be reduced.

The sixth gap-fill patterns 240B may be disposed between the second memory cells 220B arranged in the second direction II. The sixth gap-fill patterns 240B may be disposed on the fifth gap-fill patterns 250B in the third direction III. A lower surface of each of the sixth gap-fill patterns 240B may be disposed between the upper surface and the lower surface of the second variable resistance pattern 227B. For example, the lower surface of the sixth gap-fill patterns 250B may be disposed substantially at the same level as the interface IF2 between the first part 227BP1 and the second part 227BP2 of the second variable resistance pattern 227B. The sixth gap-fill patterns 240B may include an insulating material, such as an oxide. For example, the sixth gap-fill patterns 240B may include $SiO_2$ or SiOC.

An interface IF4 between the fifth gap-fill pattern 250B and the sixth gap-fill pattern 240B may be disposed between the upper surface and the lower surface of the second variable resistance pattern 227B. For example, the interface IF4 between the fifth gap-fill pattern 250B and the sixth gap-fill pattern 240B may be disposed substantially at the same level as the interface IF2 between the first part 227BP1 and the second part 227BP2 of the second variable resistance pattern 227B.

The sixth gap-fill patterns 240B may have sixth thermal conductivity different from the fifth thermal conductivity of the fifth gap-fill pattern 250B. The sixth thermal conductivity may be substantially the same as the first thermal conductivity of the first gap-fill pattern 240A. The sixth gap-fill patterns 240B may have the sixth thermal conductivity that is relatively high, may be disposed on the sidewalls of the second variable resistance pattern 227B, and can reduce the temperature deviation within the second variable resistance pattern 227B. For example, the sixth gap-fill patterns 240B may be disposed to cover the sidewalls of the second part 227BP2 having a relatively high temperature, and can lower the temperature of the second part 227BP2 by dispersing heat of the second part 227BP2 when the set operation or the reset operation of the memory cells 220A and 220B is performed. Accordingly, the temperature deviation within the second variable resistance pattern 227B can be reduced.

The second liner patterns 260A may extend in the second direction II when viewed in a plan view, and may cover the sidewalls of the first memory cells 220A that face each other in the first direction I. The fourth liner patterns 260B may extend in the second direction II when viewed in a plan view, and may cover the sidewalls of the second memory cells 220B that face each other in the first direction I. The second liner patterns 260A and the fourth liner patterns 260B may remain on the sidewalls of the memory cells 220A and 220B without being removed in subsequent manufacturing processes, and can protect the memory cells 220A and 220B in the subsequent manufacturing processes.

The third gap-fill patterns 270A may be disposed between the first memory cells 220A arranged in the first direction I. The third gap-fill patterns 270A may have third thermal conductivity. The third gap-fill patterns 270A may have the third thermal conductivity that is relatively high, may be disposed on the sidewalls of the first variable resistance pattern 227A that face each other in the first direction I, and can reduce the temperature deviation within the first variable resistance pattern 227A.

The fourth gap-fill patterns 280A may be disposed between the first memory cells 220A arranged in the first direction I. The third gap-fill patterns 270A and the fourth gap-fill patterns 280A may be disposed between the first memory cells 220A that are adjacent to each other in the first direction I. The fourth gap-fill patterns 280A may be disposed on the third gap-fill patterns 270A, respectively, in the third direction III.

An interface IF5 between the third gap-fill pattern 270A and the fourth gap-fill pattern 280A may be disposed between the upper surface and the lower surface of the first variable resistance pattern 227A. For example, the interface IF5 between the third gap-fill pattern 270A and the fourth gap-fill pattern 280A may be disposed substantially at the same level as the interface IF1 between the first part 227AP1 and the second part 227AP2 of the first variable resistance pattern 227A.

The fourth gap-fill patterns 280A may have fourth thermal conductivity different from the third thermal conductivity of the third gap-fill pattern 270A. For example, the fourth thermal conductivity may be lower than the third thermal conductivity. The fourth gap-fill patterns 280A may have the fourth thermal conductivity that is relatively low, may be disposed on the sidewalls of the first variable resistance pattern 227A, and can reduce the temperature deviation within the first variable resistance pattern 227A.

The seventh gap-fill patterns 280B may be disposed between the second memory cells 220B arranged in the first direction I. An upper surface of each of the seventh gap-fill patterns 280B may be disposed between the upper surface and the lower surface of the second variable resistance pattern 227B. For example, the upper surface of each of the seventh gap-fill patterns 280B may be disposed substantially at the same level as the interface IF2 between the first part 227BP1 and the second part 227BP2 of the second variable resistance pattern 227B. The seventh gap-fill patterns 280B may include an insulating material, such as an oxide. For example, the seventh gap-fill patterns 280B may include $SiO_2$, SiOC, or a combination thereof.

The seventh gap-fill patterns 280B may have seventh thermal conductivity. The seventh thermal conductivity may be substantially the same as the fourth thermal conductivity of the fourth gap-fill patterns 280A. The seventh gap-fill patterns 280B may have the seventh thermal conductivity that is relatively low, may be disposed on the sidewalls of the second variable resistance pattern 227B, and can reduce the temperature deviation within the second variable resistance pattern 227B.

The eighth gap-fill patterns 270B may be disposed between the second memory cells 220B arranged in the first direction I. A lower surface of each of the eighth gap-fill patterns 270B may be disposed between the upper surface and the lower surface of the second variable resistance pattern 227B. For example, the lower surface of each of the eighth gap-fill patterns 270B may be disposed substantially at the same level as the interface IF2 between the first part 227BP1 and the second part 227BP2 of the second variable resistance pattern 227B. The eighth gap-fill patterns 270B may include an insulating material, such as an oxide. For example, the eighth gap-fill patterns 270B may include $SiO_2$, SiOC, or a combination thereof.

An interface IF6 between the seventh gap-fill pattern 280B and the eighth gap-fill pattern 270B may be disposed between the upper surface and the lower surface of the second variable resistance pattern 227B. For example, the interface IF6 between the seventh gap-fill pattern 280B and the eighth gap-fill pattern 270B may be disposed substantially at the same level as the interface IF2 between the first part 227BP1 and the second part 227BP2 of the second variable resistance pattern 227B.

The eighth gap-fill patterns 270B may have eighth thermal conductivity different from the seventh thermal conductivity of the seventh gap-fill pattern 280B. The eighth thermal conductivity may be substantially the same as the third thermal conductivity of the third gap-fill pattern 270A. The eighth gap-fill patterns 270B may have the eighth thermal conductivity that is relatively high, may be disposed on the sidewalls of the second variable resistance pattern 227B, and can reduce the temperature deviation within the second variable resistance pattern 227B.

Referring to FIG. 2D, the first part 227AP1 of the first variable resistance pattern 227A may be adjacent to the first conductive line 210A to which a negative (−) voltage is applied. The second part 227AP2 of the first variable resistance pattern 227A may be adjacent to the second conductive line 290A to which a positive (+) voltage is applied. The first part 227BP1 of the second variable resistance pattern 227B may be adjacent to the second conductive line 290B to which a positive (+) voltage is applied. The second part 227BP2 of the second variable resistance pattern 227B may be adjacent to the third conductive line 210B to which a negative (−) voltage is applied. Accordingly, the first gap-fill patterns 240A and the second gap-fill patterns 250A, and the fifth gap-fill patterns 250B and the sixth gap-fill patterns 240B, having different thermal conductivities, may be disposed by considering temperature differences between the first part 227AP1 and the second part 227AP2 and between the first part 227BP1 and the second part 227BP2, caused by bias polarities.

When the set operation or the reset operation of the memory cells 220A and 220B is performed, the temperature of the first part 227AP1 of the first variable resistance pattern 227A may be higher than the temperature of the second part 227AP2 of the first variable resistance pattern 227A, and the temperature of the second part 227BP2 of the second variable resistance pattern 227B may be higher than the temperature of the first part 227BP1 of the second variable resistance pattern 227B. The first gap-fill patterns 240A and the sixth gap-fill patterns 240B having thermal conductivity that is relatively high may be disposed on the first part 227AP1 and the second part 227BP2 having relatively high temperatures, respectively. Accordingly, the temperatures of the first part 227AP1 and the second part 227BP2 can be lowered by dispersing heat generated from the first part 227AP1 and the second part 227BP2 through the first gap-fill patterns 240A and the sixth gap-fill patterns 240B, respectively.

Furthermore, the second gap-fill patterns 250A and the fifth gap-fill patterns 250B having thermal conductivity that is relatively low may be disposed on the second part 227AP2 and the first part 227BP1 having relatively low temperatures, respectively. Accordingly, the dispersion of heat generated from the second part 227AP2 and the first part 227BP1 can be prevented or reduced by the second gap-fill patterns 250A and the fifth gap-fill patterns 250B, respectively. Accordingly, the temperature deviation within each of the first variable resistance pattern 227A and the second variable resistance pattern 227B can be reduced.

A current that is used to perform the set operation or the reset operation of the memory cells 220A and 220B can be reduced by disposing the gap-fill patterns 240A, 240B, 250A, and 250B having different thermal conductivities on the sidewalls of the upper and lower parts of the variable resistance patterns 227A and 227B. For example, an amount of current that is used to perform the set operation or the reset operation of the memory cells 220A and 220B can be reduced compared to a case in which a single gap-fill pattern having the same thermal conductivity is disposed on the sidewalls of the upper and lower parts of the variable resistance patterns 227A and 227B.**

In graphs of FIG. 2D each showing a relationship between a temperature of the variable resistance pattern 227A or 227B and the height "h" of the variable resistance pattern 227A or 227B, "A" may illustrate a thermal profile of a variable resistance pattern in a structure in which a single gap-fill pattern is disposed on the sidewalls of each of the variable resistance patterns 227A and 227B. In such a case, temperatures within the variable resistance patterns 227A and 227B may be different for each level of the height "h." For example, in the first variable resistance pattern 227A, a temperature of a lower level may be higher than a temperature of an upper level. In the second variable resistance pattern 227B, a temperature of a lower level may be lower than a temperature of an upper level.

On the other hand, "B" in the graphs may illustrate a thermal profile of the variable resistance patterns 227A and 227B in the structure in which the gap-fill patterns 240A, 240B, 250A, and 250B having different thermal conductivities are disposed on the sidewalls of the upper and lower parts of the variable resistance patterns 227A and 227B. In such a case, temperatures within the variable resistance patterns 227A and 227B may be uniform. For example, in the first variable resistance pattern 227A and the second variable resistance pattern 227B, a temperature of a lower level may be similar to a temperature of an upper level. Accordingly, the temperatures within the variable resistance patterns 227A and 227B may be uniform, and the amount of current that is used to perform the set operation or the reset operation of the memory cells 220A and 220B can be reduced.

However, the present disclosure is not limited to the aforementioned embodiments. A plurality of memory cells, such as third memory cells and fourth memory cells, which are positioned at different layers in the third direction III, may be additionally disposed in the semiconductor device, so that the semiconductor device may include a plurality of memory cell layers stacked in the third direction III. In this case, in an odd-numbered layer among the plurality of memory cell layers, a temperature of a first part of each of variable resistance patterns of memory cells may be higher than a temperature of a second part of each of the variable resistance patterns, wherein the second part may be disposed on the first part in the third direction III. Thermal conductivity of gap-fill patterns that cover sidewalls of the first part may be higher than thermal conductivity of gap-fill patterns that cover sidewalls of the second part. In contrast, in an even-numbered layer among the plurality of memory cell layers, a temperature of a first part of each of variable resistance patterns of memory cells may be lower than a temperature of a second part of each of the variable resistance patterns, wherein the second part may be disposed on the first part in the third direction III. Thermal conductivity of gap-fill patterns that cover sidewalls of the first part may be lower than thermal conductivity of gap-fill patterns that cover sidewalls of the second part.

According to the aforementioned structure, the first memory cells 220A may be disposed between the first conductive lines 210A and the second conductive lines 290 in the third direction III. The second memory cells 220B may be disposed between the second conductive lines 290 and the third conductive lines 210B in the third direction III. Accordingly, the directions of biases that are applied to the memory cells 220A may be opposite to the directions of biases that are applied to the memory cells 220B.

Since the directions of biases that are applied to the memory cells 220A may be opposite to the directions of biases that are applied to the memory cells 220B, the arrangements of the gap-fill patterns 240A and 240B, 250A and 250B, 270A and 270B, and 280A and 280B may be symmetric with respect to the second conductive lines 290. For example, the gap-fill patterns 250A and 280A having thermal conductivity that is relatively low may be respectively disposed on the gap-fill patterns 240A and 270A having thermal conductivity that is relatively high in the third direction III, thereby covering the sidewalls of the first memory cells 220A. The gap-fill patterns 240B and 270B having thermal conductivity that is relatively high may be respectively disposed on the gap-fill patterns 250B and 280B having thermal conductivity that is relatively low in the third direction III, thereby covering the sidewalls of the second memory cells 220B.

A current that is used to perform the set operation or the reset operation of the memory cells 220A and 220B can be reduced by disposing the gap-fill patterns 240A and 240B, 250A and 250B, 270A and 270B, and 280A and 280B, having different thermal conductivities, on the sidewalls of the upper and lower parts of the variable resistance patterns 227A and 227B.

FIGS. 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, and 14B are diagrams for describing a method of manufacturing a semiconductor device according to an embodiment of the present disclosure. FIGS. 3A, 4A, 5A, 6A, 7A, 8A, 9A, 10A, 11A, 12A, 13A, and 14A may be plan views of the semiconductor device. FIGS. 3B, 4B, 5B, 6B, 7B, and 8B may be cross-sectional views taken along line A-A' in FIGS. 3A, 4A, 5A, 6A, 7A, and 8A, respectively. FIGS. 9B, 10B, 11B, 12B, 13B, and 14B may be cross-sectional views taken along line B-B' in FIGS. 9A, 10A, 11A, 12A, 13A, and 14A, respectively. Hereinafter, contents that are redundant with the aforementioned contents are omitted and not described.

Figure 3A:
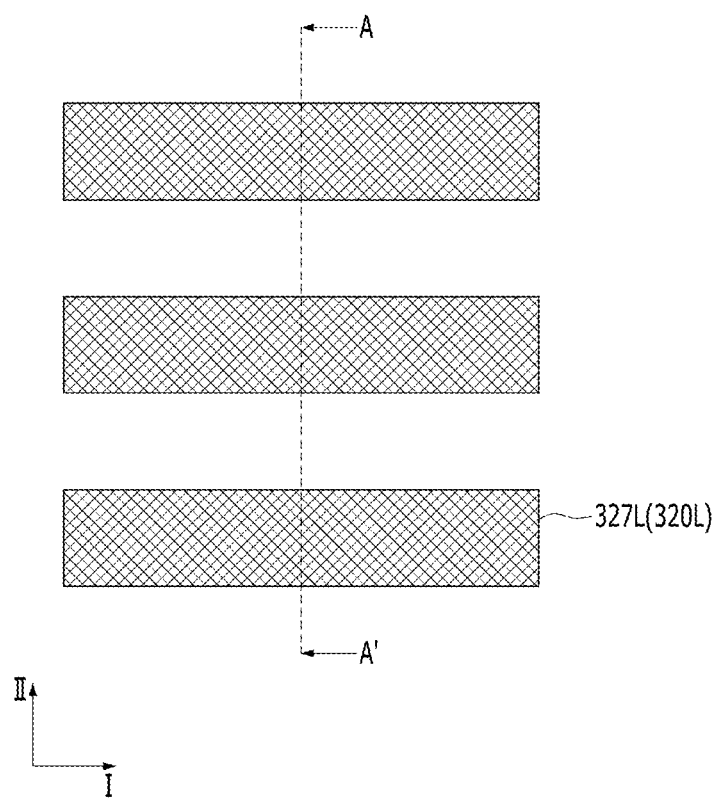
FIGS. 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, and 14B are diagrams for describing a method of manufacturing a semiconductor device according to an embodiment of the present disclosure.
Figure 3B:
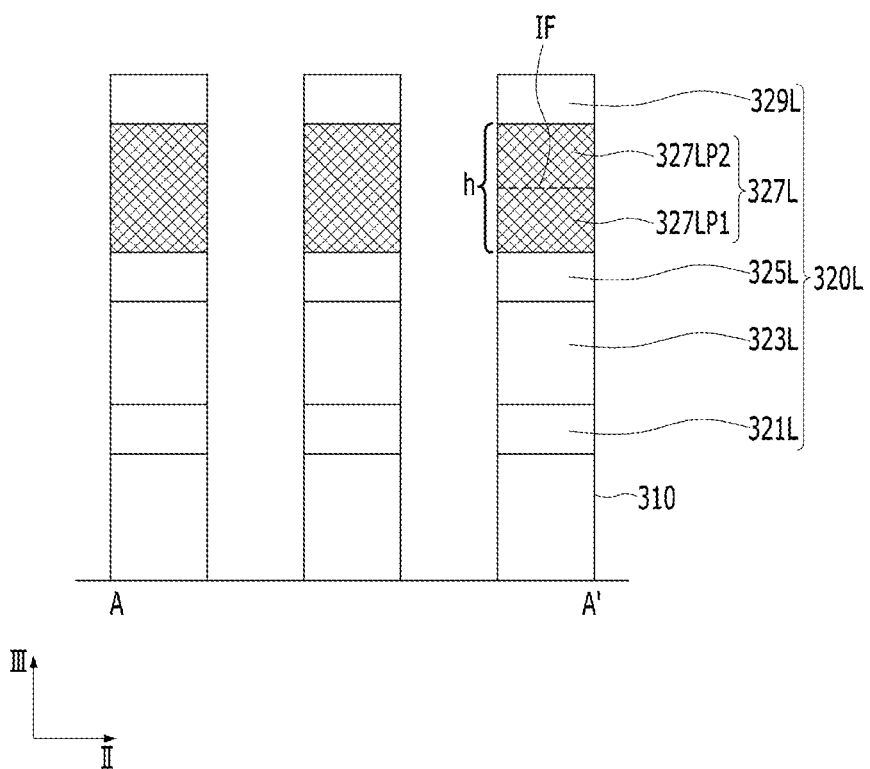

Referring to FIGS. 3A and 3B, first conductive lines 310 that extend in a first direction I may be formed. Memory lines 320L, which extend in the first direction I and include variable resistance lines 327L, respectively, may be formed on the first conductive lines 310. Each of the first conductive lines 310 and the memory lines 320L may be spaced apart from each other in a second direction II that intersects the first direction I.

To form the first conductive lines 310 and the memory lines 320L, a first conductive layer may be formed first. A memory stack may be formed on the first conductive layer in a third direction III that is perpendicular to each of the first direction I and the second direction II. The memory stack may be formed by sequentially stacking a first electrode layer, a switching layer, a second electrode layer, a variable resistance layer, and a third electrode layer in the third direction III. In this case, the third direction III may be orthogonal to a plane that is defined in the first direction I and the second direction II. Next, the memory lines 320L and the first conductive lines 310 may be formed by etching the memory stack and the first conductive layer.

The memory line 320L may include a first electrode line 321L, a switching line 323L, a second electrode line 325L, a variable resistance line 327L, and a third electrode line 329L. The variable resistance line 327L may include a first part 327LP1 and a second part 327LP2. An interface IF between the first part 327LP1 and the second part 327LP2 may be disposed between an upper surface and a lower surface of the variable resistance line 327L. The interface IF may be disposed at a 40 to 60% level of a height "h" of the variable resistance line 327L. For example, the interface IF may be disposed at an intermediate level of the height "h." In this case, the intermediate level may be about 50% level of the height "h."

The first conductive line 310 may be a word line or a bit line. The first conductive line 310 may include a conductive material. For example, the first conductive line 310 may include a metal material, such as tungsten. The first electrode line 321L, the second electrode line 325L, and the third electrode line 329L each may include a metal, a metal nitride, carbon, or a carbon nitride. The switching line 323L and/or the variable resistance line 327L may include a chalcogenide material.

Figure 4A:
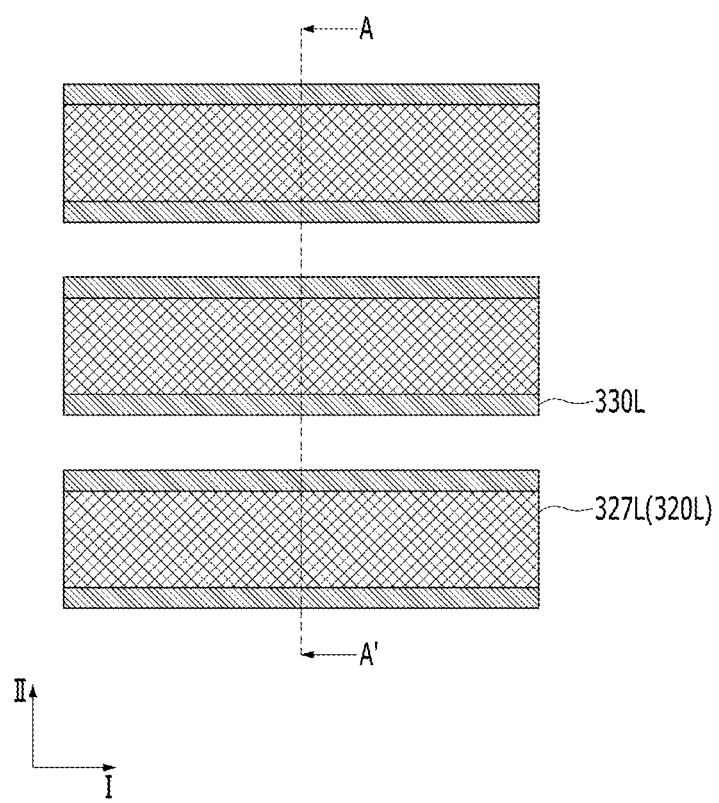
Figure 4B:
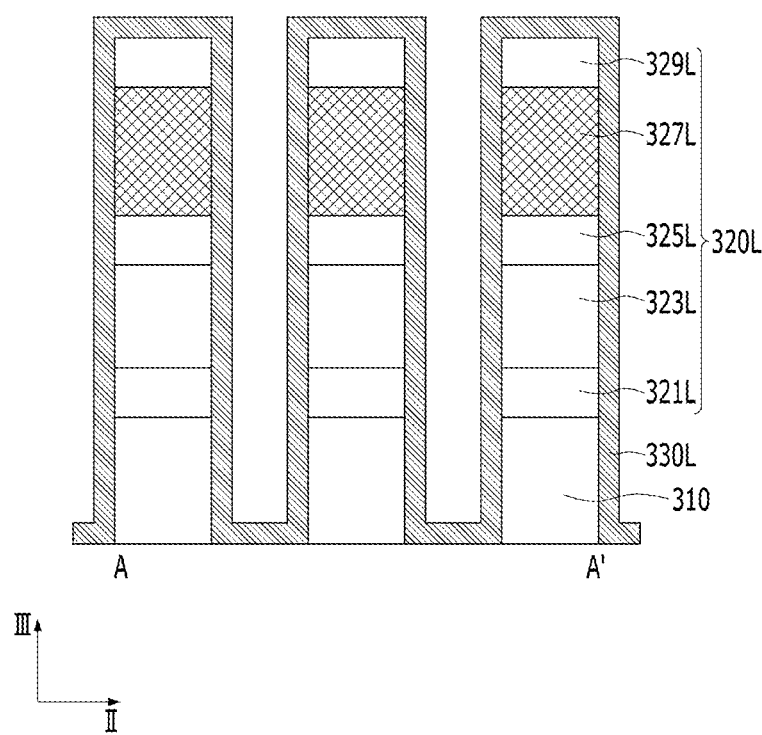

Referring to FIGS. 4A and 4B, a first liner layer 330L may be formed. The first liner layer 330L may be formed along a profile of the first conductive lines 310 and the memory lines 320L that extend in the first direction I. The first liner layer 330L may include an insulating material, such as an oxide or a nitride.

Figure 5A:
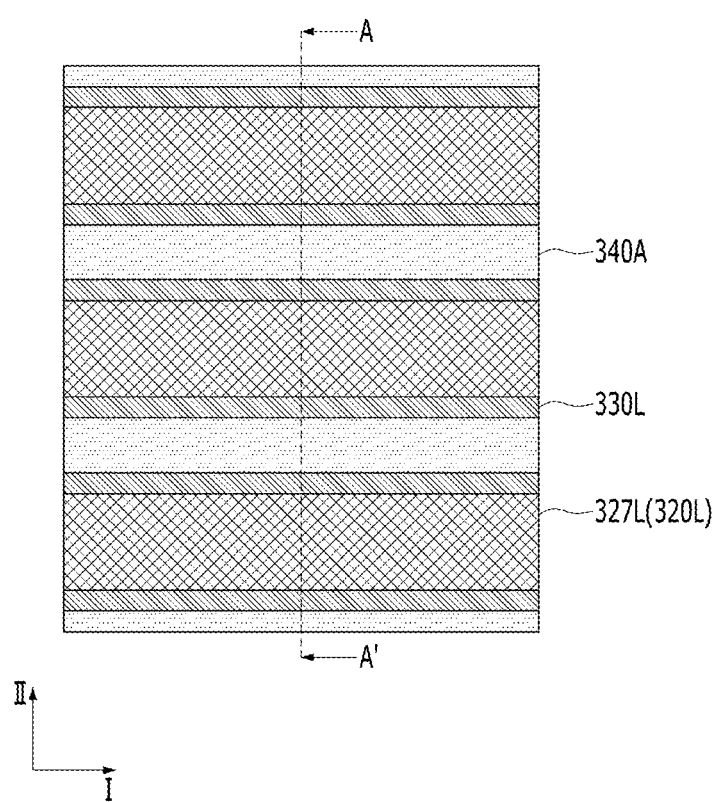
Figure 5B:
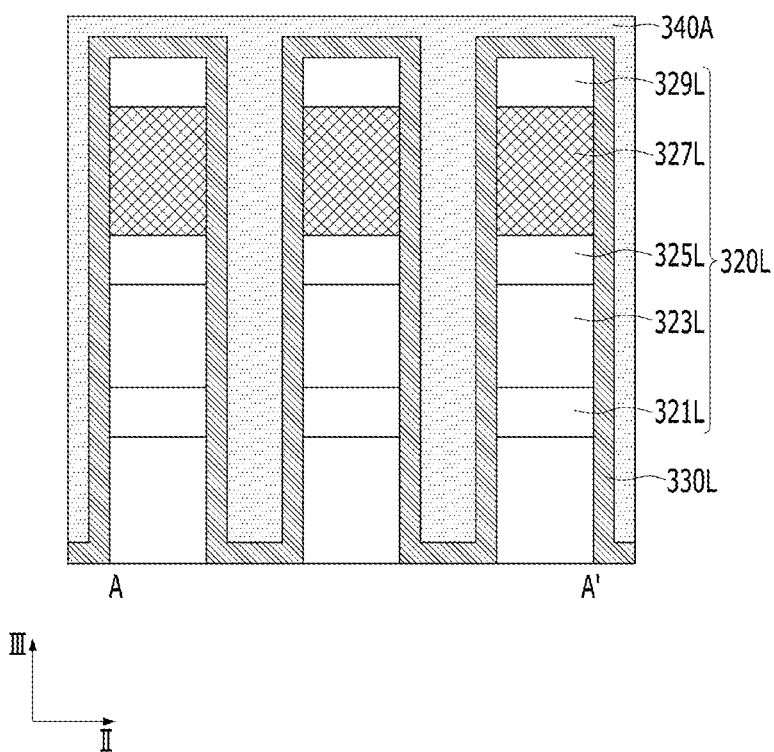

Referring to FIGS. 5A and 5B, a preliminary first gap-fill layer 340A may be formed. The preliminary first gap-fill layer 340A may be formed to fill spaces between the memory lines 320L after the first liner layer 330L is formed. For example, the preliminary first gap-fill layer 340A may be formed between the memory lines 320L that are adjacent to each other in the second direction II.

The preliminary first gap-fill layer 340A may have first thermal conductivity. The preliminary first gap-fill layer 340A may include an insulating material, such as an oxide. For example, the preliminary first gap-fill layer 340A may include $SiO_2$, SiOC, or a combination thereof.

Figure 6A:
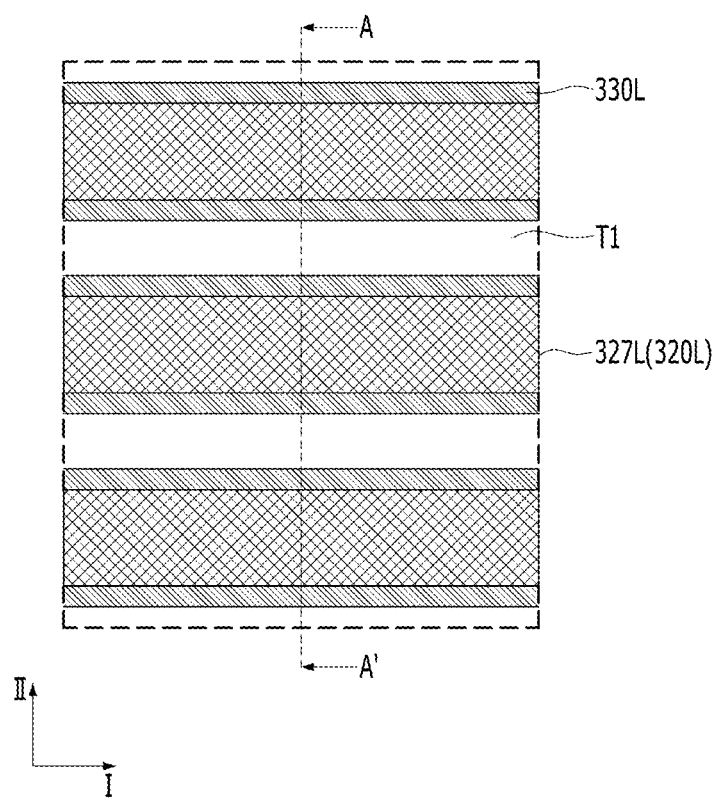
Figure 6B:
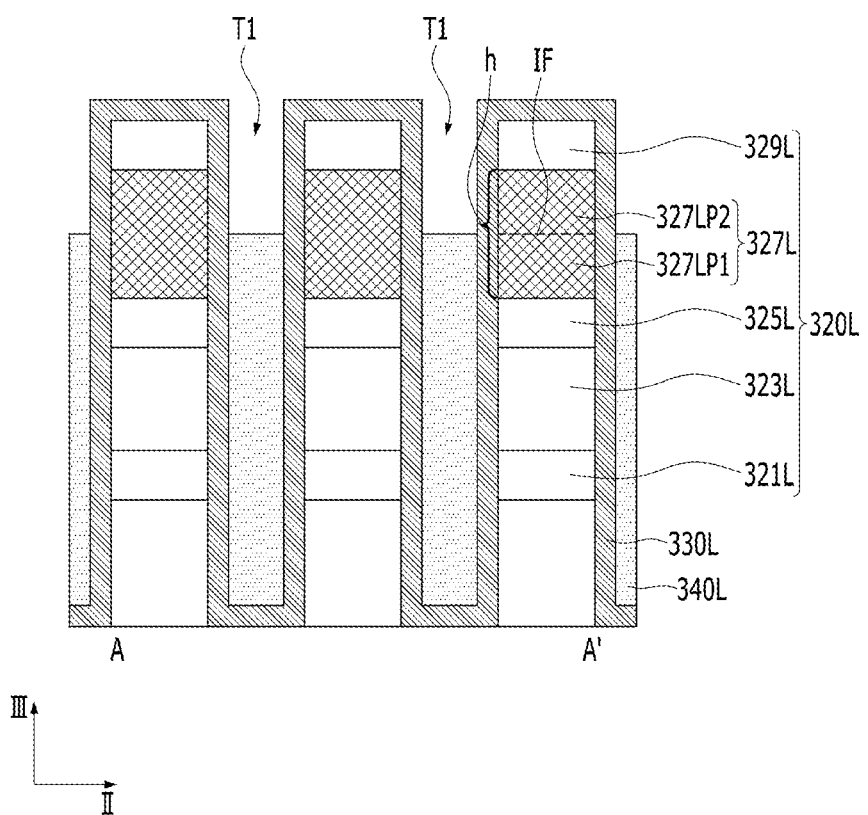

Referring to FIGS. 6A and 6B, first trenches T1 may be formed in the spaces between the memory lines 320L by etching the preliminary first gap-fill layer 340A. Here, "etching" may include "etching back" process. The first trenches T1 may be formed by etching the preliminary first gap-fill layer 340A to a depth corresponding to a level of the variable resistance lines 327L. The bottom of each of the first trenches T1 may be disposed between the upper surface and lower surface of each of the variable resistance lines 327L. For example, the first trenches T1 may be formed by etching the preliminary first gap-fill layer 340A to a depth that is substantially at the same level as the interface IF between the first part 327LP1 and the second part 327LP2 of the variable resistance line 327L. Accordingly, an upper surface of each of the preliminary first gap-fill layers may be disposed substantially at the same level as the interface IF between the first part 327LP1 and the second part 327LP2. Hereinafter, the etched preliminary first gap-fill layer will be labelled by the reference numeral "340L," and simply referred to as "first gap-fill layers."

The first liner layer 330L can protect the memory lines 320L in the process of forming the first trenches T1. During the process of forming the first trenches T1, parts of the first liner layer 330L may be etched.

Figure 7A:
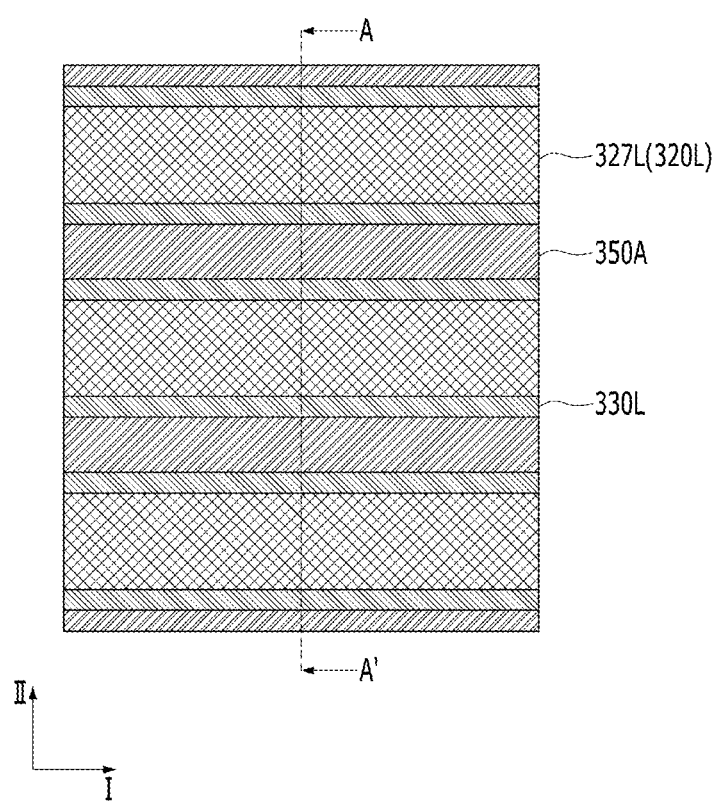
Figure 7B:
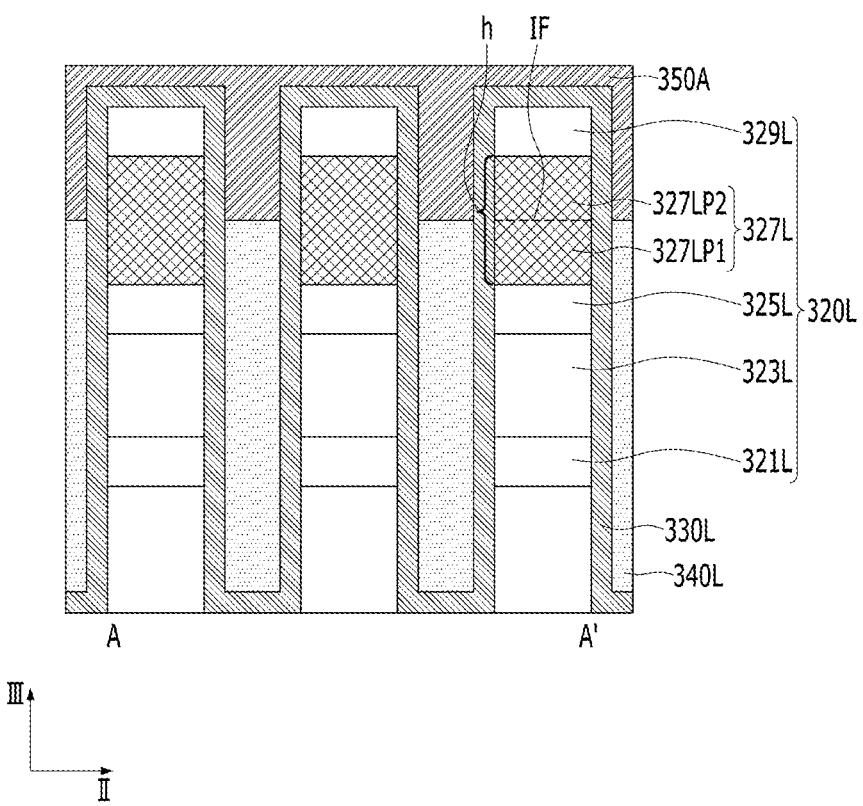

Referring to FIGS. 7A and 7B, a preliminary second gap-fill layer 350A may be formed to fill the first trenches T1 and cover the first liner layer 330L. The preliminary second gap-fill layer 350A may be formed on the first gap-fill layers 340L.

An interface between the first gap-fill layer 340L and the preliminary second gap-fill layer 350A may be disposed between the upper surface and the lower surface of the variable resistance line 327L. For example, the interface between the first gap-fill layer 340L and the preliminary second gap-fill layer 350A may be disposed substantially at the same level as the interface IF between the first part 327LP1 and the second part 327LP2 of the variable resistance line 327L. Accordingly, the first gap-fill layer 340L may be formed to cover the sidewall of the first part 327LP1, and the preliminary second gap-fill layer 350A may be formed to cover the sidewall of the second part 327LP2. The first liner layer 330L may be disposed between the first gap-fill layers 340L and the memory lines 320L and between the preliminary second gap-fill layer 350A and the memory lines 320L.

The preliminary second gap-fill layer 350A may have second thermal conductivity different from the first thermal conductivity of the first gap-fill layer 340L. For example, the second thermal conductivity may be lower than the first thermal conductivity. Accordingly, the first gap-fill layers 340L and the preliminary second gap-fill layer 350A having different thermal conductivities may be formed to cover the sidewalls of the first part 327LP1 and the second part 327LP2 of the variable resistance line 327L, respectively. The preliminary second gap-fill layer 350A may include an insulating material, such as an oxide. For example, the preliminary second gap-fill layer 350A may include $SiO_2$, SiOC, or a combination thereof.

Figure 8A:
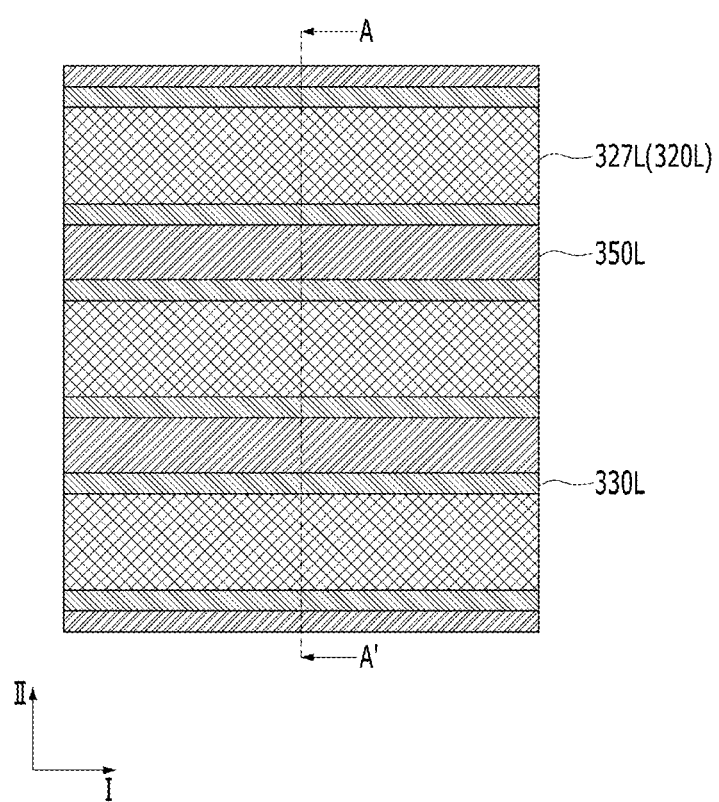
Figure 8B:
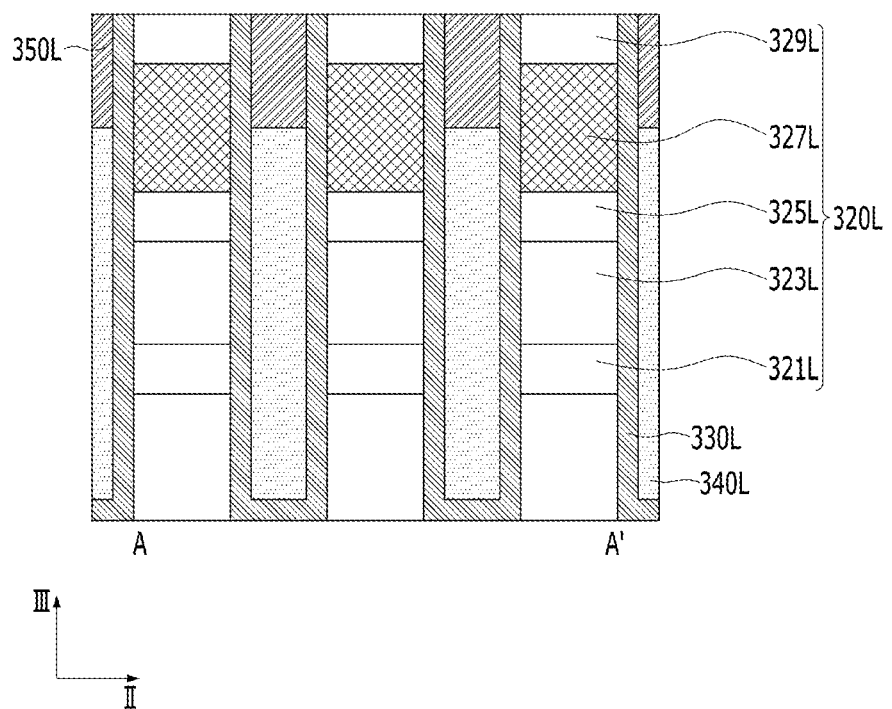

Referring to FIGS. 8A and 8B, the preliminary second gap-fill layer 350A and the first liner layer 330L may be planarized until a top layer of the memory line 320L is exposed. Hereinafter, the planarized preliminary second gap-fill layer will be labelled by the reference numeral "350L", and simply referred to as "second gap-fill layers". Accordingly, a top surface of the third electrode line 329L, a top surface of the first liner layer 330L, and a top surface of the second gap-fill layer 350L may be disposed substantially at the same level. Through the planarization, the second gap-fill layer 350L may remain only between the memory lines 320L arranged in the second direction II.

Figure 9A:
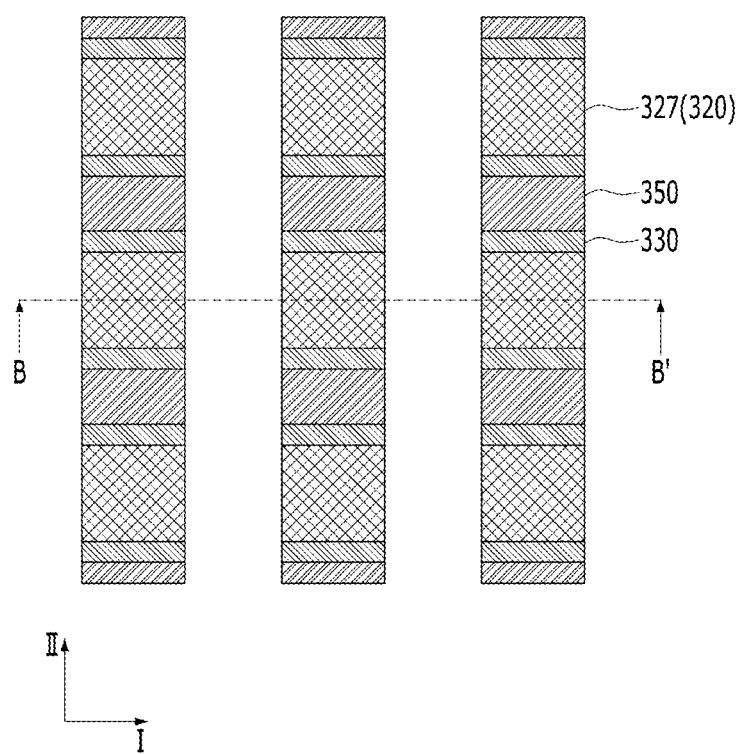
Figure 9B:
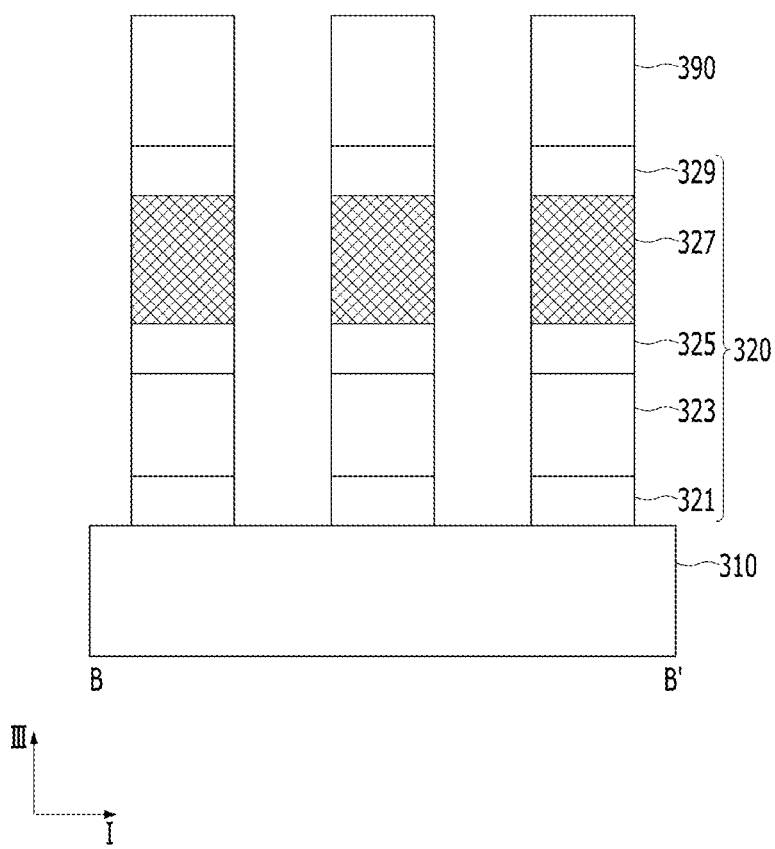

Referring to FIGS. 9A and 9B, second conductive lines 390 and memory cells 320 are formed. The second conductive lines 390 extend in the second direction II, and the memory cells 320 are arranged in the first direction I and the second direction II. In this case, the second conductive lines 390 may be spaced apart from each other in the first direction I.

To form the second conductive lines 390 and the memory cells 320, a second conductive layer may be formed on the semiconductor device after the memory lines 320L and the second gap-fill layers 350L are formed. Next, the second conductive lines 390 may be formed by etching the second conductive layer, and the memory cells 320 may be formed by etching the memory lines 320L. The memory cells 320 each may include a first electrode pattern 321, a switching pattern 323, a second electrode pattern 325, a variable resistance pattern 327, and a third electrode pattern 329. The first electrode pattern 321 may be a lower electrode. The second electrode pattern 325 may be an intermediate electrode. The third electrode pattern 329 may be an upper electrode.

In the process of forming the second conductive lines 390 and the memory cells 320, each of the first liner layers 330L may be divided into first liner patterns 330, each of the second gap-fill layers 350L may be divided into second gap-fill patterns 350, and each of the first gap-fill layers 340L may be divided into first gap-fill patterns, in the first direction I.

The second conductive lines 390 each may be a word line or a bit line. For example, when the first conductive line 310 is a word line, the second conductive line 390 may be a bit line. As another example, when the first conductive line 310 is a bit line, the second conductive line 390 may be a word line. The second conductive line 390 may include a conductive material. For example, the second conductive line 390 may include a metal material, such as tungsten.

Figure 10A:
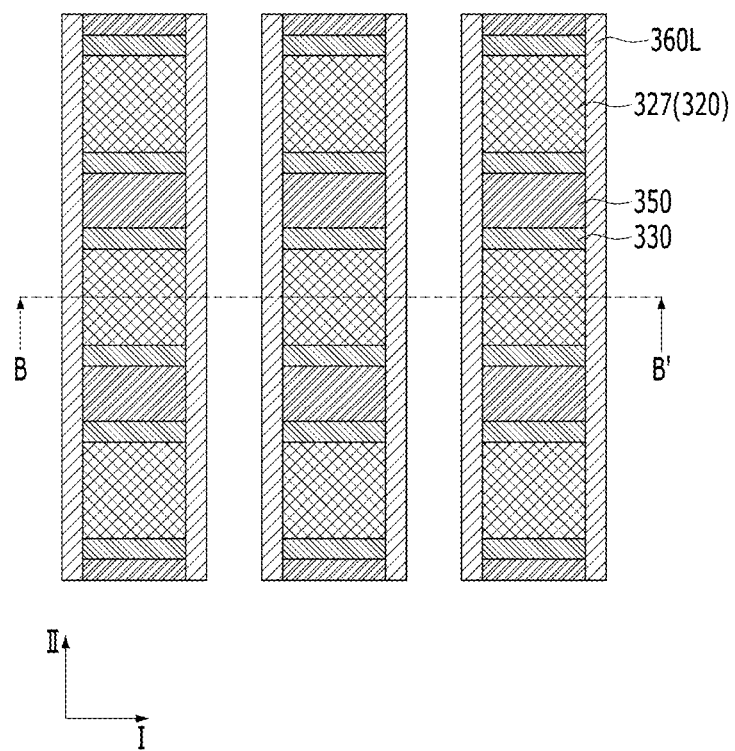
Figure 10B:
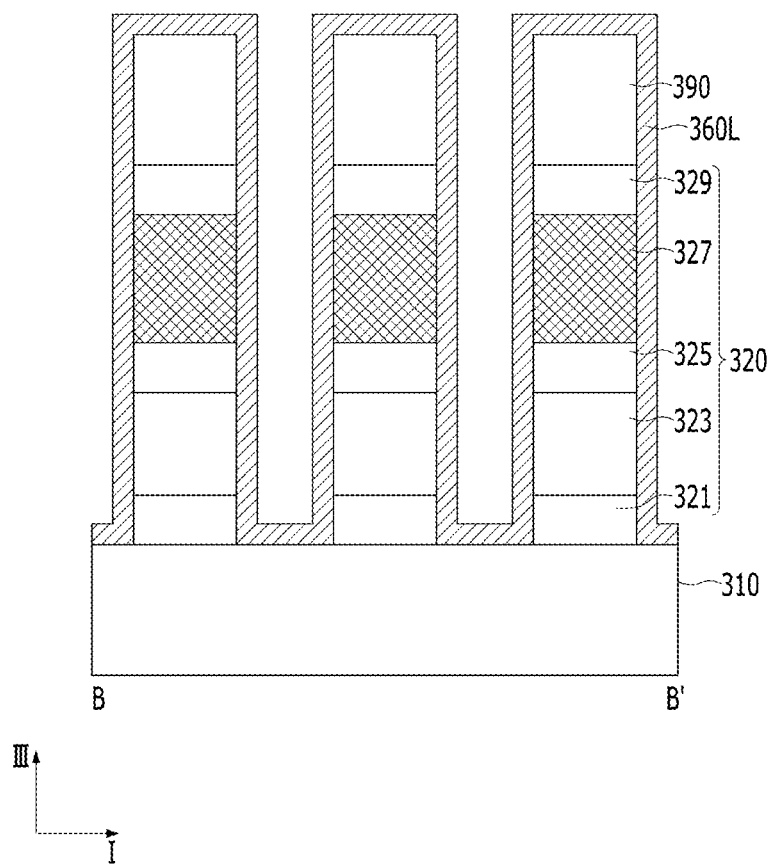

Referring to FIGS. 10A and 10B, a second liner layer 360L may be formed. The second liner layer 360L may be formed along a profile of the second conductive lines 390 and the memory cells 320. The second liner layer 360L may include an insulating material, such as an oxide or a nitride.

Figure 11A:
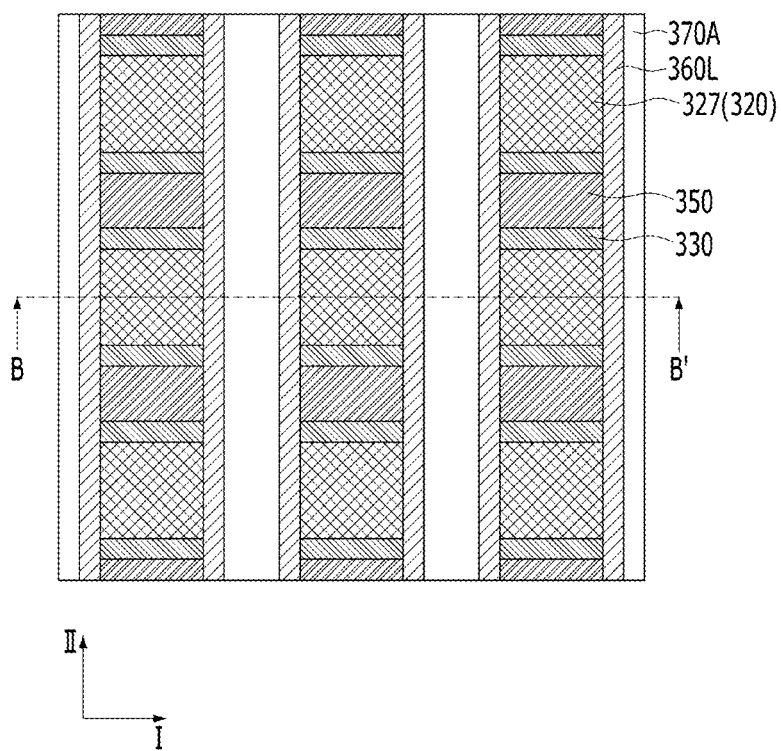
Figure 11B:
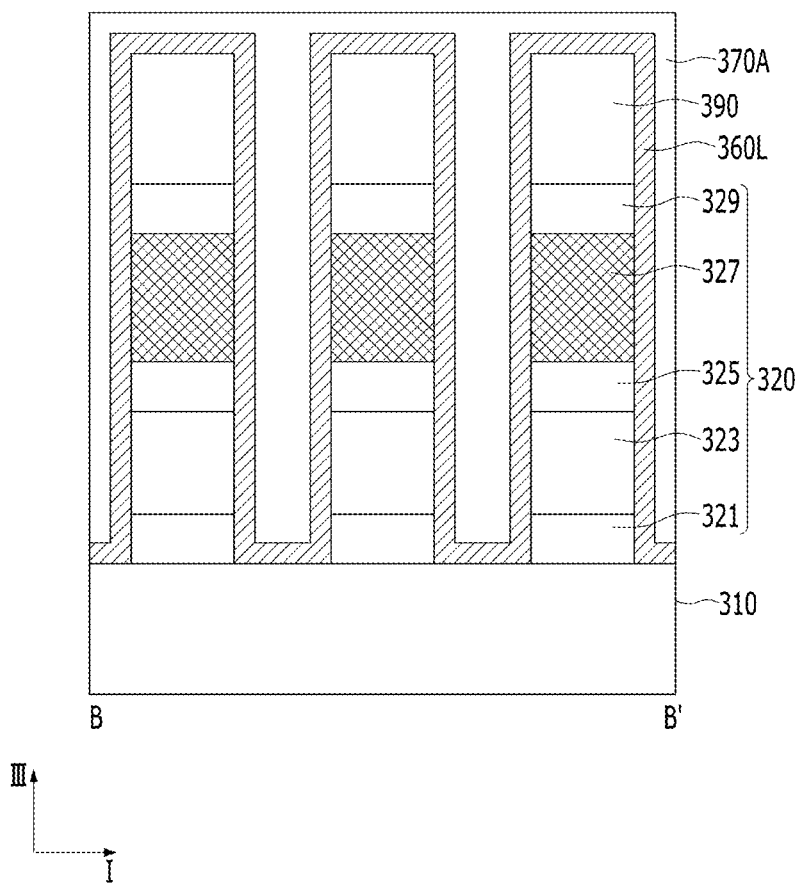

Referring to FIGS. 11A and 11B, a preliminary third gap-fill layer 370A may be formed. The preliminary third gap-fill layers 370A may be formed on the second liner layer 360L to fill spaces between the memory cells 320 arranged in the first direction I.

The preliminary third gap-fill layer 370A may have third thermal conductivity. In this case, the third thermal conductivity may be substantially the same as the first thermal conductivity of the first gap-fill layers 340L. The preliminary third gap-fill layer 370A may include an insulating material, such as an oxide. For example, the preliminary third gap-fill layer 370A may include $SiO_2$, SiOC, or a combination thereof.

Figure 12A:
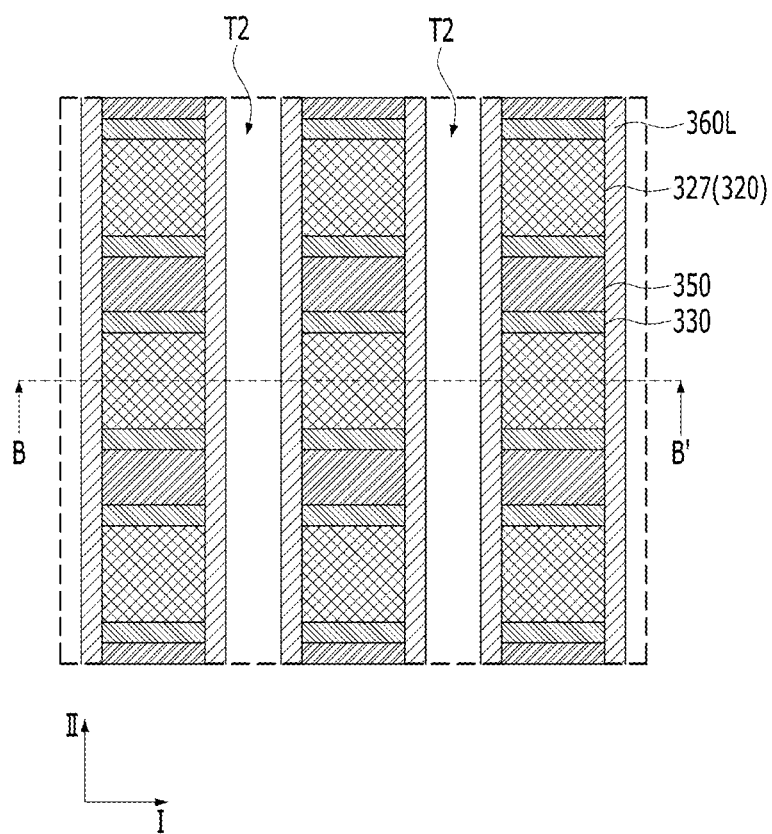
Figure 12B:
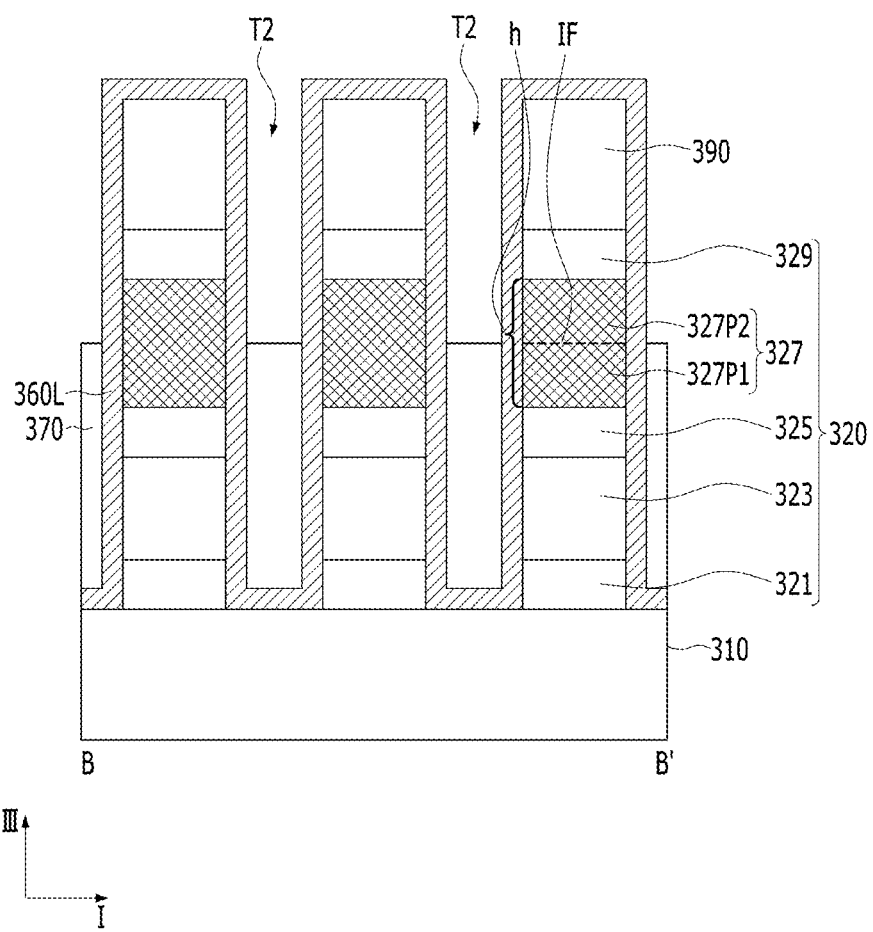

Referring to FIGS. 12A and 12B, second trenches T2 may be formed by etching the preliminary third gap-fill layer 370A. The second trenches T2 may be formed by etching the preliminary third gap-fill layer 370A to a depth corresponding to a level of the variable resistance patterns 327. The bottom of each of the second trenches T2 may be disposed between an upper surface and lower surface of each of the variable resistance patterns 327. For example, the second trenches T2 may be formed by etching the preliminary third gap-fill layer 370A to a depth that is substantially at the same level as the interface IF between the first part 327P1 and second part 327P2 of the variable resistance pattern 327. Accordingly, an upper surface of each of the etched preliminary third gap-fill layers 370A may be disposed substantially at the same level as the interface IF between the first part 327LP1 and the second part 327LP2. Hereinafter, the etched preliminary third gap-fill layer will be also labelled by the reference numeral "370," and simply referred to as "third gap-fill layers." Also, the "third-gap fill layers" may be used as "third gap-fill patterns" to mean that the preliminary third gap-fill layer is patterned.

The second liner layer 360L can protect the memory cells 320 in the process of forming the second trenches T2. During the process of forming the second trenches T2, parts of the second liner layer 360L may be etched.

Figure 13A:
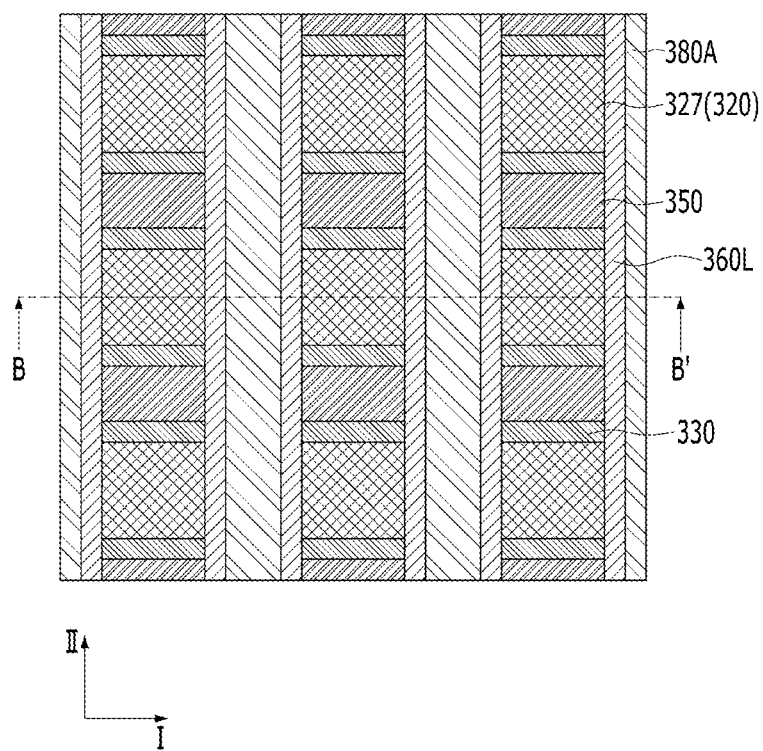
Figure 13B:
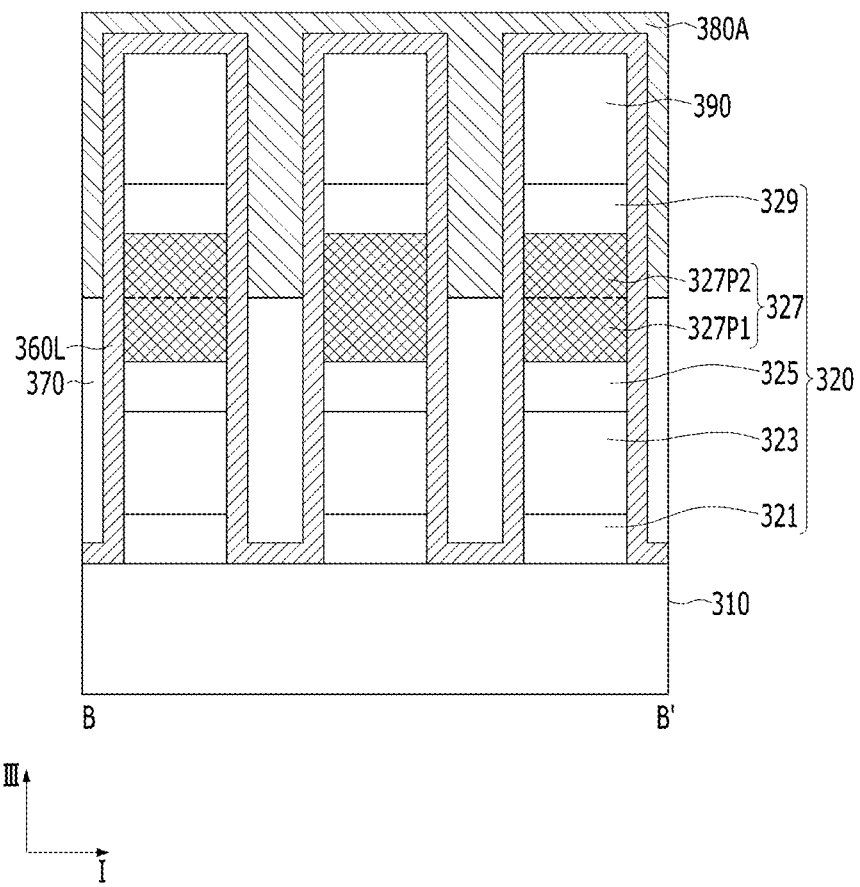

Referring to FIGS. 13A and 13B, a preliminary fourth gap-fill layer 380A may be formed to fill the second trenches T2 and cover the second liner layer 360L. The preliminary fourth gap-fill layer 380A may be formed on the third gap-fill layers 370.

An interface between the third gap-fill layer 370 and the preliminary fourth gap-fill layer 380A may be disposed between the upper surface and the lower surface of the variable resistance pattern 327. For example, the interface between the third gap-fill layer 370 and the preliminary fourth gap-fill layer 380A may be disposed substantially at the same level as the interface IF between the first part 327P1 and second part 327P2 of the variable resistance pattern 327. Accordingly, the third gap-fill layer 370 may be formed to cover the sidewall of the first part 327P1. The preliminary fourth gap-fill layer 380A may be formed to cover the sidewall of the second part 327P2. The second liner layer 360L may be disposed between the third gap-fill layers 370 and the memory cells 320 and between the preliminary fourth gap-fill layer 380A and the memory cells 320.

The preliminary fourth gap-fill layer 380A may have fourth thermal conductivity different from the third thermal conductivity of the third gap-fill layer 370. For example, the fourth thermal conductivity may be lower than the third thermal conductivity. Accordingly, the third gap-fill layers 370 and the preliminary fourth gap-fill layer 380A having different thermal conductivities may be formed to cover the sidewalls of the first part 327LP1 and the second part 327LP2 of the variable resistance pattern 327, respectively. The preliminary fourth gap-fill layer 380A may include an insulating material, such as an oxide. For example, the preliminary fourth gap-fill layer 380A may include $SiO_2$, SiOC, or a combination thereof.

Figure 14A:
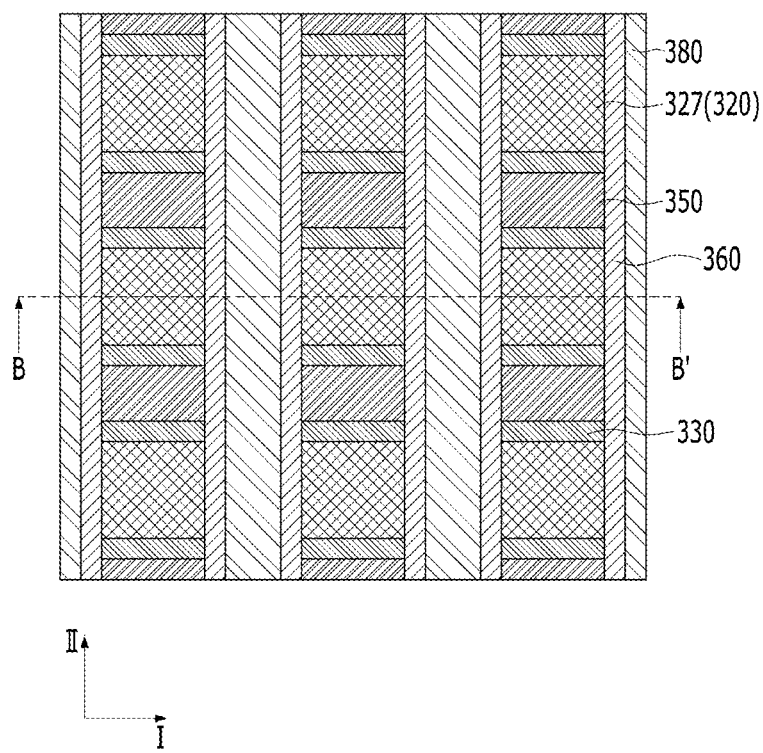
Figure 14B:
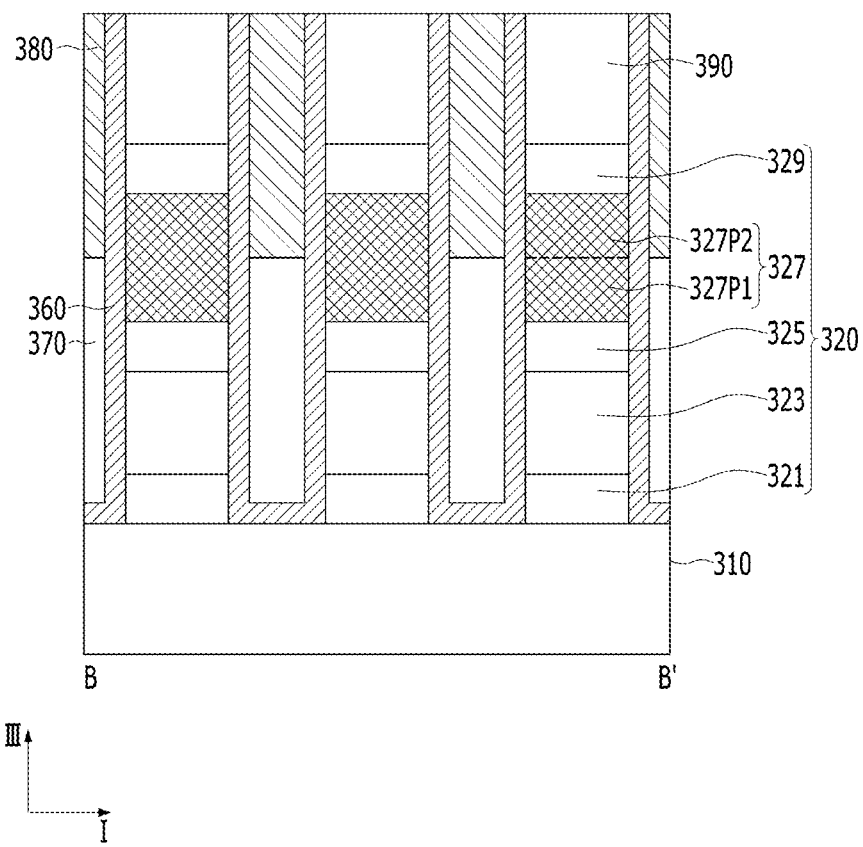

Referring to FIGS. 14A and 14B, the preliminary fourth gap-fill layer 380A and the second liner layer 360L may be planarized until top surfaces of the second conductive lines 390 are exposed. In this process, the preliminary fourth gap-fill layer 380A may be divided into fourth gap-fill patterns 380 arranged in the first direction I. The second liner layers 360L may be divided into second liner patterns 360 arranged in the first direction I. The top surfaces of the second conductive lines 390, top surfaces of the second liner patterns 360, and top surfaces of the fourth gap-fill patterns 380 may be disposed substantially at the same level.

When the gap-fill patterns 340 and 350 having different thermal conductivities and the gap-fill patterns 370 and 380 having different thermal conductivities are formed on the sidewalls of the upper and lower parts of the variable resistance patterns 327, a temperature within the variable resistance patterns 327 can become uniform as described with reference to FIG. 1D. For example, when the set operation or the reset operation of the memory cells 320 is performed, a temperature of the first part 327P1 may be higher than that of the second part 327P2. Heat generated from the first part 327P1 may be dispersed because the first gap-fill patterns 340 and the third gap-fill patterns 370 that cover the sidewalls of the first part 327P1 have the first thermal conductivity and the third thermal conductivity that are relatively high. Accordingly, the temperature of the first part 327P1 can be lowered.

Furthermore, heat generated from the second part 327P2 can be prevented from being dispersed or the dispersion of the heat can be reduced because the second gap-fill patterns 350 and the fourth gap-fill patterns 380 that cover the sidewalls of the second part 327P2 have the second thermal conductivity and the fourth thermal conductivity that are relatively low. Furthermore, heat generated from the first part 327P1 may be delivered to the second part 327P2, and thus a temperature of the second part 327P2 can be increased. Accordingly, a temperature deviation within the variable resistance patterns 327 can be reduced, and an amount of current that is required to perform the set operation or the reset operation of memory cells 320 can be reduced.

Figure 15A:
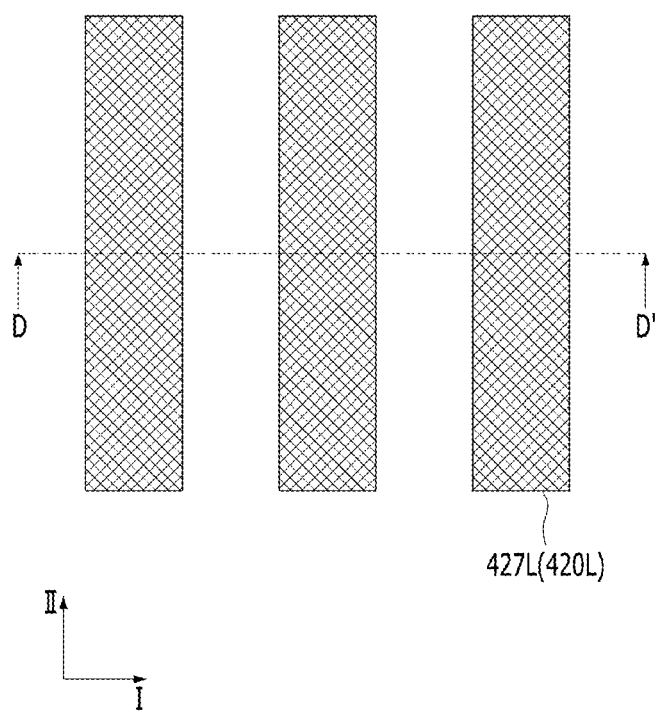
FIGS. 15A, 15B, 16A, 16B, 17A, 17B, 18A, and 18B are diagrams for describing a method of manufacturing a semiconductor device according to an embodiment of the present disclosure.
Figure 15B:
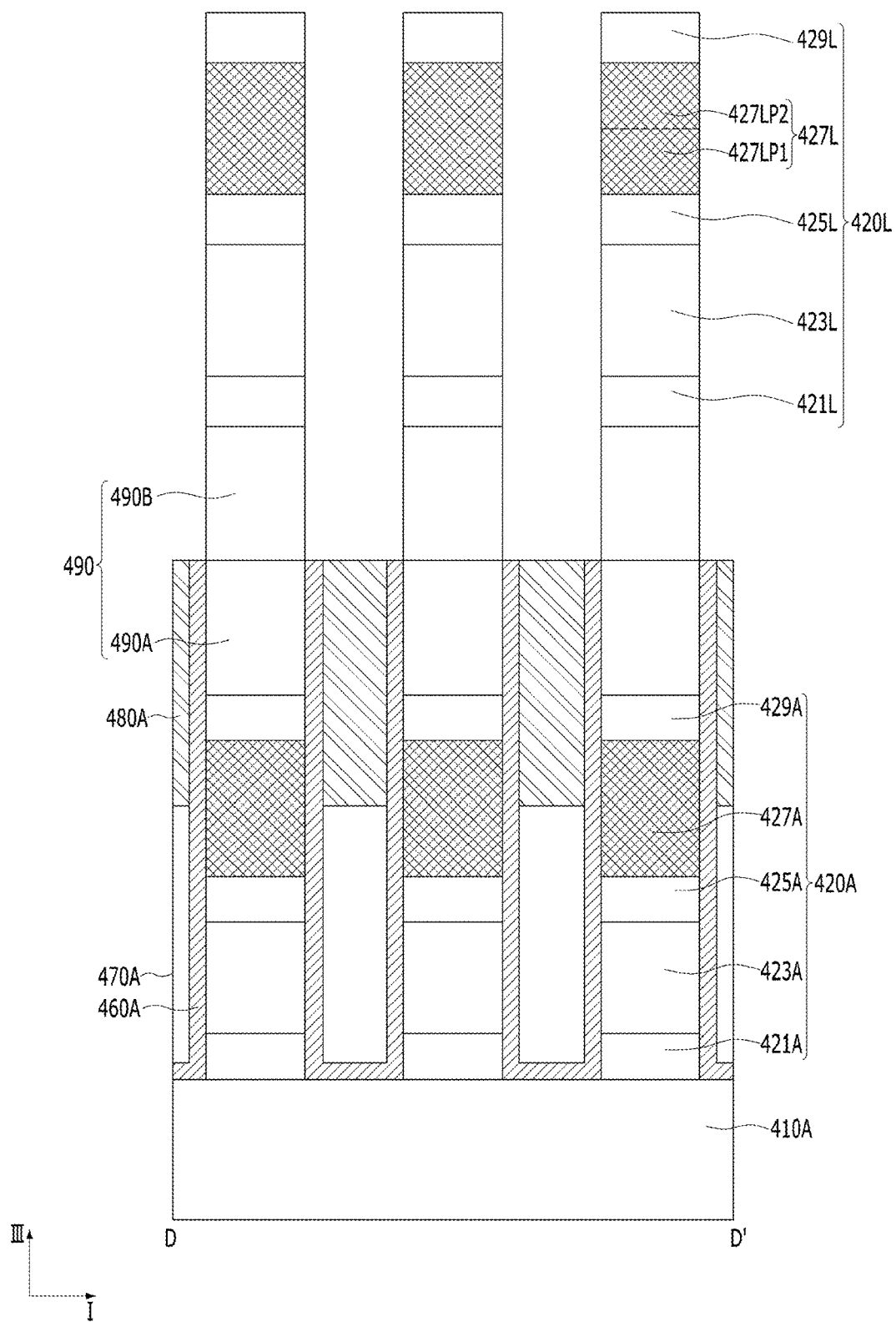
Figure 16A:
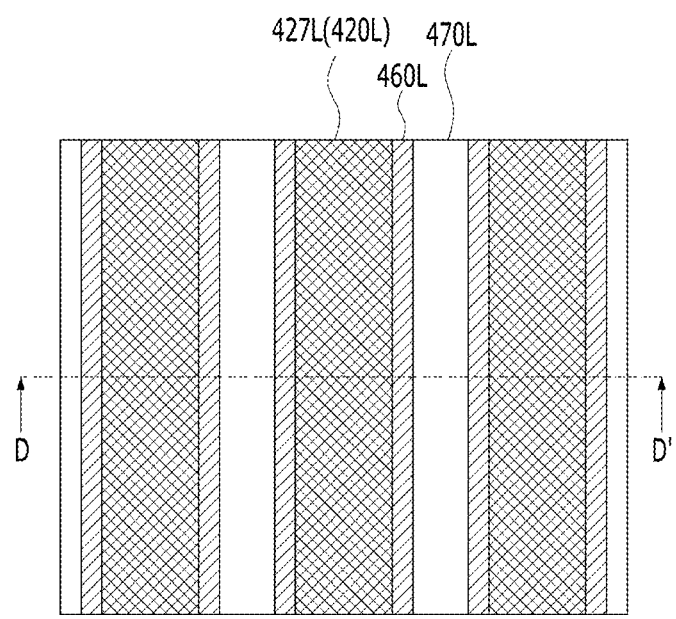
Figure 16B:
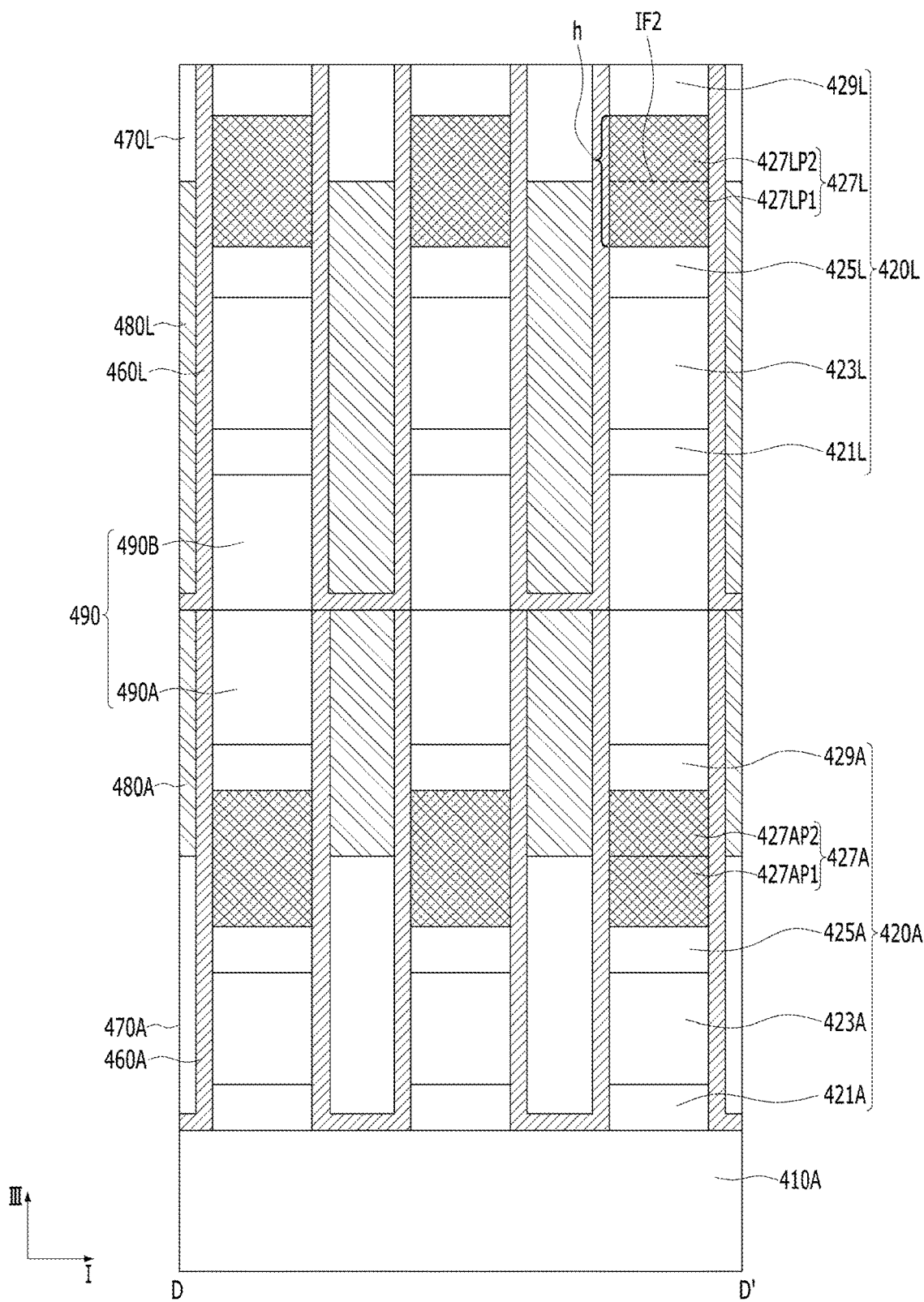
Figure 17A:
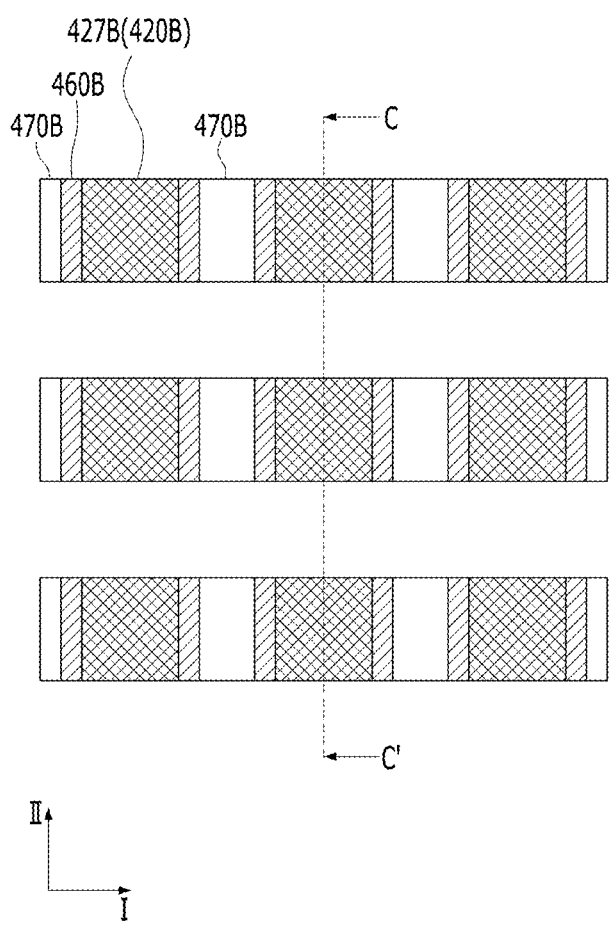
Figure 17B:
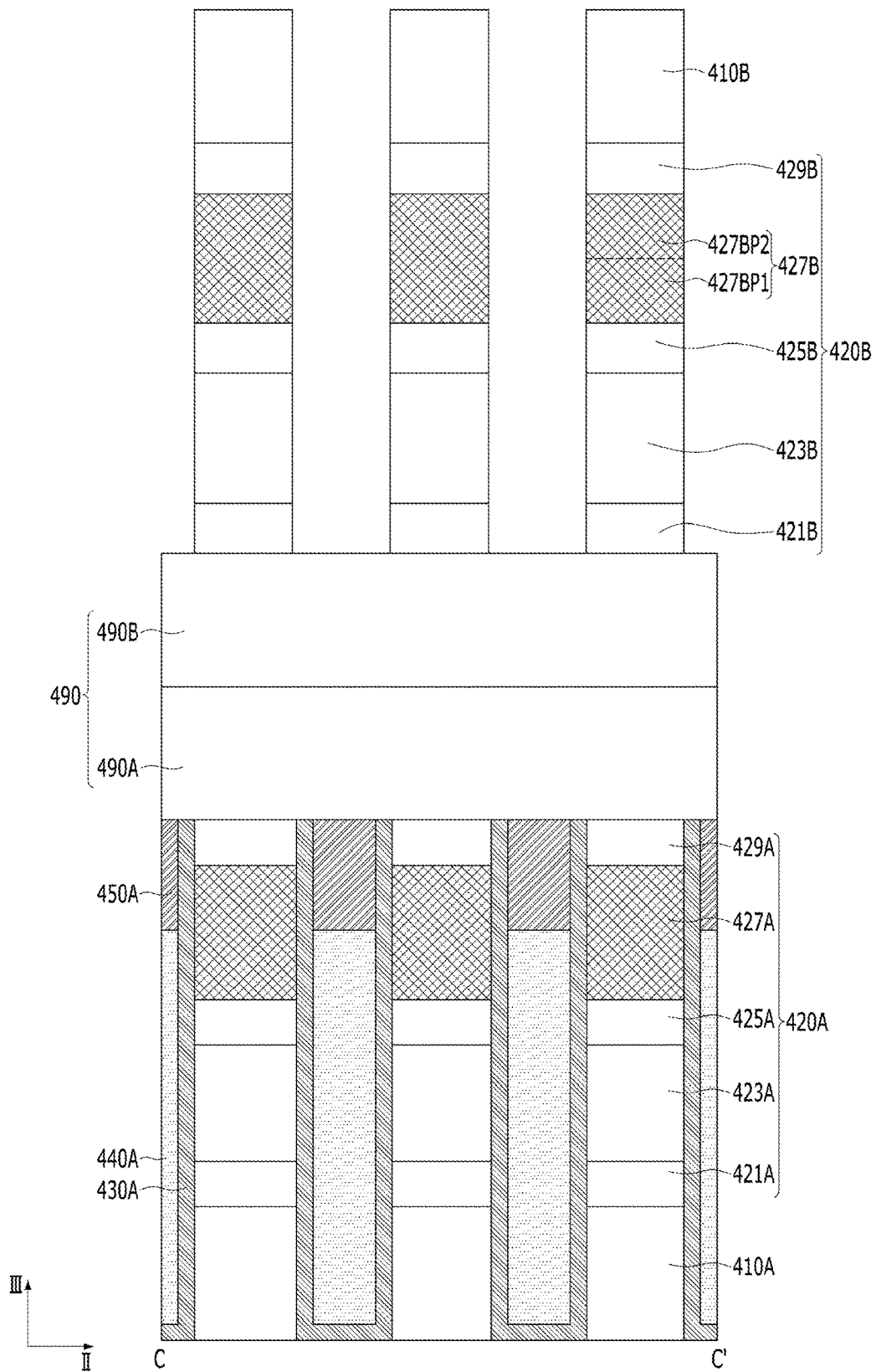
Figure 18A:
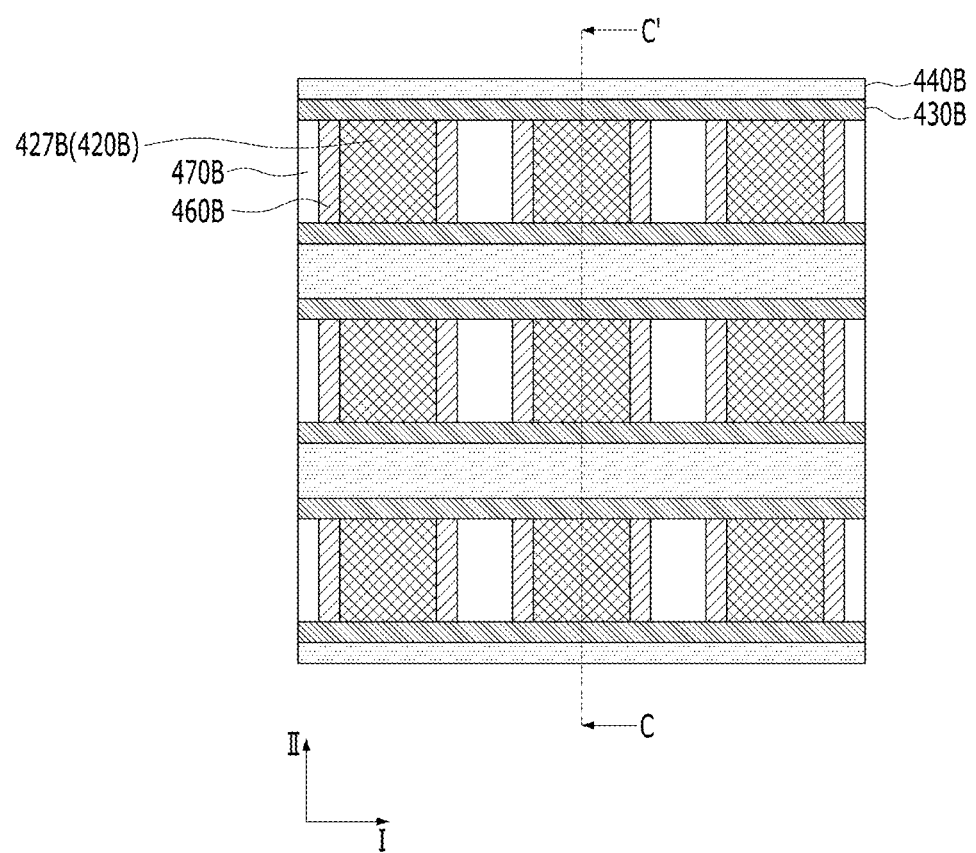
Figure 18B:
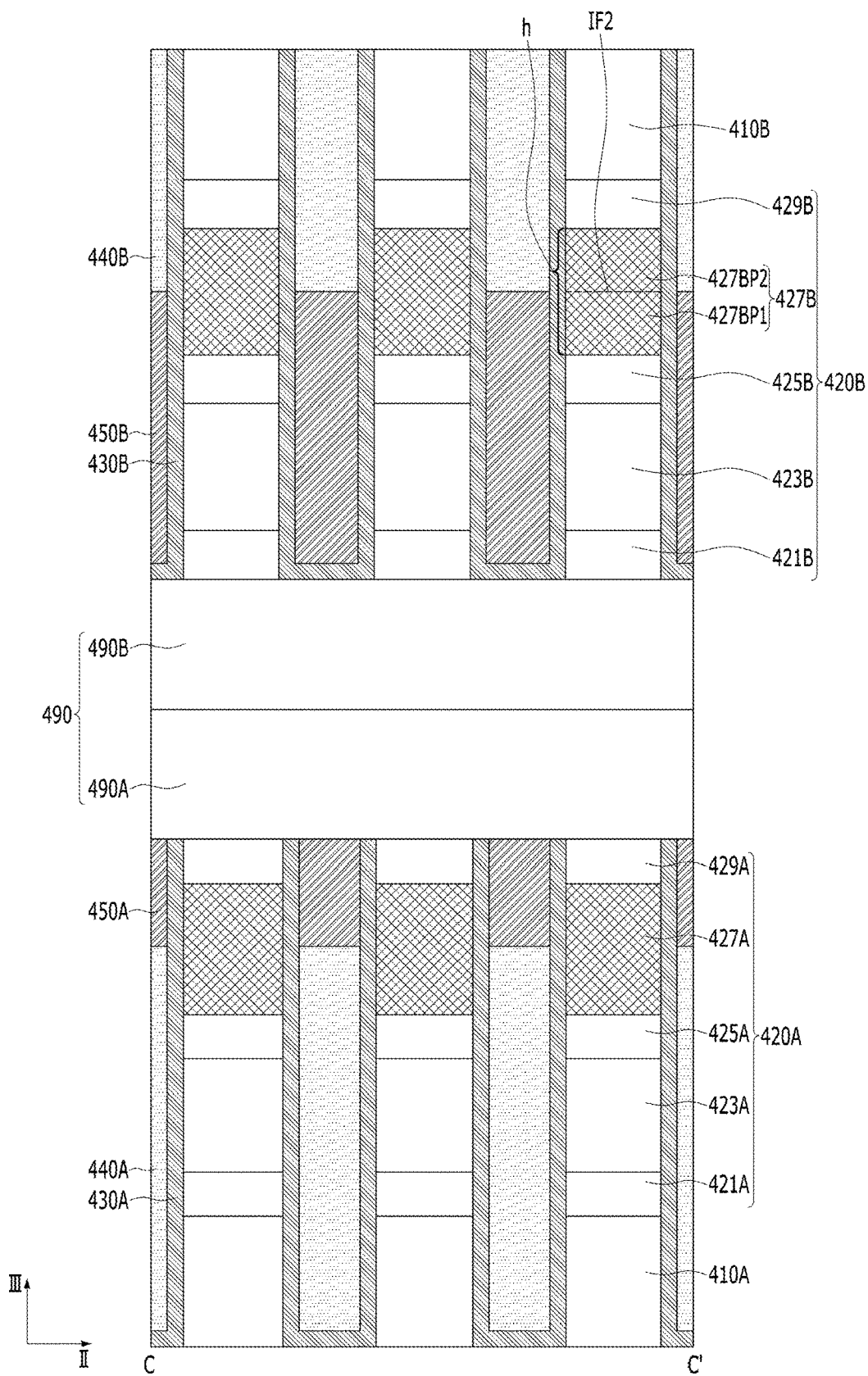

FIGS. 15A, 15B, 16A, 16B, 17A, 17B, 18A, and 18B are diagrams for describing a method of manufacturing a semiconductor device according to an embodiment of the present disclosure. FIGS. 15A, 16A, 17A, and 18A are plan views of the semiconductor device. FIGS. 15B and 16B are cross-sectional views taken along line D-D' in FIGS. 15A and 16A, respectively. FIGS. 17B and 18B are cross-sectional views taken along line C-C' in FIGS. 17A and 18A, respectively. Hereinafter, contents that are redundant with the aforementioned contents are omitted and not described.

Referring to FIGS. 15A and 15B, first conductive lines 410A that extend in a first direction I may be formed. First memory cells 420A that are arranged in the first direction I and a second direction II intersecting the first direction I may be formed on the first conductive lines 410A in a third direction III. The first memory cells 420A each may include a first electrode pattern 421A, a first switching pattern 423A, a second electrode pattern 425A, a first variable resistance pattern 427A, and a third electrode pattern 429A.

Second liner patterns 460A, third gap-fill patterns 470A, and fourth gap-fill patterns 480A may be formed between the first memory cells 420A that are adjacent to each other in the first direction I. Referring back to FIGS. 9A, 9B, 10A, 10B, 11A, 11B, 12A, 12B, 13A, 13B, 14A, and 14B, the second liner patterns 460A, the third gap-fill patterns 470A, and the fourth gap-fill patterns 480A may be formed by using the same methods as the methods of forming the second liner patterns 360, the third gap-fill patterns 370, and the fourth gap-fill patterns 380, respectively.

Second conductive lines 490 that extend in the second direction II may be formed on the first memory cells 420A. The second conductive lines 490 each may include at least one of a second-first conductive line 490A or a second-second conductive line 490B. The second conductive lines 490 each may be a single layer in which the second-first conductive line 490A and the second-second conductive line 490B are constructed as one layer, or a multi-layer in which the second-first conductive line 490A and the second-second conductive line 490B are constructed as separate layers.

In an embodiment, the second-first conductive line 490A and the second-second conductive line 490B may be formed by separate processes. After the second-first conductive line 490A is formed, the second-second conductive line 490B may be formed on the second-first conductive line 490A.

Second memory lines 420L that extend in the second direction II may be formed on the second conductive lines 490. For example, the second memory lines 420L may be formed on the second-second conductive line 490B. The second memory lines 420L each may include a first electrode line 421L, a second switching line 423L, a second electrode line 425L, a second variable resistance line 427L, or a third electrode line 429L. In this case, the second variable resistance line 427L may include a first part 427LP1 and a second part 427LP2.

Referring to FIGS. 16A and 16B, fourth liner layers 460L, seventh gap-fill layers 480L, and eighth gap-fill layers 470L may be formed between the second memory lines 420L that are adjacent to each other in the first direction I.

Referring back to FIGS. 9A, 9B, 10A, 10B, 11A, 11B, 12A, 12B, 13A, 13B, 14A, and 14B, the fourth liner layers 460L, the seventh gap-fill layers 480L, and the eighth gap-fill layers 470L may be formed by using the same methods as the methods of forming the second liner patterns 360, the third gap-fill patterns 370, and the fourth gap-fill patterns 380, respectively.

First, the fourth liner layer 460L may be formed along a profile of the second memory lines 420L. Next, the seventh gap-fill layer 480L may be formed so that spaces between the second memory lines 420L are filled. Next, trenches may be formed by etching the seventh gap-fill layer 480L by substantially the same level as an interface IF2 between the first part 427LP1 and second part 427LP2 of the second variable resistance line 427L. Next, the eighth gap-fill layer 470L may be formed to fill the trenches. Next, the fourth liner layer 460L and the eighth gap-fill layer 470L disposed on the third electrode lines 429L may be removed by planarization, so that the third electrode lines 429L are exposed.

The seventh gap-fill layer 480L may have seventh thermal conductivity. The eighth gap-fill layer 470L may have eighth thermal conductivity different from the seventh thermal conductivity. For example, the eighth thermal conductivity may be higher than the seventh thermal conductivity. In this case, the seventh thermal conductivity may be substantially the same as the fourth thermal conductivity, and the eighth thermal conductivity may be substantially the same as the third thermal conductivity.

Referring to FIGS. 17A and 17B, third conductive lines 410B that extend in the first direction I and second memory cells 420B that are arranged in the first direction I and the second direction II may be formed. First, a third conductive layer may be formed on the second memory lines 420L. Next, the third conductive lines 410B may be formed by etching the third conductive layer. Next, the second memory cells 420B may be formed by etching the second memory lines 420L. The second memory cells 420B each may include a first electrode pattern 421B, a second switching pattern 423B, a second electrode pattern 425B, a second variable resistance pattern 427B, and a third electrode pattern 429B. In this process, in the second direction II, the fourth liner layer 460L may be divided into fourth liner patterns 460B, the eighth gap-fill layer 470L may be divided into eighth gap-fill patterns 470B, and the seventh gap-fill layer 480L may be divided into seventh gap-fill patterns 480B.

For reference, before the second memory cells 420B are formed, first liner patterns 430A, first gap-fill patterns 440A, and second gap-fill patterns 450A may be formed between the first memory cells 420A that are adjacent to each other in the second direction II.

Referring to FIGS. 18A and 18B, third liner patterns 430B, fifth gap-fill patterns 450B, and sixth gap-fill patterns 440B may be formed between the second memory cells 420B that are adjacent to each other in the second direction II. Referring back to FIGS. 4A, 4B, 5A, 5B, 6A, 6B, 7A, 7B, 8A, and 8B, the third liner patterns 430B, the fifth gap-fill patterns 450B, and the sixth gap-fill patterns 440B may be formed by using the same methods as the methods of forming the first liner patterns 330, the first gap-fill patterns 340, and the second gap-fill patterns 350, respectively.

First, a third liner layer may be formed along a profile of the second memory cells 420B. Next, a fifth gap-fill layer may be formed so that spaces between the second memory cells 420B in the second direction II are filled. Next, trenches may be formed by etching the fifth gap-fill layer by substantially the same level as the interface IF2 between the first part 427BP1 and second part 427BP2 of the second variable resistance pattern 427B. Next, a sixth gap-fill layer may be formed to fill the trenches. Next, the third liner layer and the sixth gap-fill layer disposed on the third conductive lines 410B may be removed by planarization, so that the third conductive lines 410B are exposed. In the planarization process, the third liner layer may be divided into the third liner patterns 430B, the sixth gap-fill layer may be divided into the sixth gap-fill patterns 440B, and the fifth gap-fill layer may be divided into the fifth gap-fill patterns 450B.

The fifth gap-fill patterns 450B may have fifth thermal conductivity. The sixth gap-fill patterns 440B may have sixth thermal conductivity different from the fifth thermal conductivity. For example, the sixth thermal conductivity may be higher than the fifth thermal conductivity. In this case, the fifth thermal conductivity may be substantially the same as the second thermal conductivity. The sixth thermal conductivity may be substantially the same as the first thermal conductivity.

Referring back to FIG. 2D, temperatures of the first parts 427AP1 and 427BP1 may be different from each other and the second parts 427AP2 and 427BP2 may be different from each other, depending on the directions of biases that are applied to the memory cells 420A and 420B. For example, when a positive (+) voltage is applied to the second-first conductive line 490A and a negative (−) voltage is applied to the first conductive line 410A, the temperature of the first part 427AP1 may be higher than that of the second part 427AP2. Furthermore, when a positive (+) voltage is applied to the second-second conductive line 490B and a negative (−) voltage is applied to the third conductive line 410B, the temperature of the second part 427BP2 may be higher than that of the first part 427BP1.

Accordingly, the first gap-fill patterns 440A, the third gap-fill patterns 470A, the sixth gap-fill patterns 440B, and the eighth gap-fill patterns 470B having relatively high thermal conductivity may be formed on the sidewalls of the first part 427AP1 and the second part 427BP2 having relatively high temperatures. Furthermore, the second gap-fill patterns 450A, the fourth gap-fill patterns 480A, the fifth gap-fill patterns 450B, and the seventh gap-fill patterns 480B having relatively low thermal conductivity may be formed on the sidewalls of the second part 427AP2 and the first part 428BP1 having relatively low temperatures.

In this case, the temperature of the first part 427AP1 of the first variable resistance pattern 427A can be lowered by the first gap-fill patterns 440A and the third gap-fill patterns 470A. The temperature of the second part 427BP2 of the second variable resistance pattern 427B can be lowered by the sixth gap-fill patterns 440B and the eighth gap-fill patterns 470B. Furthermore, the temperature of the second part 427AP2 of the first variable resistance pattern 427A can be raised by the second gap-fill patterns 450A and the fourth gap-fill patterns 480A. The temperature of the first part 427BP1 of the second variable resistance pattern 427B can be raised by the fifth gap-fill patterns 450B and the seventh gap-fill patterns 480B. Accordingly, an amount of current used to perform a set operation or reset operation of the memory cells 420A and 420B can be reduced because temperature deviations within the variable resistance patterns 427A and 427B can be reduced.

According to the aforementioned process, the amount of current used to perform the set operation or reset operation of the memory cells 420A and 420B can be reduced by forming the gap-fill patterns 440A and 440B, 450A and 450B, 470A and 470B, and 480A and 480B, having different thermal conductivities, on the sidewalls of the upper and lower parts of the variable resistance patterns 427A and 427B.

Figure 19A:
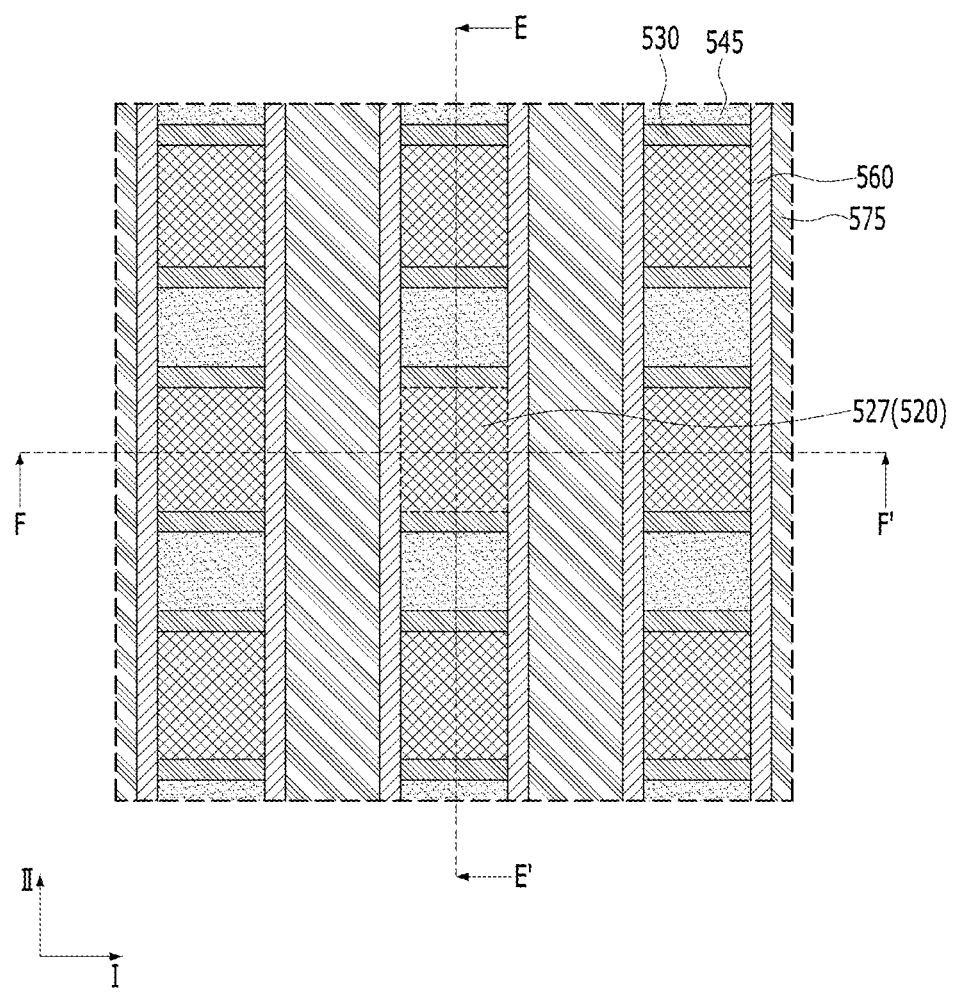
FIGS. 19A to 19C are diagrams for describing a semiconductor device according to an embodiment of the present disclosure.
Figure 19B:
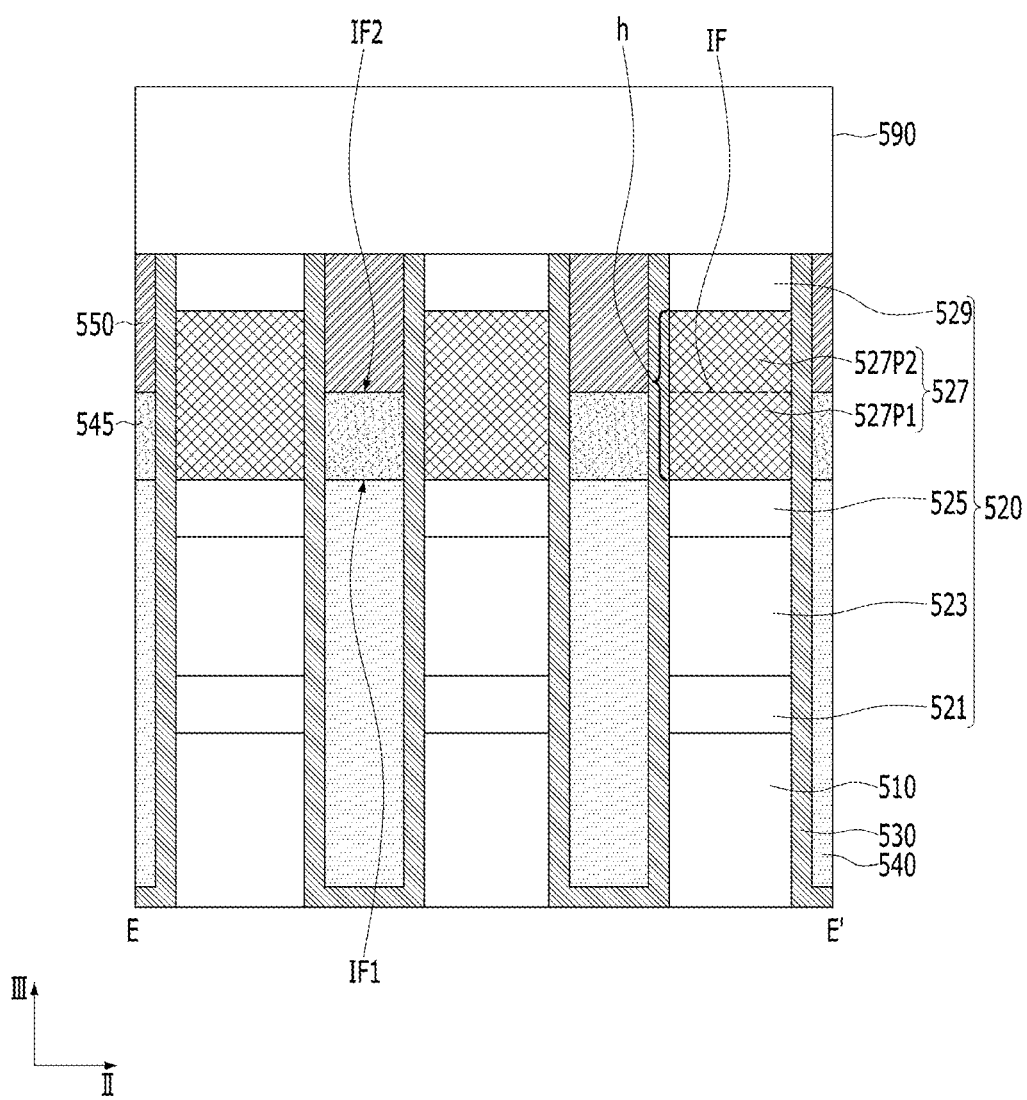
Figure 19C:
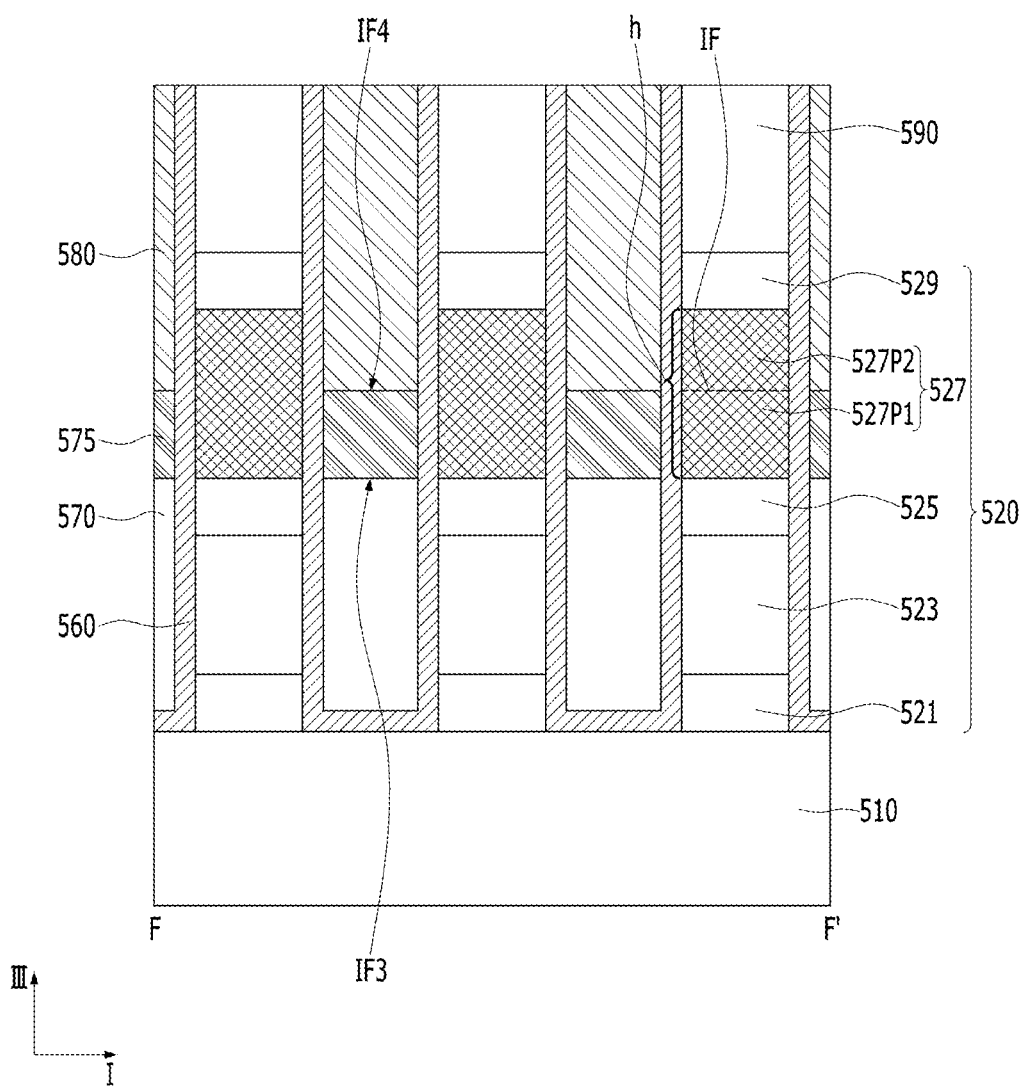

FIGS. 19A to 19C are diagrams for describing a semiconductor device according to an embodiment of the present disclosure. FIG. 19A may be a plan view of the semiconductor device. FIG. 19B may be a cross-sectional view taken along line E-E' in FIG. 19A. FIG. 19C may be a cross-sectional view taken along line F-F' in FIG. 19A. Hereinafter, contents that are redundant with the aforementioned contents are omitted and not described.

Referring to FIGS. 19A to 19C, the semiconductor device may include first conductive lines 510, memory cells 520, and second conductive lines 590. The semiconductor device may further include one or more of first liner patterns 530, first gap-fill patterns 540, second gap-fill patterns 550, second liner patterns 560, third gap-fill patterns 570, fourth gap-fill patterns 580, ninth gap-fill patterns 545, and tenth gap-fill patterns 575.

The memory cells 520 may be arranged in a first direction I and a second direction II that intersects the first direction I when viewed in a plan view. The memory cell 520 may include a first electrode pattern 521, a switching pattern 523, a second electrode pattern 525, a variable resistance pattern 527, and a third electrode pattern 529. The first electrode pattern 521 may be a lower electrode. The second electrode pattern 525 may be an intermediate electrode. The third electrode pattern 529 may be an upper electrode. The switching pattern 523 and the variable resistance pattern 527 each may include a chalcogenide material.

The variable resistance pattern 527 may include a first part 527P1 that is adjacent to the first conductive line 510 and a second part 527P2 that is adjacent to the second conductive line 590. An interface IF between the first part 527P1 and the second part 527P2 may be disposed between an upper surface and a lower surface of the variable resistance pattern 527. The interface IF may be disposed at a 40 to 60% level of a height "h" of the variable resistance pattern 527. For example, the interface IF may be disposed at an intermediate level of the height "h." In this case, the intermediate level may be about 50% level of the height "h."

The first gap-fill patterns 540, the second gap-fill patterns 550, and the ninth gap-fill patterns 545 may be disposed between the memory cells 520 arranged in the second direction II. The second gap-fill patterns 550 may be disposed over the first gap-fill patterns 540, respectively, in a third direction III. The ninth gap-fill patterns 545 may be disposed between the first gap-fill patterns 540 and the second gap-fill patterns 550, respectively, in the third direction III. The third direction III is perpendicular to each of the first and the second directions I and II.

An interface IF1 between the first gap-fill pattern 540 and the ninth gap-fill pattern 545 may be disposed between the upper surface and the lower surface of the variable resistance pattern 527. For example, the interface IF1 between the first gap-fill pattern 540 and the ninth gap-fill pattern 545 may be disposed substantially at the same level as an interface between the second electrode pattern 525 and the variable resistance pattern 527. An interface IF2 between the ninth gap-fill pattern 545 and the second gap-fill pattern 550 may be disposed between the upper surface and the lower surface of the variable resistance pattern 527. For example, the interface IF2 may be disposed substantially at the same level as the interface IF between the first part 527P1 and the second part 527P2. However, embodiments are not limited to the example. At least one of the interface IF1 between the first gap-fill pattern 540 and the ninth gap-fill pattern 545 and the interface IF2 between the ninth gap-fill pattern 545 and the second gap-fill pattern 550 may be disposed between the upper surface and the lower surface of the variable resistance pattern 527. The ninth gap-fill patterns 545 may include an insulating material, such as an oxide. For example, the ninth gap-fill patterns 545 may include $SiO_2$, SiOC, or a combination thereof.

The ninth gap-fill patterns 545 may have ninth thermal conductivity. The ninth thermal conductivity may be different from first thermal conductivity of the first gap-fill patterns 540 or second thermal conductivity of the second gap-fill patterns 550. For example, the ninth thermal conductivity may be lower than the first thermal conductivity or may be higher than the second thermal conductivity. The ninth gap-fill patterns 545 and the second gap-fill patterns 550 may be disposed on sidewalls of the variable resistance pattern 527, and can reduce a temperature deviation within the variable resistance pattern 527. For example, the ninth gap-fill patterns 545 can lower a temperature of the first part 527P1. The second gap-fill patterns 550 can raise a temperature of the second part 527P2. Accordingly, the temperature deviation within the variable resistance pattern 527 is reduced, and thus an amount of current that is used to perform a set operation or reset operation of the memory cells 520 can be reduced.

The third gap-fill patterns 570, the fourth gap-fill patterns 580, and the tenth gap-fill patterns 575 may be disposed between the memory cells 520 arranged in the first direction I. The fourth gap-fill patterns 580 may be disposed over the third gap-fill patterns 570, respectively, in the third direction III. The tenth gap-fill patterns 575 may be disposed between the third gap-fill patterns 570 and the fourth gap-fill patterns 580, respectively, in the third direction III.

An interface IF3 between each of the third gap-fill patterns 570 and a corresponding one of the tenth gap-fill patterns 575 may be disposed substantially at the same level as an interface between the second electrode pattern 525 and the variable resistance pattern 527. An interface IF4 between each of the tenth gap-fill patterns 575 and a corresponding one of the fourth gap-fill patterns 580 may be disposed substantially at the same level as the interface IF between the first part 527P1 and the second part 527P2, but embodiments are not limited thereto. At least one of the interface IF3 between the third gap-fill pattern 570 and the tenth gap-fill pattern 575 or the interface IF4 between the tenth gap-fill pattern 575 and the fourth gap-fill pattern 580 may be disposed between the upper surface and the lower surface of the variable resistance pattern 527. The tenth gap-fill patterns 575 may include an insulating material, such as an oxide. For example, the tenth gap-fill patterns 575 may include $SiO_2$, SiOC, or a combination thereof.

The tenth gap-fill patterns 575 may have tenth thermal conductivity. The tenth thermal conductivity may be different from third thermal conductivity of the third gap-fill patterns 570 or fourth thermal conductivity of the fourth gap-fill patterns 580. For example, the tenth thermal conductivity may be lower than the third thermal conductivity or may be higher than the fourth thermal conductivity. The tenth gap-fill patterns 575 and the fourth gap-fill patterns 580 may be disposed on sidewalls of the variable resistance pattern 527, and can reduce the temperature deviation within the variable resistance pattern 527. For example, the tenth gap-fill patterns 575 can lower the temperature of the first part 527P1. The fourth gap-fill patterns 580 can raise the temperature of the second part 527P2. Accordingly, the temperature deviation within the variable resistance pattern 527 is reduced, and thus the amount of current that is used to perform the set operation or the reset operation of the memory cells 520 can be reduced.

According to the aforementioned structure, the gap-fill patterns 540, 545, and 550, and the gap-fill patterns 570, 575, and 580, having different thermal conductivities, may be disposed between the memory cells 520. For example, three or more gap-fill patterns having different thermal conductivities may be disposed on sidewalls of the memory cells 520. The current that is used to perform the set operation or reset operation of the memory cells 520 can be reduced by disposing the gap-fill patterns 540, 545, and 550, and the gap-fill patterns 570, 575, and 580, having different thermal conductivities, on the sidewalls of the upper and lower parts of the variable resistance patterns 527.

FIGS. 20A, 20B, 21A, 21B, 22A, 22B, 23A, 23B, 24A, 24B, 25A, and 25B are diagrams for describing a method of manufacturing a semiconductor device according to an embodiment of the present disclosure. FIGS. 20A, 21A, 22A, 23A, 24A, and 25A may be plan views of the semiconductor device. FIGS. 20B, 21B, 22B, 23B, 24B, and 25B may be cross-sectional views taken along line F-F' in FIGS. 20A, 21A, 22A, 23A, 24A, and 25A, respectively. Hereinafter, contents that are redundant with the aforementioned contents are omitted and not described.

Figure 20A:
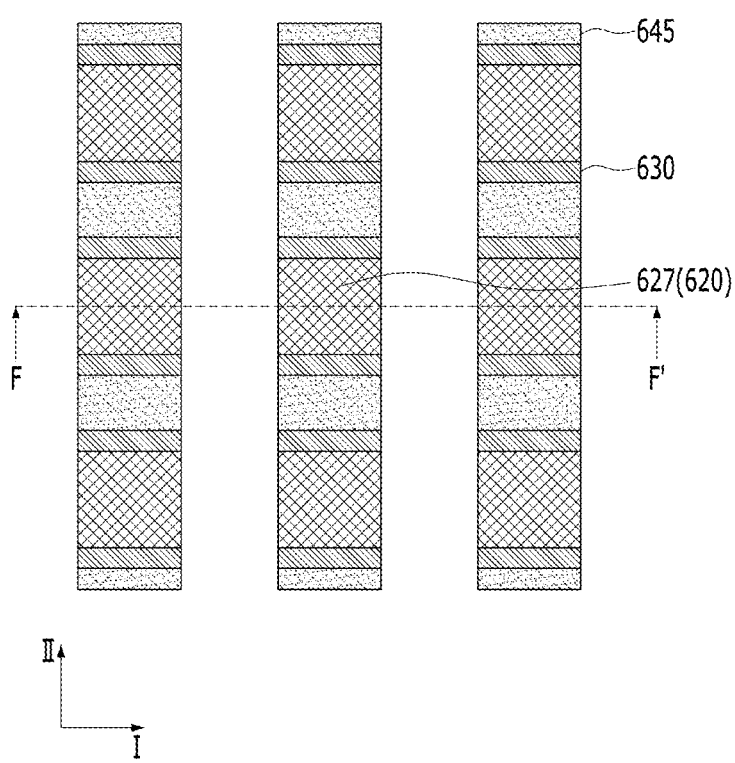
FIGS. 20A, 20B, 21A, 21B, 22A, 22B, 23A, 23B, 24A, 24B, 25A, and 25B are diagrams for describing a method of manufacturing a semiconductor device according to an embodiment of the present disclosure.
Figure 20B:
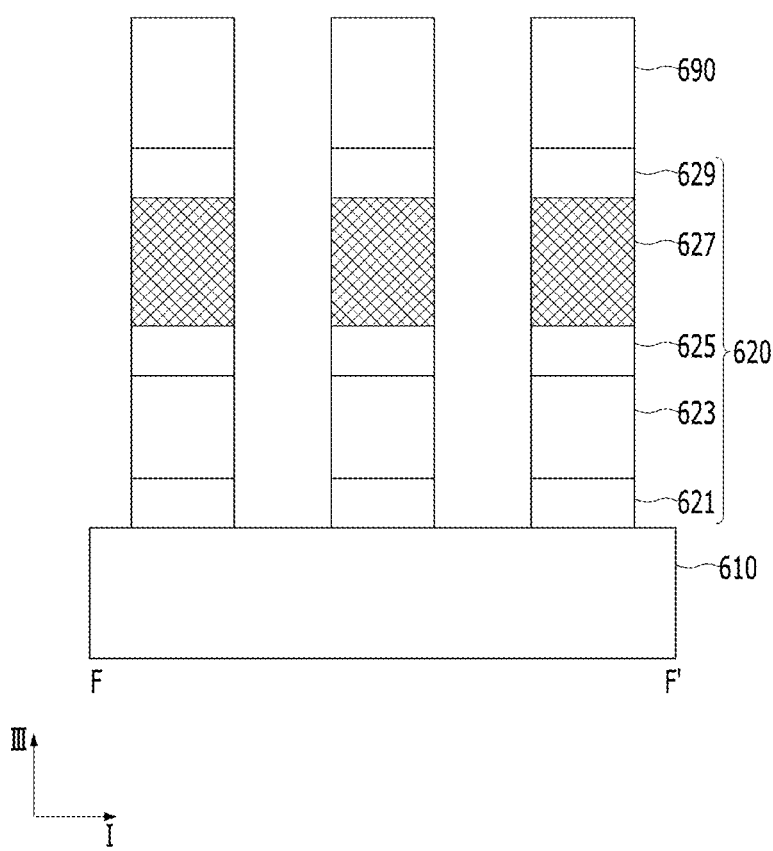

Referring to FIGS. 20A and 20B, first conductive lines 610 that extend in a first direction I may be formed. Memory cells 620 that are arranged in the first direction I and a second direction II that intersects the first direction I may be formed on the first conductive lines 610 in a third direction III. The memory cells 620 each may include a first electrode pattern 621, a switching pattern 623, a second electrode pattern 625, a variable resistance pattern 627, and a third electrode pattern 629.

First liner patterns 630 and ninth gap-fill patterns 645 may be formed between the memory cells 620 that are adjacent to each other in the second direction II, wherein the ninth gap-fill patterns 645 may correspond to the ninth gap-fill patterns 545 shown in FIG. 19B. In this case, the ninth gap-fill patterns 645 may be manufactured by using the same method as a method of forming tenth gap-fill patterns (not illustrated). Second conductive lines 690 that extend in the second direction II may be formed on the memory cells 620 in the third direction III.

Figure 21A:
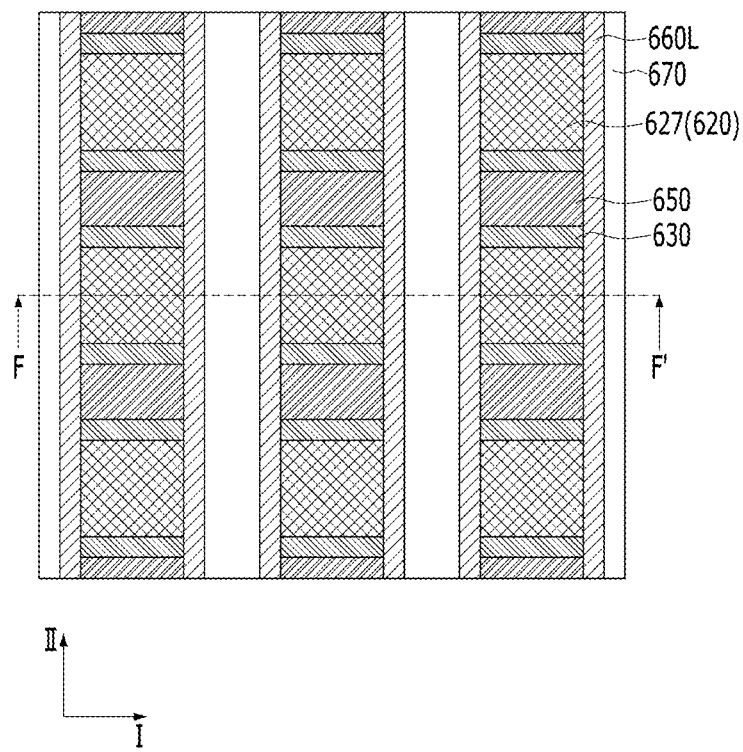
Figure 21B:
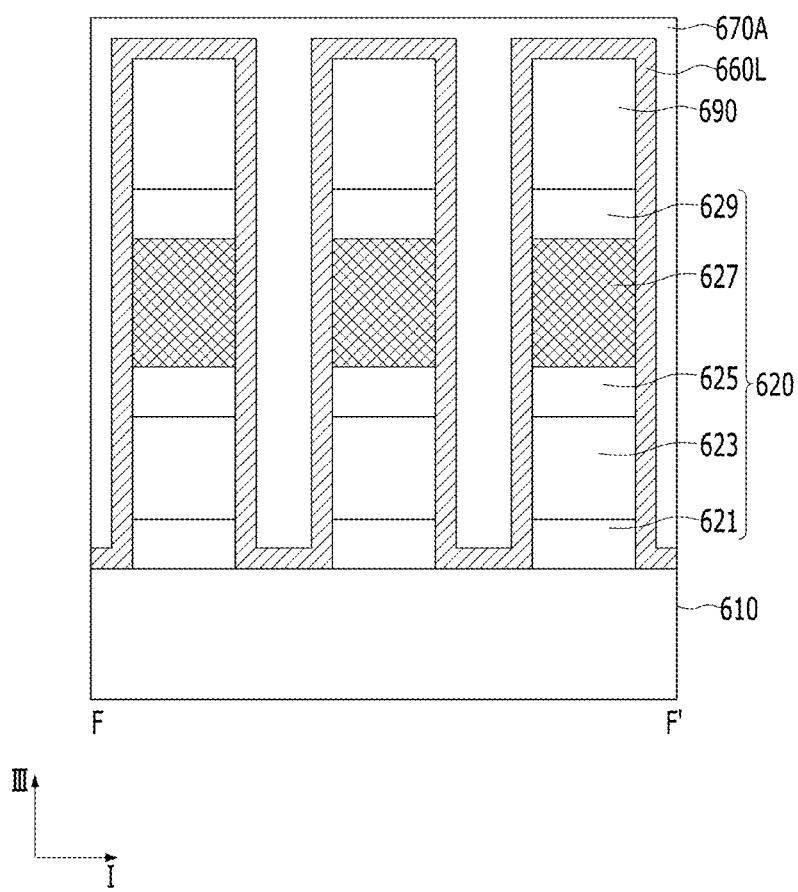

Referring to FIGS. 21A and 21B, a second liner layer 660L and a preliminary third gap-fill layer 670A may be formed. First, the second liner layer 660L may be formed along a profile of the memory cells 620 that are adjacent to each other in the first direction I. Next, the preliminary third gap-fill layer 670A may be formed on the second liner layer 660L so that spaces between the memory cells 620 arranged in the first direction I are filled. The preliminary third gap-fill layer 670A may have third thermal conductivity, and may include an insulating material, such as an oxide or a nitride. For example, the preliminary third gap-fill layer 670A may include $SiO_2$, SiOC, or a combination thereof.

Figure 22A:
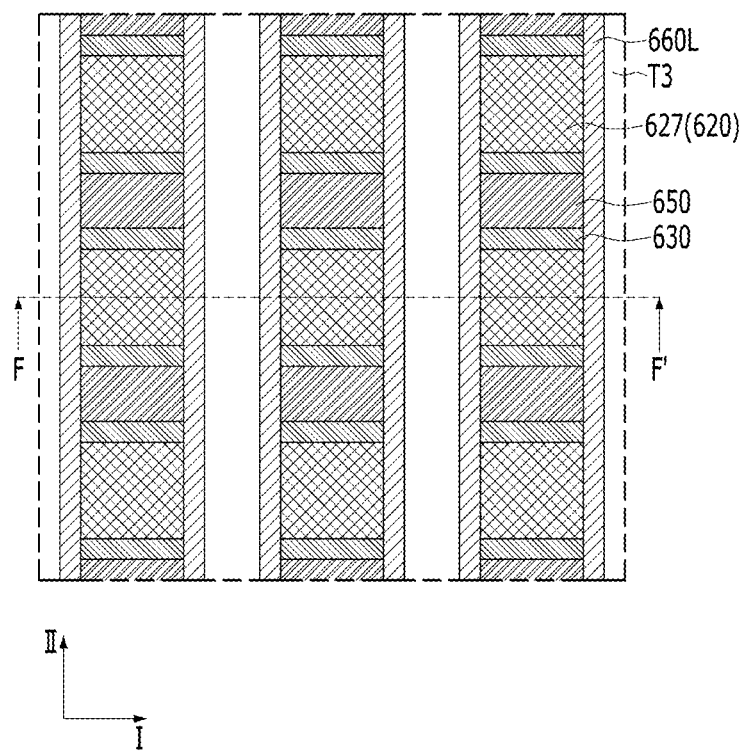
Figure 22B:
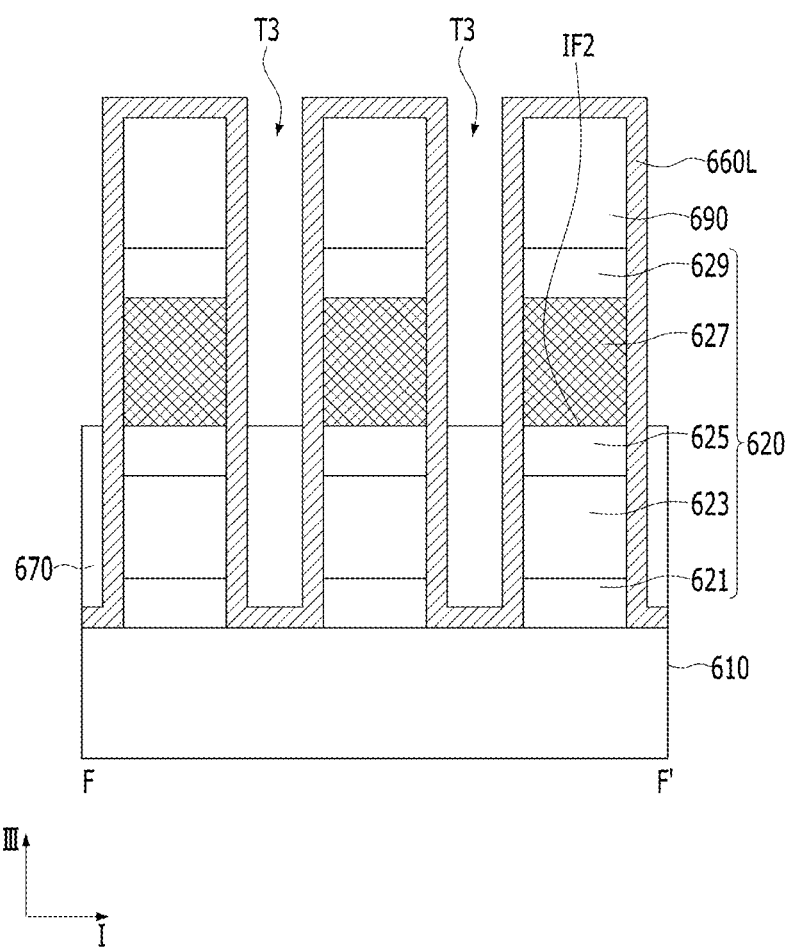

Referring to FIGS. 22A and 22B, third trenches T3 may be formed by etching the preliminary third gap-fill layer 670A. The third trenches T3 may be formed by etching the preliminary third gap-fill layer 670A to a depth corresponding to a level of the second electrode pattern 625 or the variable resistance pattern 627. The third trenches T3 may be formed by etching the preliminary third gap-fill layer 670A to a depth that has substantially the same level as an interface IF2 between the second electrode pattern 625 and the variable resistance pattern 627. The etched preliminary third gap-fill layer may be referred to as "third gap-fill layers." Also, the "third-gap fill layers" may be used as "third gap-fill patterns 670" to mean that the preliminary third gap-fill layer is patterned. Accordingly, an upper surface of each of the third gap-fill patterns 670 may be disposed substantially at the same level as the interface IF2 between the second electrode pattern 625 and the variable resistance pattern 627.

The second liner layer 660L can protect the memory cells 620 in the process of forming the third trenches T3. In this case, parts of the second liner layer 660L may be etched.

Figure 23A:
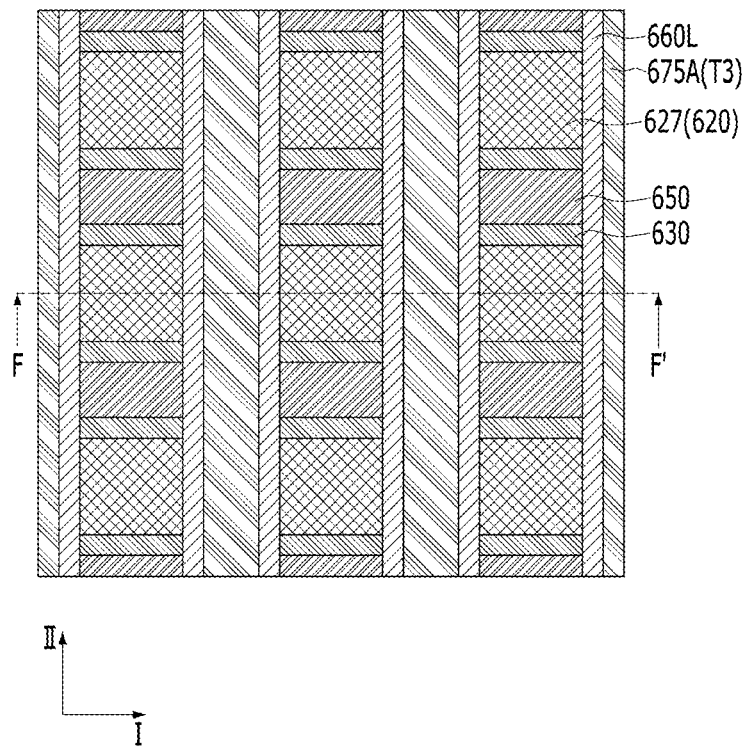
Figure 23B:
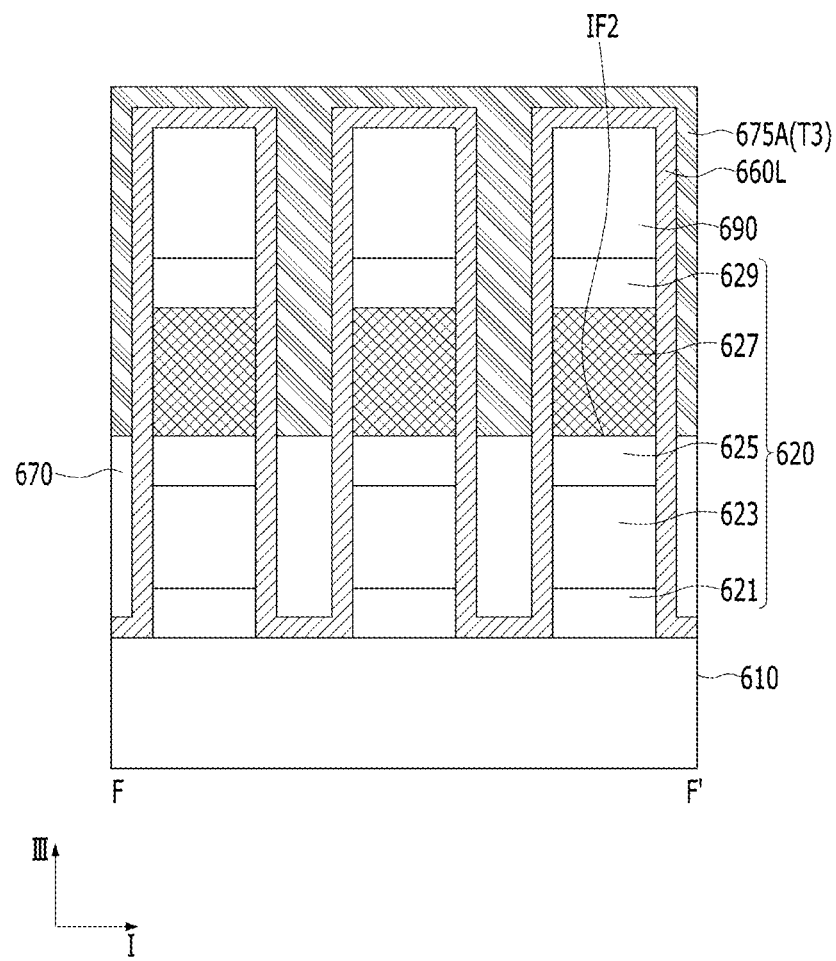

Referring to FIGS. 23A and 23B, a preliminary tenth gap-fill layer 675A may be formed to fill the third trenches T3. The preliminary tenth gap-fill layer 675A may be formed on the third gap-fill patterns 670.

An interface between the third gap-fill pattern 670 and the preliminary tenth gap-fill layer 675A may be disposed between an upper surface and a lower surface of the second electrode pattern 625 or between an upper surface and a lower surface of the variable resistance pattern 627. For example, the interface between the third gap-fill pattern 670 and the preliminary tenth gap-fill layer 675A may be disposed substantially at the same level as the interface IF2 between the second electrode pattern 625 and the variable resistance pattern 627.

The preliminary tenth gap-fill layer 675A may have tenth thermal conductivity different from the third thermal conductivity of the third gap-fill layer 670. For example, the tenth thermal conductivity may be lower than the third thermal conductivity. The preliminary tenth gap-fill layer 675A may include an insulating material, such as an oxide. For example, the preliminary tenth gap-fill layer 675A may include $SiO_2$, SiOC, or a combination thereof.

Figure 24A:
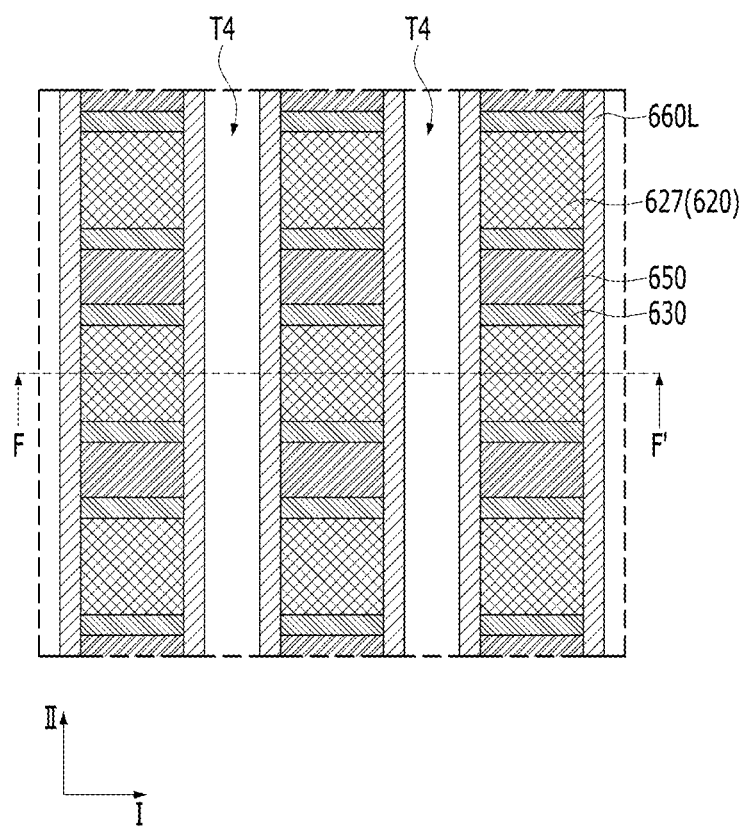
Figure 24B:
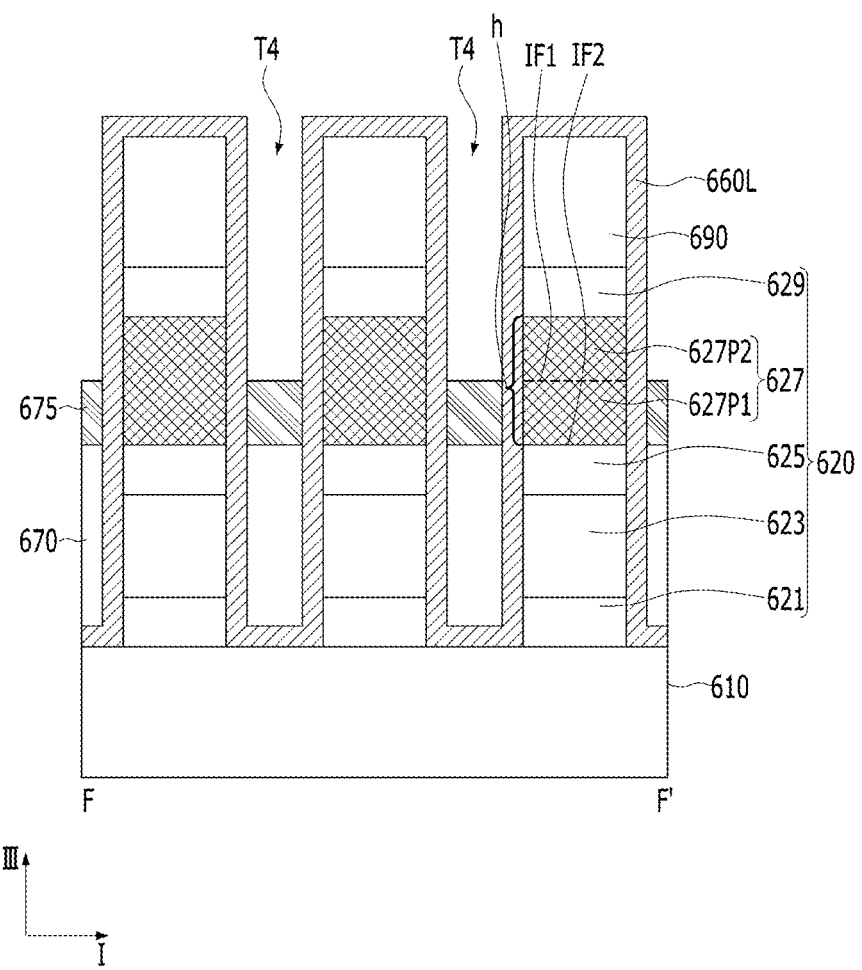

Referring to FIGS. 24A and 24B, fourth trenches T4 may be formed by etching the preliminary tenth gap-fill layer 675A to a depth corresponding to a level of the variable resistance patterns 627. The bottom of each of the fourth trenches T4 may be disposed between the upper surface and the lower surface of each of the variable resistance patterns 627. For example, the fourth trenches T4 may be formed by etching the preliminary tenth gap-fill layer 675A to a depth that is substantially the same level as an interface IF1 between a first part 627P1 and a second part 627P2 of the variable resistance patterns 627. The etched preliminary tenth gap-fill layer 675A may be referred to as "tenth gap-fill layers." Also, the "tenth-gap fill layers" may be used as "tenth gap-fill patterns 675" to mean that the preliminary tenth gap-fill layer is patterned. Accordingly, an upper surface of each of the tenth gap-fill patterns 675 may be disposed substantially at the same level as the interface IF1 between the first part 627P1 and the second part 627P2.

The second liner layers 660L can protect the memory cells 620 in the process of forming the fourth trenches T4. In this case, parts of the second liner layers 660L may be etched.

Figure 25A:
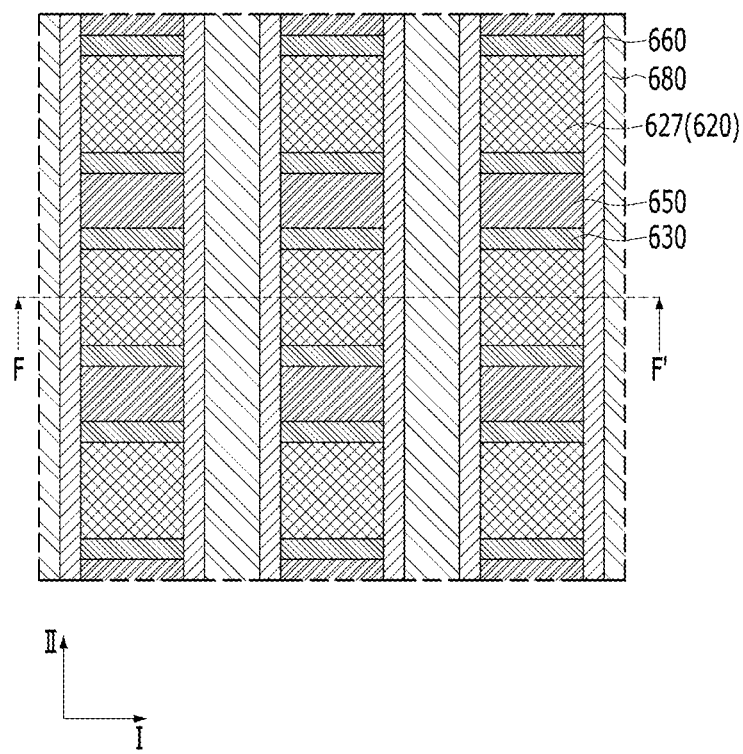
Figure 25B:
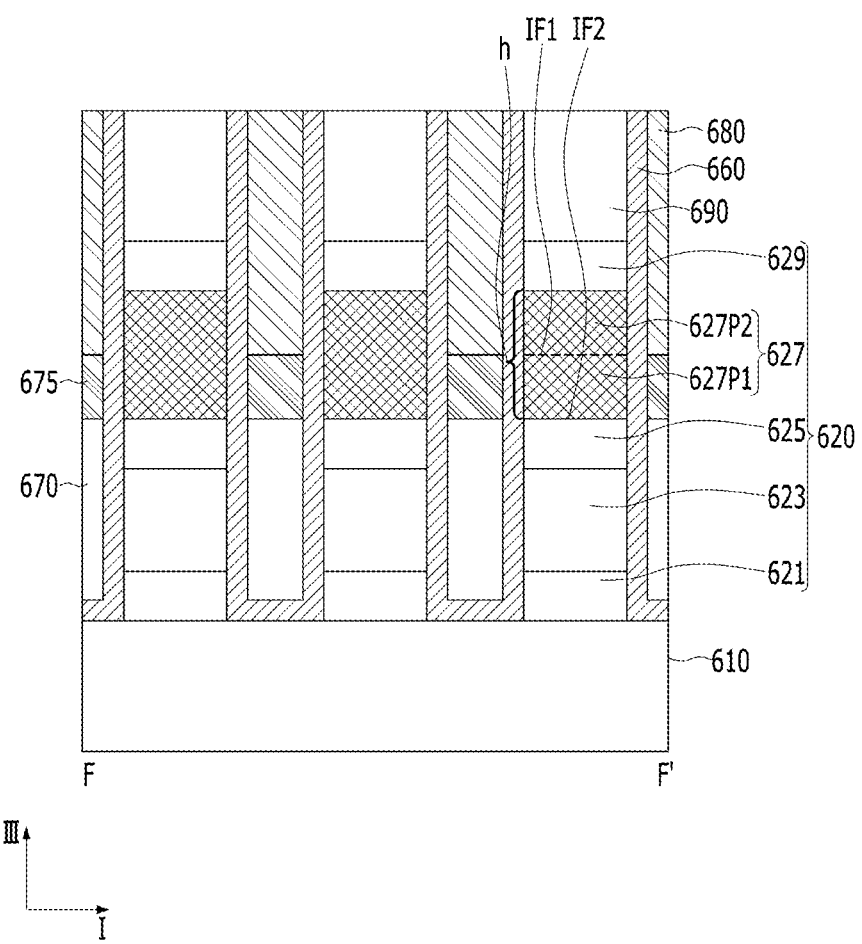

Referring to FIGS. 25A and 25B, a fourth gap-fill layer may be formed to fill the fourth trenches T4. The fourth gap-fill layer may be formed on the tenth gap-fill patterns 675. Next, the fourth gap-fill layer and the second liner layer 660L may be planarized until a top layer of the memory cell 620 is exposed. In this process, the fourth gap-fill layer may be divided into fourth gap-fill patterns 680. The second liner layer 660L may be divided into the second liner patterns 660. A top surface of the third electrode pattern 629, top surfaces of the second liner patterns 660, and top surfaces of the fourth gap-fill patterns 680 may be disposed substantially at the same level.

An interface between the tenth gap-fill pattern 675 and the fourth gap-fill pattern 680 may be disposed between the upper surface and the lower surface of the variable resistance pattern 627. For example, the interface between the tenth gap-fill pattern 675 and the fourth gap-fill pattern 680 may be disposed substantially at the same level as the interface IF1 between the first part 627P1 and the second part 627P2 of the variable resistance pattern 627. Accordingly, the tenth gap-fill pattern 675 may be formed to cover the sidewall of the first part 627P1. The fourth gap-fill pattern 680 may be formed to cover the sidewall of the second part 627P2.

The fourth gap-fill patterns 680 may have fourth thermal conductivity that is different from the third thermal conductivity of the third gap-fill pattern 670 or the tenth thermal conductivity of the tenth gap-fill pattern 675. For example, the fourth thermal conductivity may be lower than the third thermal conductivity, and may be lower than the tenth thermal conductivity. Accordingly, the gap-fill patterns 675 and 680 having different thermal conductivities may be formed to cover the sidewalls of the first part 627P1 and the second part 627P2 of the variable resistance patterns 627, respectively.

If the gap-fill patterns having different thermal conductivities are formed on the sidewalls of the upper and the lower parts of the variable resistance patterns 627, a temperature within the variable resistance pattern 627 may be uniform for each level. Accordingly, the amount of current that is used to perform the set operation or the reset operation of the memory cells 620 can be reduced.

According to the aforementioned process, gap-fill patterns corresponding to the gap-fill patterns 640, 645, and 650, and the gap-fill patterns 670, 675, and 680, having different thermal conductivities, may be formed on the sidewalls of the variable resistance patterns 627. For example, three or more gap-fill patterns having different thermal conductivities may be formed. Accordingly, a temperature deviation within the variable resistance patterns 627 can be reduced.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure.

What is claimed is:

1. A semiconductor device comprising:
   first conductive lines extending in a first direction;
   second conductive lines extending in a second direction that intersects the first direction;
   memory cells disposed between the first conductive lines and the second conductive lines in a third direction perpendicular to each of the first and the second directions, each of the memory cells comprising a variable resistance pattern;
   first gap-fill patterns disposed between the memory cells and having first thermal conductivity; and
   second gap-fill patterns disposed on the first gap-fill patterns in the third direction and having second thermal conductivity lower than the first thermal conductivity, wherein an interface between each of the second gap-fill patterns and a corresponding one of the first gap-fill patterns is disposed between an upper surface and a lower surface of the variable resistance pattern.

2. The semiconductor device of claim 1, wherein a first gap-fill pattern and a corresponding second gap-fill pattern are disposed between two memory cells that are adjacent to each other in the second direction.

3. The semiconductor device of claim 1, wherein:
   the variable resistance pattern comprises a first part that is adjacent to a first conductive line and a second part that is adjacent to a second conductive line, and
   when performing a set operation or reset operation, a temperature of the first part is higher than a temperature of the second part.

4. The semiconductor device of claim 3, wherein when performing the set operation or the reset operation, a negative voltage is applied to the first conductive line, and a positive voltage is applied to the second conductive line.

5. The semiconductor device of claim 3, wherein an interface between the first part and the second part is disposed substantially at the same level as the interface between the first gap-fill pattern and the second gap-fill pattern.

6. The semiconductor device of claim 1, further comprising liner patterns each disposed between a memory cell and a first gap-fill pattern and between the memory cell and a second gap-fill pattern.

7. The semiconductor device of claim 1, further comprising:
   third gap-fill patterns disposed between memory cells that are adjacent to each other in the first direction and having third thermal conductivity; and
   fourth gap-fill patterns disposed on the third gap-fill patterns in the third direction and having fourth thermal conductivity lower than the third thermal conductivity.

8. The semiconductor device of claim 1, further comprising fifth gap-fill patterns each disposed between a first gap-fill pattern and a corresponding second gap-fill pattern in the third direction and having fifth thermal conductivity.

9. The semiconductor device of claim 8, wherein the fifth thermal conductivity is higher than the second thermal conductivity.

10. The semiconductor device of claim 8, wherein the fifth thermal conductivity is lower than the first thermal conductivity.

11. The semiconductor device of claim 1, wherein:
   the first gap-fill patterns comprise $SiO_2$, and
   the second gap-fill patterns comprise SiOC.

12. A semiconductor device comprising:
   first conductive lines extending in a first direction;
   second conductive lines extending in a second direction that intersects the first direction;
   third conductive lines extending in the first direction;
   first memory cells disposed between the first conductive lines and the second conductive lines in a third direction perpendicular to each of the first and the second directions, each of the first memory cells comprising a first variable resistance pattern;
   second memory cells disposed between the second conductive lines and the third conductive lines in the third direction, each of the second memory cells comprising a second variable resistance pattern;
   first gap-fill patterns disposed between the first memory cells and having first thermal conductivity;
   second gap-fill patterns disposed on the first gap-fill patterns in the third direction between the first memory cells and having second thermal conductivity lower than the first thermal conductivity;
   third gap-fill patterns disposed between the second memory cells and having third thermal conductivity; and
   fourth gap-fill patterns disposed on the third gap-fill patterns in the third direction between the second memory cells and having fourth thermal conductivity higher than the third thermal conductivity.

13. The semiconductor device of claim 12, wherein each of the first memory cells comprises:
   a first switching pattern; and
   the first variable resistance pattern on the first switching pattern in the third direction.

14. The semiconductor device of claim 13, wherein:
   the first variable resistance pattern comprises a first part that is adjacent to a first conductive line and a second part that is adjacent to a second conductive line, and
   when performing a set operation or reset operation, a temperature of the first part is higher than a temperature of the second part.

15. The semiconductor device of claim 14, wherein when performing the set operation or the reset operation, a negative voltage is applied to the first conductive line, and a positive voltage is applied to the second conductive line.

16. The semiconductor device of claim 14, wherein an interface between the first part and the second part is disposed substantially at the same level as an interface between a first gap-fill pattern and a corresponding second gap-fill pattern.

17. The semiconductor device of claim 12, wherein each of the second memory cells comprises:
   a second switching pattern; and
   the second variable resistance pattern on the second switching pattern in the third direction.

18. The semiconductor device of claim 17, wherein:
   the second variable resistance pattern comprises a first part that is adjacent to a second conductive line and a second part that is adjacent to a third conductive line, and
   when performing a set operation or reset operation, a temperature of the first part is higher than a temperature of the second part.

19. The semiconductor device of claim 18, wherein when performing the set operation or the reset operation, a positive voltage is applied to the second conductive line, and a negative voltage is applied to the third conductive line.

20. The semiconductor device of claim 18, wherein an interface between the first part and the second part is disposed substantially at the same level as an interface between a third gap-fill pattern and a corresponding fourth gap-fill pattern.

* * * * *